(12) United States Patent
Wang

(10) Patent No.: US 6,395,152 B1
(45) Date of Patent: May 28, 2002

(54) METHODS AND APPARATUS FOR ELECTROPOLISHING METAL INTERCONNECTIONS ON SEMICONDUCTOR DEVICES

(75) Inventor: Hui Wang, Fremont, CA (US)

(73) Assignee: ACM Research, Inc., Fremont, CA (US)

( * ) Notice: Subject to any disclaimer, the term of this patent is extended or adjusted under 35 U.S.C. 154(b) by 0 days.

(21) Appl. No.: 09/346,699

(22) Filed: Jul. 2, 1999

Related U.S. Application Data

(60) Provisional application No. 60/092,316, filed on Jul. 9, 1998.

(51) Int. Cl.⁷ ............................................. C25D 17/00
(52) U.S. Cl. ................. 204/224 M; 204/237; 204/239; 204/269
(58) Field of Search .............................. 204/224 R, 269, 204/275, 274, 237, 239

(56) References Cited

U.S. PATENT DOCUMENTS

| | | | |
|---|---|---|---|
| 2,751,344 A | 6/1956 | Kienberger et al. .......... | 204/225 |
| 4,078,980 A | 3/1978 | Harris et al. .............. | 204/129.3 |
| 4,131,524 A | 12/1978 | Gieles ..................... | 204/129.3 |
| 4,184,932 A | 1/1980 | Ahlgrim et al. ........ | 204/129.43 |
| 4,304,641 A | 12/1981 | Granadia et al. ............. | 204/23 |
| 5,344,491 A * | 9/1994 | Katou ........................ | 118/695 |
| 5,354,437 A | 10/1994 | Lee .......................... | 204/129.1 |
| 5,421,987 A | 6/1995 | Tzanavaras et al. ........ | 205/133 |
| 5,443,707 A | 8/1995 | Mori .......................... | 204/242 |
| 5,489,341 A | 2/1996 | Bergman et al. .............. | 134/26 |
| 5,516,412 A | 5/1996 | Andricacos et al. .... | 204/224 R |
| 5,567,300 A | 10/1996 | Datta et al. ................. | 205/652 |
| 5,584,310 A | 12/1996 | Bergman et al. ........... | 134/95.1 |
| 5,620,581 A | 4/1997 | Ang ............................. | 205/96 |
| 5,670,034 A | 9/1997 | Lowery ....................... | 205/143 |
| 5,678,320 A | 10/1997 | Thompson et al. ............. | 34/58 |
| 5,744,019 A | 4/1998 | Ang ............................. | 205/96 |
| 6,017,437 A | 1/2000 | Ting et al. ..................... | 205/80 |
| 6,056,869 A * | 5/2000 | Uzoh .......................... | 205/771 |

FOREIGN PATENT DOCUMENTS

| | | |
|---|---|---|
| EP | 0 257 670 | 3/1988 |
| WO | 95/20064 | 7/1995 |

OTHER PUBLICATIONS

Contolini et al., "Copper Electroplating Process for Sub–Half–Micron ULSI Structures," *VMIC Conference 1995 ISMIC—104/95/0322*, (Jun. 27–29, 1995) 322–328.

(List continued on next page.)

*Primary Examiner*—Kathryn Gorgos
*Assistant Examiner*—Thomas H Parsons
(74) *Attorney, Agent, or Firm*—Morrison & Foersster LLP

(57) ABSTRACT

An electropolishing apparatus for polishing a metal layer formed on a wafer (31) includes an electrolyte (34), a polishing receptacle (100), a wafer chuck (29), a fluid inlet (5, 7, 9), and at least one cathode (1, 2, 3). The wafer chuck (29) holds and positions the wafer (31) within the polishing receptacle (100). The electrolyte (34) is delivered through the fluid inlet (5, 7, 9) into the polishing receptacle (100). The cathode (1, 2, 3) then applies an electropolishing current to the electrolyte to electropolish the wafer (31). In accordance with one aspect of the present invention, discrete portions of the wafer (31) can be electropolished to enhance the uniformity of the electropolished wafer.

48 Claims, 52 Drawing Sheets

OTHER PUBLICATIONS

Devaraj et al., "Pulsed Electrodeposition of Copper," *Plating & Surface Finishing* (Aug. 1992) 72–78.

Dubin et al., "Copper Plating Techniques for ULSI Metallization," *Advanced MicroDevices* No date available.

Dubin, V.M., "Electrochemial Deposition of Copper for On–Chip Interconnects," *Advanced MicroDevices* No date available.

Gauvin et al., "The Effect of Chloride Ions on Copper Deposition," *J. of Electrochemical Society*, (Feb. 1952) vol. 99, 71–75.

Osero, N.M., "An Overview of Pulse Plating," *Plating and Surface Finishing*, (Mar. 1986).

Passal, F., "Copper Plating During the Last Fifty Years," *Plating* (Jun. 1959) 628–638.

Singer, P., "Copper Goes Mainstream: Low k to Follow," *Semiconductor International* (Nov. 1997) 67–70.

Patent Abstract of Japan, "Plating Method," Publication No. 57171690, Publication Date: Oct. 22, 1982.

Patent Abstract of Japan, "Partial Plating Device," Publication No. 01234590, Publication Date: Sep. 19, 1989.

* cited by examiner

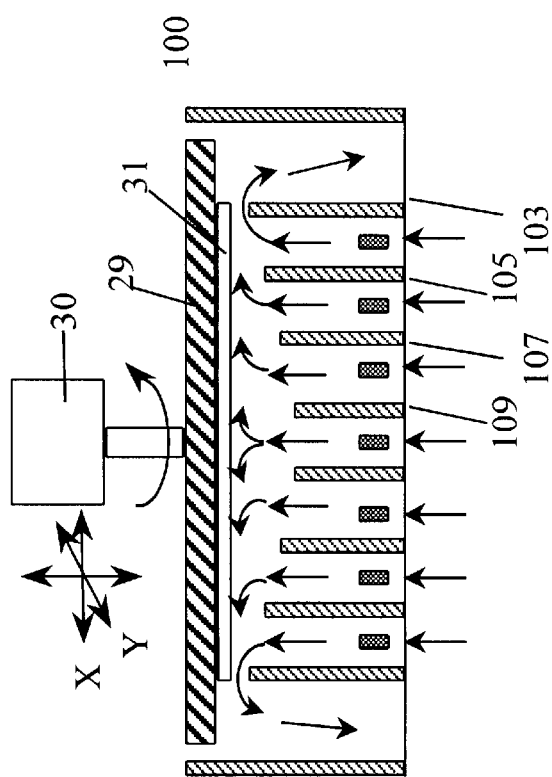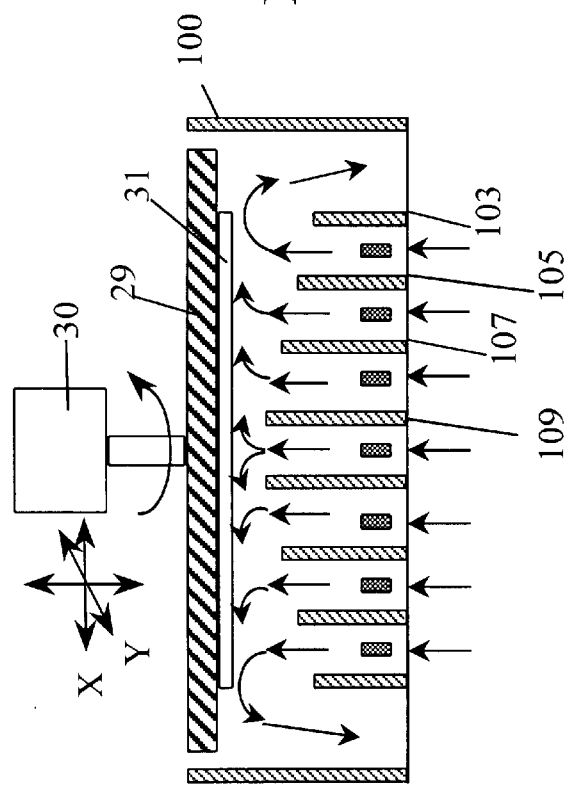

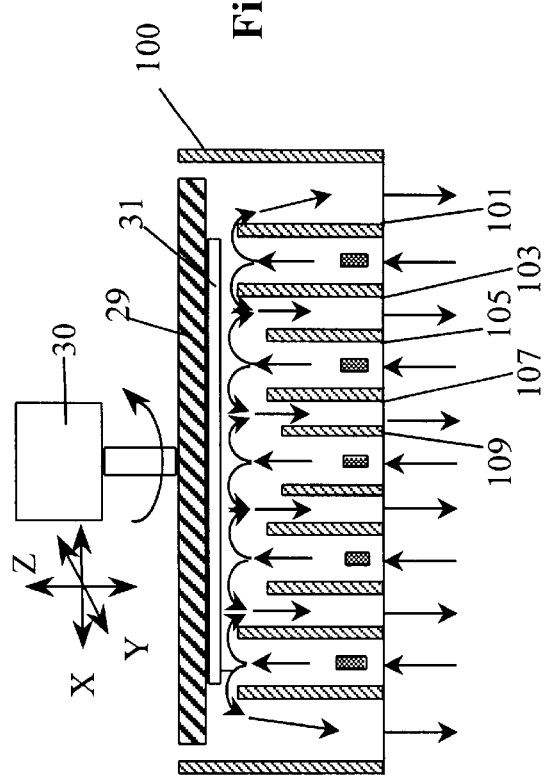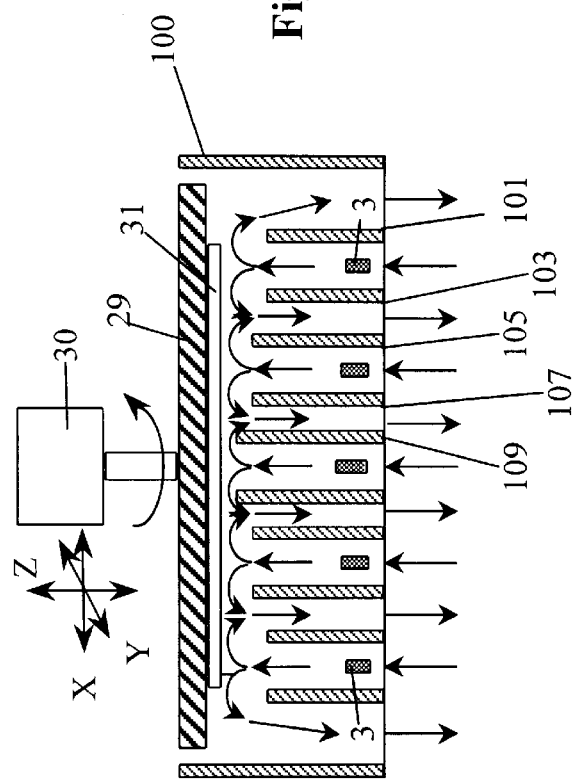

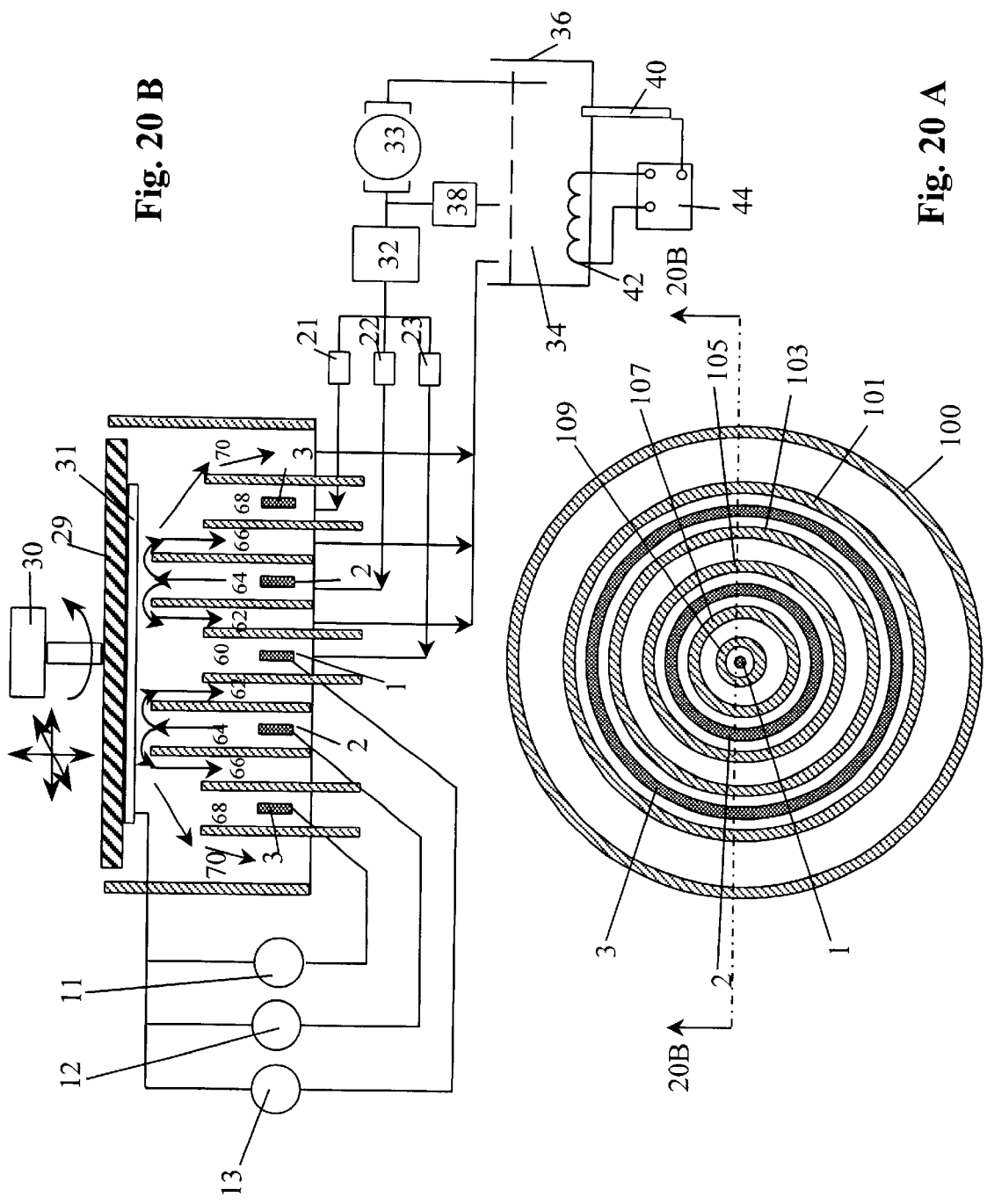

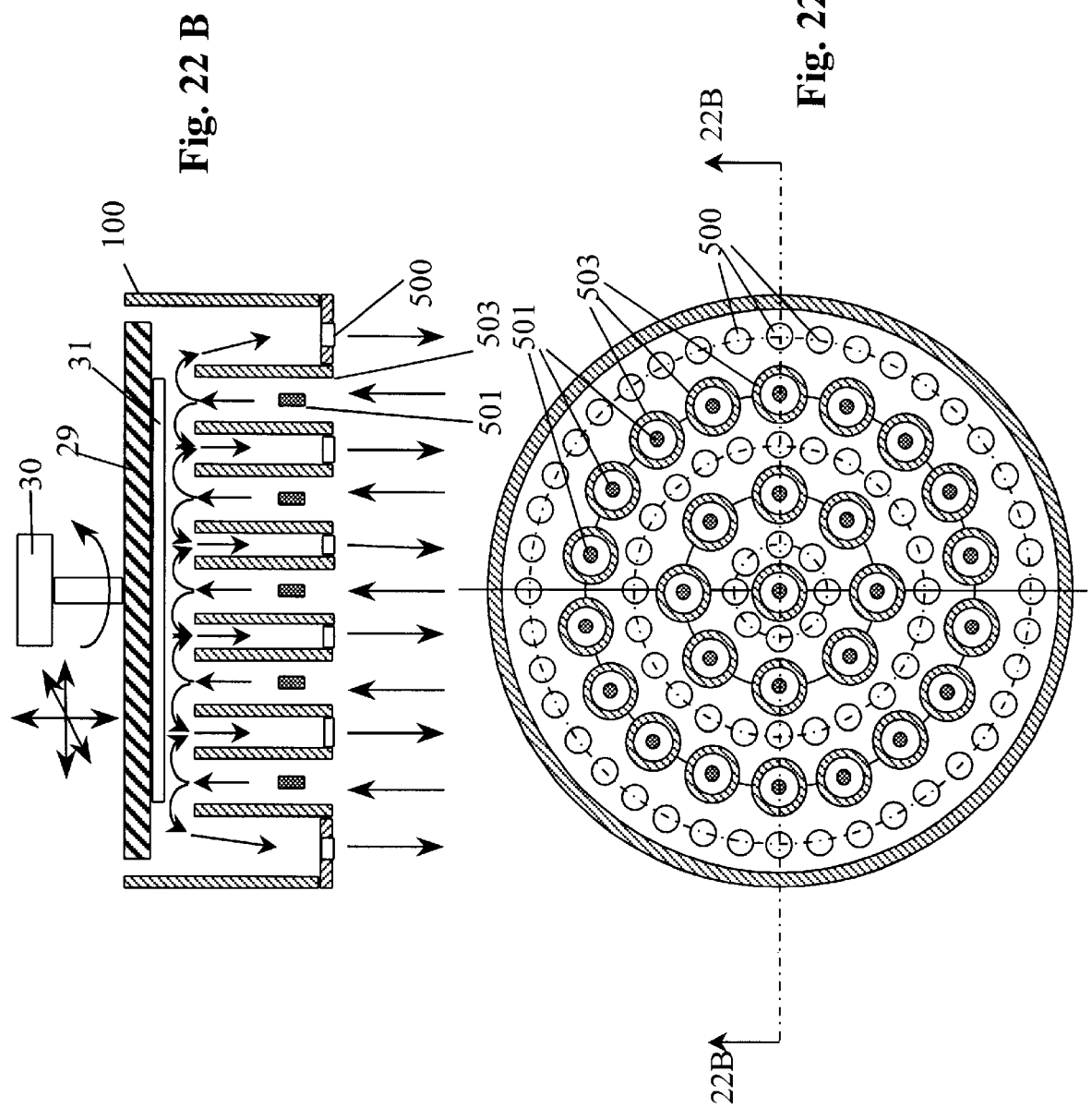

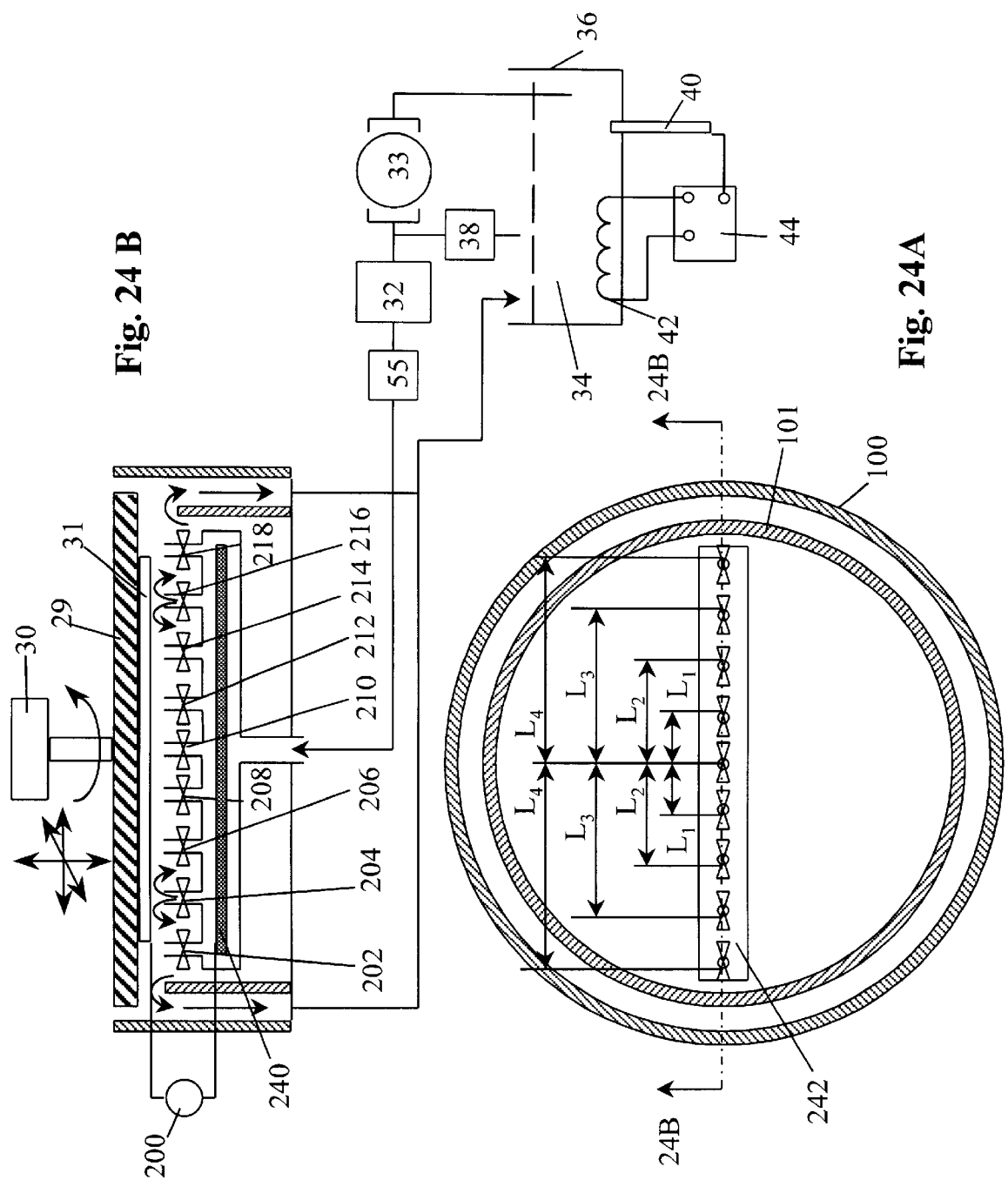

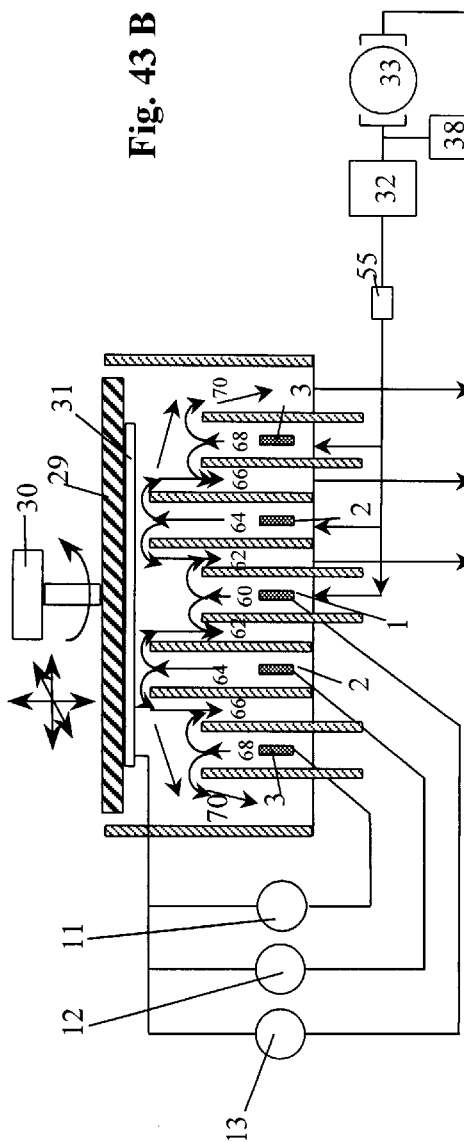
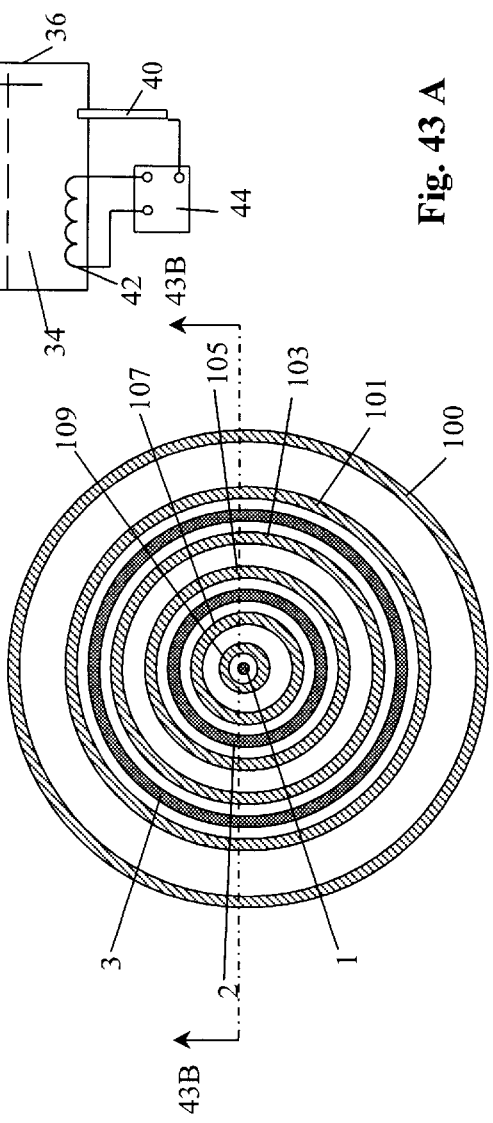
Fig. 43 A
Fig. 43 B

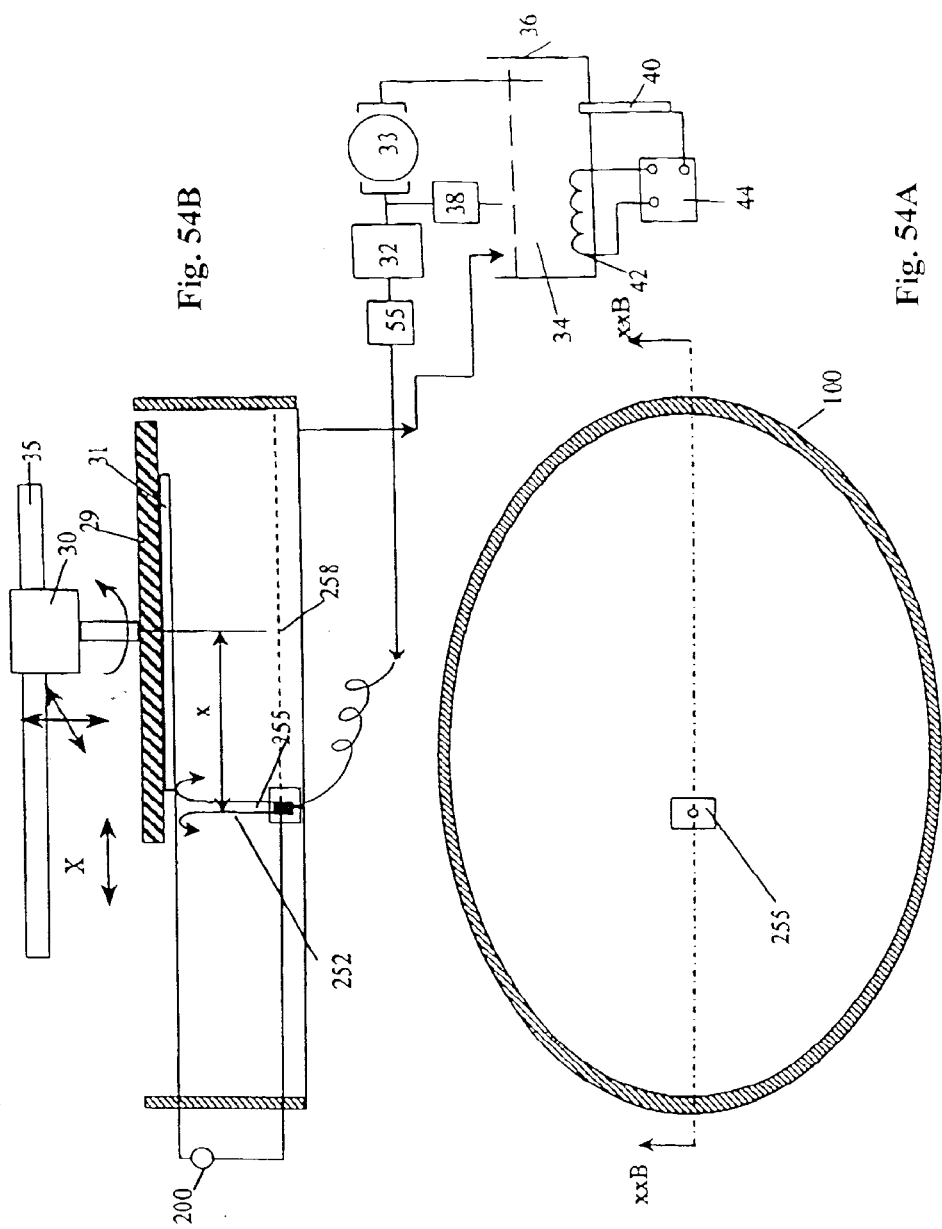

METHODS AND APPARATUS FOR ELECTROPOLISHING METAL INTERCONNECTIONS ON SEMICONDUCTOR DEVICES

CROSS-REFERENCE TO RELATED APPLICATIONS

The present application claims the benefit of an earlier filed provisional application Ser. No. 60/092,316, entitled METHOD AND APPARATUS FOR PLATING AND PLANARIZING WAFER, filed on Jul. 9, 1998.

BACKGROUND OF THE INVENTION

1. Field of the Invention

The present invention generally relates to methods and apparatus for electropolishing metal layers on semiconductor wafers. More particularly, the present invention relates to a system for electropolishing interconnections in semiconductor devices formed on semiconductor wafers.

2. Description of the Related Art

In general, semiconductor devices are manufactured or fabricated on disks of semiconducting materials called wafers or slices. More particularly, wafers are initially sliced from a silicon ingot. The wafers then undergo multiple masking, etching, and deposition processes to form the electronic circuitry of semiconductor devices.

During the past decades, the semiconductor industry has increased the power of semiconductor devices in accordance with Moore's law, which predicts that the power of semiconductor devices will double every 18 months. This increase in the power of semiconductor devices has been achieved in part by decreasing the feature size (i.e., the smallest dimension present on a device) of these semiconductor devices. In fact, the feature size of semiconductor devices has quickly gone from 0.35 microns to 0.25 microns, and now to 0.18 microns. Undoubtedly, this trend toward smaller semiconductor devices is likely to proceed well beyond the sub-0.18 micron stage.

However, one potential limiting factor to developing more powerful semiconductor devices is the increasing signal delays at the interconnections (the lines of conductors, which connect elements of a single semiconductor device and/or connect any number of semiconductor devices together). As the feature size of semiconductor devices has decreased, the density of interconnections on the devices has increased. However, the closer proximity of interconnections increases the line-to-line capacitance of the interconnections, which results in greater signal delay at the interconnections. In general, interconnection delays have been found to increase with the square of the reduction in feature size. In contrast, gate delays (i.e., delay at the gates or mesas of semiconductor devices) have been found to increase linearly with the reduction in feature size.

One conventional approach to compensate for this increase in interconnection delay has been to add more layers of metal. However, this approach has the disadvantage of increasing production costs associated with forming the additional layers of metal. Furthermore, these additional layers of metal generate additional heat, which can be adverse to both chip performance and reliability.

Consequently, the semiconductor industry has started to use copper rather than aluminum to form the metal interconnections. One advantage of copper is that it has greater conductivity than aluminum. Also, copper is less resistant to electromigration (meaning that a line formed from copper will have less tendency to thin under current load) than aluminum. However, one significant disadvantage to using copper has been its tendency to bleed into the silicon substrate, thus contaminating the semiconductor device.

Additionally, before copper can be widely used for interconnections, new processing techniques are required. More particularly, in a conventional damascene process, metal is patterned within canal-like trenches and/or vias. The deposited metal is then polished back using chemical mechanical polishing ("CMP"). In general, depending on the interconnection structure design, anywhere from half a micron to 1.5 millimeters of copper needs to be polished. Polishing such a large quantity of copper using conventional CMP requires a long polishing time and consumes a large quantity of slurry, which leads to high manufacturing costs.

SUMMARY OF THE INVENTION

In an exemplary embodiment of the present invention, an electropolishing apparatus for polishing a metal layer formed on a wafer includes an electrolyte, a polishing receptacle, a wafer chuck, a fluid inlet, and at least one cathode. The wafer chuck holds and positions the wafer within the polishing receptacle. The electrolyte is delivered through the fluid inlet into the polishing receptacle. The cathode then applies an electropolishing current to the electrolyte to electropolish the wafer. In accordance with one aspect of the present invention, discrete portions of the wafer can be electropolished to enhance the uniformity of the electropolished wafer.

DESCRIPTION OF THE DRAWING FIGURES

The subject matter of the present invention is particularly pointed out and distinctly claimed in the concluding portion of the specification. The present invention, however, both as to organization and method of operation, may best be understood by reference to the following description taken in conjunction with the claims and the accompanying drawing figures, in which like parts may be referred to by like numerals:

FIG. 18A is a cross section view of an eighth alternative embodiment in accordance with various aspects of the present invention;

FIG. 18B is a cross section view of a ninth alternative embodiment in accordance with various aspects of the present invention;

FIG. 19A is a cross section view of a tenth alternative embodiment in accordance with various aspects of the present invention;

FIG. 19B is a cross section view of an eleventh alternative embodiment in accordance with various aspects of the present invention;

FIG. 20A is a top view of a portion of a twelfth alternative embodiment in accordance with various aspects of the present invention;

FIG. 20B is a view, partly in cross section, taken along the line 20B—20B in FIG. 20A, and partly in block diagram form, of the alternative embodiment shown in FIG. 20A;

FIG. 22A is a top view of a portion of a fifteenth alternative embodiment in accordance with various aspects of the present invention;

FIG. 22B is a view, partly in cross section, taken along the line 22B—22B in FIG. 22A, and partly in block diagram form, of the alternative embodiment shown in FIG. 22A;

FIG. 24A is a top view of a portion of a nineteenth alternative embodiment in accordance with various aspects of the present invention;

FIG. 24B is a view, partly in cross section, taken along the line 24B—24B in FIG. 24A, and partly in block diagram form, of the alternative embodiment shown in FIG. 24A;

FIG. 43A is a top view of a portion of a forty-third alternative embodiment in accordance with various aspects of the present invention;

FIG. 43B is a view, partly in cross section, taken along the line 43B—43B in FIG. 43A, and partly in block diagram form, of the alternative embodiment shown in FIG. 43A;

FIG. 54A is a top view of a portion of a forty-seventh alternative embodiment in accordance with various aspects of the present invention; and FIG. 54B is a view, partly in cross section, taken along the line 54B—54B in FIG. 54A, and partly in block diagram form, of the alternative embodiment shown in FIG. 54A;

DETAILED DESCRIPTION OF EXEMPLARY EMBODIMENTS

In order to provide a more thorough understanding of the present invention, the following description sets forth numerous specific details, such as specific material, parameters, and the like. It should be recognized, however, that such description is not intended as a limitation on the scope of the present invention, but is instead provided to enable a full and complete description of the exemplary embodiments.

Figure 1A:
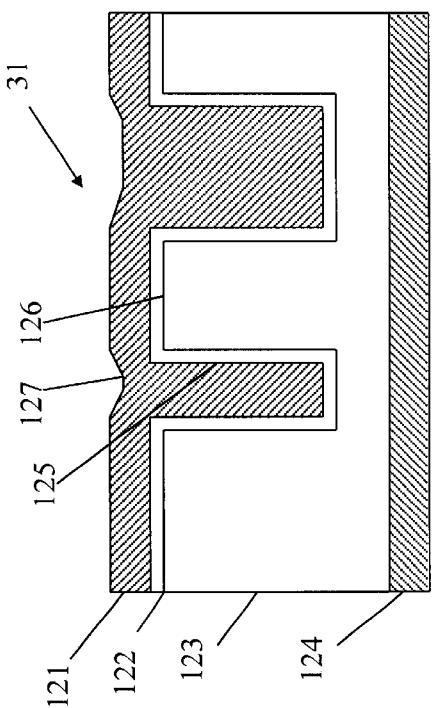
FIGS. 1A–1D are cross section views of a semiconductor wafer in accordance with various aspects of the present invention.

With reference to FIG. 1A, a semiconductor wafer 31, according to one aspect of the present invention, suitably includes a substrate layer 124. More particularly, in an exemplary embodiment of the present invention, substrate layer 124 preferably includes silicon. It should be recognized, however, that substrate layer 124 can include various semiconductor materials, such as gallium arsenide and the like, depending on the particular application.

Semiconductor wafer 31, according to another aspect of the present invention, suitably includes a dielectric layer 123 formed on top of substrate layer 124. In the present exemplary embodiment, dielectric layer 123 preferably includes silicon dioxide (SiO2). Dielectric layer 123 can be formed on substrate layer 124 using any convenient deposition method, such as chemical vapor deposition, evaporation, sputtering, and the like.

Additionally, dielectric layer 123 can include various materials having dielectric constant ("K") values lower than that of SiO2, these various materials being generally referred to as low-K materials, such as hydrogen-silsesquioxane (HSQ), Xerogel, polymer, aerogel, and the like. In comparison to SiO2, which has a dielectric constant of about 4.2, HSQ has a dielectric constant of about 3.0 to 2.5, and Xerogel has a dielectric constant of about 2.0. In general, a low-K material provides better electrical isolation. Therefore, the use of a low-K material as dielectric layer 123 can facilitate the formation of semiconductor devices with smaller feature sizes.

After dielectric layer 123 is suitably formed on substrate layer 124, the circuitry for semiconductor devices is suitably formed using any convenient process. In the present exemplary embodiment, a damascene process is preferably used. Accordingly, trenches (also known as gaps) 125 and gates (also known as mesas) 126 are formed in dielectric layer 123 using any convenient patterning method, such as photomasking, photolithography, microlithography, and the like.

Next, a barrier layer 122, according to still another aspect of the present invention, is suitably formed on top of dielectric layer 123. As depicted in FIG. 1A, barrier layer 122 also suitably lines the walls of trenches 125. As will be described below, when a metal layer 121, which includes copper, is formed on top of dielectric layer 123, barrier layer 122 suitably prevents the copper in metal layer 121 from diffusing into dielectric layer 123. Accordingly, in the present exemplary embodiment, barrier layer 122 preferably includes material resistant to the diffusion of copper, such as titanium, tantalum, tungsten, titanium-nitride, tantalum-nitride, tungsten-nitride, and the like. Barrier layer 122 can be deposited using any convenient deposition method, such as physical vapor deposition (PVD), chemical vapor deposition (CVD), and the like. It should be recognized, however, that barrier layer 122 can be omitted in some applications. For example, when dielectric layer 123 is formed from a material, which is resistant to diffusion of copper, or when the diffusion of copper into dielectric layer 123 will not adversely affect the performance of the semiconductor device.

As alluded to above, depending on the particular application, metal layer 121, according to yet another aspect of the present invention, can be suitably formed on top of barrier layer 122 or formed on top of dielectric layer 123. Additionally, metal layer 121 is suitably deposited within trench 125. In the present exemplary embodiment, metal layer 121 preferably includes copper. Accordingly, metal layer 121 is formed on top of barrier layer 122 to suitably prevent the diffusion of copper from metal layer 121 into dielectric layer 123. Although the present invention is particularly well suited for use with metal layer 121 including copper, it should be recognized that metal layer 121 can include various electrically conductive materials, such as nickel, chromium, zinc, cadmium, silver, gold, rhodium, palladium, platinum, tin, lead, iron, indium, and the like.

Metal layer 121 can be formed on barrier layer 122 or on dielectric layer 123 using any convenient method, such as PVD, CVD, and the like. Additionally, metal layer 121 can be formed using an electroplating processing, which is described in copending application Ser. No. 09/232,864, entitled PLATING APPARATUS AND METHOD, filed on Jan. 15, 1999, the entire content of which is incorporated herein by reference.

Figure 1B:
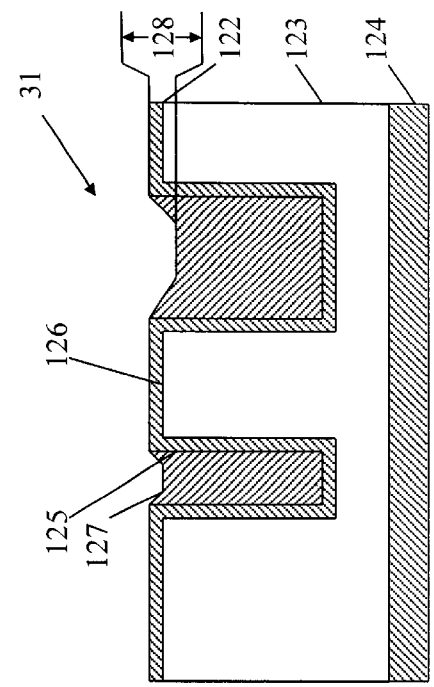

With reference now to FIG. 1B, metal layer 121 formed on top of mesas 126, according to another aspect of the present invention, is suitably electropolished. The present invention can be advantageously used in a damascene process, in which the circuitry of a semiconductor device is patterned into trenches or gaps. It should be recognized, however, that the present invention can be used in conjunction with various other processes without deviating from the spirit and/or scope of the present invention.

Figure 7:
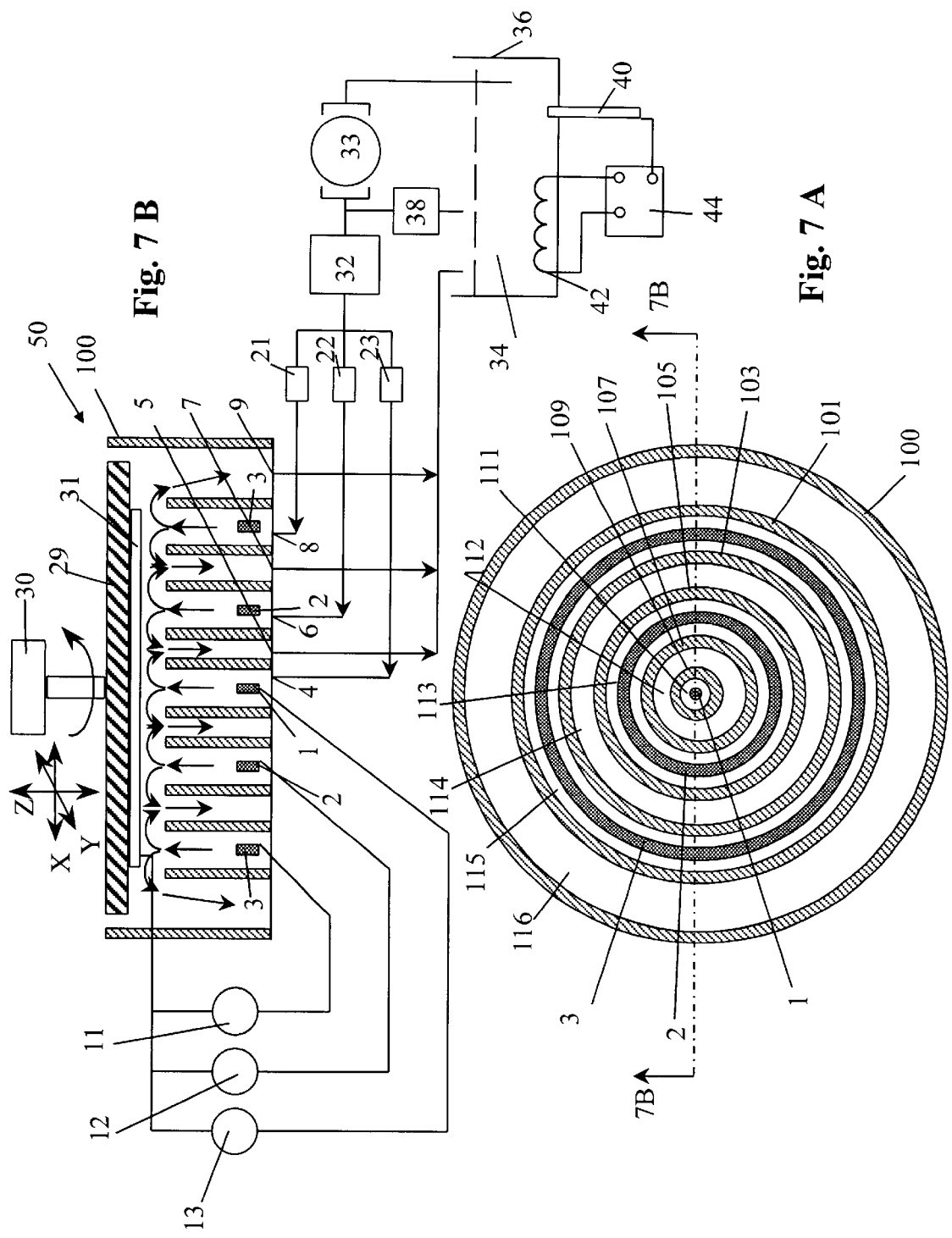
FIG. 7A is a top view of a portion of an electropolishing apparatus in accordance with various aspects of the present invention.
FIG. 7B is a view, partly in cross section, taken along the line 7B—7B in FIG. 7A, and partly in block diagram form, of the electropolishing apparatus shown in FIG. 7A.

With reference now to FIGS. 7A and 7B, a wafer electropolisher 50, according to various aspects of the present invention, is shown. In an exemplary embodiment of the present invention, wafer electropolisher 50 preferably includes polishing receptacle 100, which is divided into six sections 111, 112, 113, 114, 115 and 116 by section walls 109, 107, 105, 103 and 101. As will be described in greater detail below, it should be recognized that polishing receptacle 100 can be divided into any number of sections by any suitable number of section walls.

Polishing receptacle 100 and section walls 109, 107, 105, 103 and 101 are suitably formed from any convenient material electrically insulated and resistant to acid and corrosion, such as polytetrafluoroethylene (commercially known as TEFLON), PolyVinyl Chloride (PVC), PolyVinylindene Fluoride (PVDF), Polypropylene, and the like. In the present exemplary embodiment, polishing receptacle 100 and section walls 109, 107, 105, 103 and 101 are preferably formed from PVDF. It should be recognized, however, that polishing receptacle and each section wall 109, 107, 105, 103 and 101 can be formed from different materials depending on the particular application.

As depicted in FIG. 7B, in the present exemplary embodiment, electrolyte 34 flows into polishing receptacle 100 through inlets 4, 6 and 8 suitably formed in sections 111, 113 and 115, respectively. More particularly, a pump 33 suitably pumps electrolyte 34 from an electrolyte reservoir 36 to a pass filter 32 and into Liquid Mass Flow Controllers (LMFCs) 21, 22 and 23. Pass filter 32 suitably filters contaminants from electrolyte 34. In this manner, contaminants are prevented from entering polishing receptacle 100 and from clogging LMFCs 21, 22 and 23. In the present exemplary embodiment, pass filter 32 suitably removes particles larger than about 0.05 micrometer to about 0.1 micrometers. It should be recognized, however, that various filtering systems can be used depending on the particular application. Additionally, although filtering contaminants is advantageous, pass filter 32 can be omitted from wafer polisher 50 without deviating from the spirit and/or scope of the present invention.

Electrolyte 34 can include any convenient electroplating fluid, such as phosphoric acid, and the like. In the present exemplary embodiment, electrolyte 34 preferably includes orthophosphoric acid (H2PO4) having a concentration between about 60 percent by weight and about 85 percent by weight, and preferably about 76 percent by weight. Additionally, electrolyte 34 preferably includes orthophosphoric acid having 1 percent aluminum metal (against weight of the acid). It should be recognized, however, that the concentration and composition of electrolyte 34 can vary depending on the particular application.

Pump 33 can include any convenient hydraulic pump, such as a centrifugal pump, a diaphragm pump, a bellow pump, and the like. Additionally, pump 33 is suitably resistant to acid, corrosion, and contamination. In the present exemplary embodiment, pump 33 includes a diaphragm pump. It should be recognized, as will be depicted and described below in conjunction with alternative embodiments, that two or more pumps 33 can be used without deviating from the spirit and/or scope of the present invention. Additionally, it should be recognized that electrolyte 34 can be suitably delivered to polishing receptacle 100 through inlets 4, 6 and 8, without pump 33. For example, electrolyte 34 can be maintained at pressure within electrolyte reservoir 36. Alternatively, the supply lines between electrolyte reservoir 36 and inlets 4, 6 and 8 can be maintained at pressure.

LMFCs 21, 22 and 23 can include any convenient mass flow controller, preferably resistant to acid, corrosion, and contamination. Additionally, LMFCs 21, 22 and 23 deliver electrolyte 34 at set flow rates to sections 115, 113 and 111, respectively. Additionally, LMFCs 21, 22 and 23 can suitably deliver electrolyte 34 at flow rates proportionate to the volumes of sections 115, 113 and 111. For example, if section 115 is larger in volume than section 113, then it can be advantageous for LMFC 21 to deliver electrolyte 34 at a greater flow rate than LMFC 22. In the present exemplary embodiment, LMFCs 21, 22 and 23 are preferably configured to deliver electrolyte 34 at a flow rate between 0.5 liters per minute and 40 liters per minute.

Additionally, in the present exemplary embodiment, a separate LMFC delivers electrolyte into each section 115, 113 and 111. As will be described in greater detail below, this configuration facilitates electropolishing of discrete portions of wafer 31. It should be recognized, however, that any number of LMFCs can be used depending on the particular application. Additionally, as will be described and depicted below in conjunction with alternative embodiments, electrolyte 34 can be delivered into polishing receptacle 100 from pump 33 without using LMFCs 21, 22 and 23.

In accordance with various aspects of the present invention, wafer polisher 50 suitably includes cathodes 1, 2 and 3 disposed within sections 111, 113 and 115, respectively. As will be described in greater detail below, although the present exemplary embodiment includes three cathodes, any number of cathodes, whether fewer or greater than three, can be used without deviating from the present invention. In general, the more cathodes used, the better film uniformity can be expected. However, the more cathodes used, the greater the cost. Accordingly, considering the trade off between performance and cost, the preferred number of cathodes can be 7 to 20 for electropolishing 200-millimeter wafers, and 10 to 30 for electropolishing 300-millimeter wafers.

Additionally, cathodes 1, 2 and 3 can include any convenient electrically conducting material, such as copper, lead, platinum, and the like. During the electroplating period, some of the metal ions, which migrate out of metal layer 121, can accumulate on cathodes 1, 2 and 3. Accordingly, cathodes 1, 2 and 3 can be suitably replaced at any appropriate time. For example, cathodes 1, 2 and 3 can be suitably replaced after processing about 100 wafers.

Alternatively, a deplating process for cathodes 1, 2 and 3 can be suitably performed. For example, as will be described in greater detail below, in accordance with various aspects of the present invention, when cathodes 1, 2 and 3 are charged positively and wafer 31 is charged negatively, then wafer 31 is suitably electroplated rather than electropolished. In this manner, wafer 31 can be suitably electroplated with the buildup of metal on cathodes 1, 2 and 3 to suitably deplate cathodes 1, 2 and 3. Although under the conditions described above, cathodes 1, 2 and 3 would function as anodes, for the sake of consistency and convenience, they will continue to be referred to as cathodes.

In the present exemplary embodiment, metal layer 121 includes copper. Accordingly, as described above, during the electropolishing process, some of the copper ions from metal layer 121 migrate to electroplate cathodes 1, 2 and 3. In the deplating process described above, a wafer 31 can be suitably electroplated with the buildup of copper on cathodes 1, 2 and 3. However, when cathodes 1, 2 and 3 are formed from copper, cathodes 1, 2 and 3 can dissolve during the deplating process. In this manner, cathodes 1, 2 and 3 can become deformed during the deplating process. Accordingly, in accordance with various aspects of the present invention, cathodes 1, 2 and 3 can be suitably formed from materials, which are resistant to being dissolved during the deplating process. For example, cathodes 1, 2 and 3 can be suitably formed from platinum. Alternatively, cathodes 1, 2 and 3 can be suitably formed from titanium suitably coated with a layer of platinum, preferably with a coating thickness of about 50 microns to about 400 microns.

In the present exemplary embodiment, a wafer chuck 29 suitably holds and positions wafer 31 within polishing receptacle 100. More particularly, wafer 31 is suitably positioned above the tops of section walls 101, 103, 105, 107 and 109 to form a gap to facilitate the flow of electrolyte 34 between the bottom surface of wafer 31 and the tops of section walls 101, 103, 105, 107 and 109. In the present exemplary embodiment, wafer 31 is suitably positioned above the tops of section walls 101, 103, 105, 107 and 109 to form a gap of about 2 millimeters to about 20 millimeters.

After wafer 31 is suitably positioned within polishing receptacle 100, cathodes 1, 2 and 3 are electrically connected to power supplies 13, 12 and 11, respectively. Additionally, wafer 31 is electrically connected to power supplies 13, 12 and 11. In this manner, when electrolyte 34 flows between the bottom surface of wafer 31 and the tops of section walls 101, 103, 105, 107 and 109, an electrical circuit is formed. More particularly, cathodes 1, 2 and 3 are electrically charged to have negative electric potential in comparison to wafer 31. In response to this negative electric potential at cathodes 1, 2 and 3, metal ions then migrate away from wafer 31, thus electropolishing wafer 31. However, when the polarity of the circuit is reversed (i.e., cathodes 1, 2 and 3 become anodes), metal ions migrate toward wafer 31, thus electroplating wafer 31.

Figure 33:
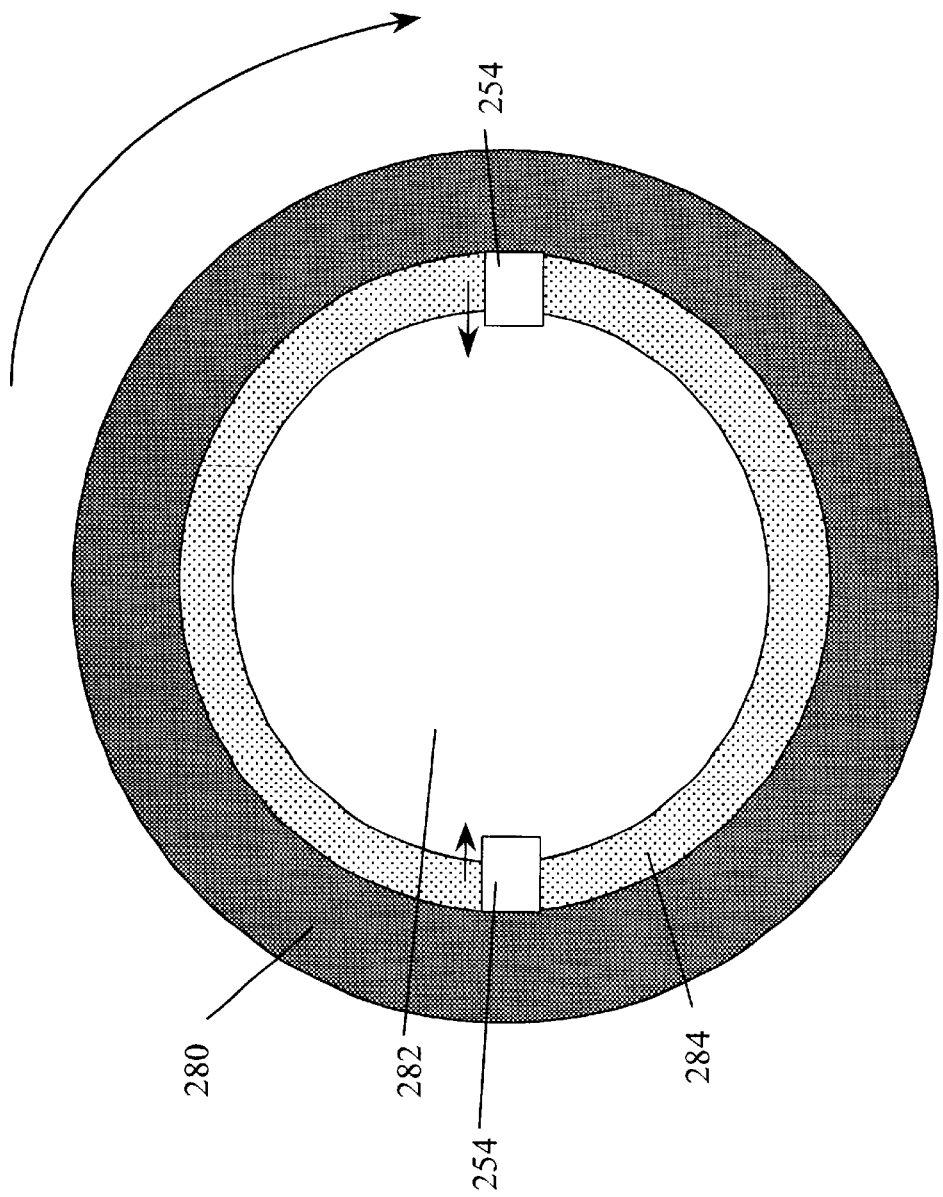
FIG. 33 is a top view of a wafer undergoing electropolishing in accordance with various aspects of the present invention.

In this manner, selective portions of wafer 31 can be suitably electropolished and electroplated by controlling the polarity of cathodes 1, 2 and 3, and by controlling the portions of wafer 31 contacted by electrolyte 34. FIG. 33 depicts the selective electropolishing of wafer 31 in accordance with various aspects of the present invention. With reference to FIG. 33, wafer area 280 has been electropolished, area 284 is being electropolished, and wafer area 282 has not been polished.

With reference again to FIGS. 7A and 7B, in general, the polishing current density determines the rate at which metal ions migrate to or from wafer 31. Accordingly, the higher the polishing current density, the greater the electropolishing or electroplating rate. In the present exemplary embodiment, a current density of about 5 amperes per decimeter-squared (A/dm$^2$) to about 40 amperes per decimeter-squared (A/dm$^2$), and preferably about 10 amperes per decimeter-squared (A/dm$^2$), can be used. It should be recognized, however, that various current densities can be used depending on the particular application.

Furthermore, power supplies 13, 12 and 11 can apply different current densities to cathodes 1, 2 and 3. For example, the current applied by power supplies 13, 12 and 11 can be set proportional to the surface area of wafer 31 that is covered by the corresponding cathodes. Accordingly, if the surface area of wafer 31 covered by cathode 3 is larger than that covered by cathode 2, power supply 11 can be set to apply more current than power supply 12. In this manner, the rate of electropolishing can be controlled to facilitate a more uniform etching of the surface of wafer 31. It should be recognized that the same principle can also be used to facilitate a more uniform electroplating of the surface of wafer 31.

In accordance with another aspect of the present invention, power supplies 13, 12 and 11 can be operated in DC (i.e., direct current) mode. Alternatively, power supplies 13, 12 and 11 can be operated in a variety of pulse modes. For example, with reference to FIG. 8, power supplies 13, 12 and 11 can be operated using a bipolar pulse, a modified sine-wave, unipolar pulse, pulse reverse, pulse-on-pulse, duplex pulse, and the like. Power supplies 13, 12 and 11 can also be operated in constant current mode, constant voltage mode, and a combination of constant current mode and constant voltage mode.

With reference again to FIG. 7B, a drive mechanism 30 suitably rotates wafer 31 about the z-axis. In this manner, a more uniform electropolish can be achieved across the surface of wafer 31. In the present exemplary embodiment, drive mechanism 30 rotates wafer 31 about the z-axis at approximately 10 revolutions per minute to approximately 100 revolutions per minute, and preferably at about 20 revolutions per minute.

As depicted in FIG. 7A, cathodes 1, 2 and 3 are substantially circular in shape. Accordingly, with reference to FIG. 7B, the areas of wafer 31 above sections 112 and 114 are likely to be exposed to lower current density than the areas of wafer 31 above sections 111, 113 and 115 (i.e., those sections containing a cathode). In order to compensate, drive mechanism 30 suitably oscillates wafer 31 in the x and y directions. Alternatively or in addition to oscillating wafer 31, as depicted in FIGS. 9A to 9D, polishing receptacle 100, section walls 109, 107, 105, 103 and 101, and cathodes 1, 2 and 3 can be formed into non-circular shapes, such as triangles, squares, rectangles, pentagons, polygons, ellipses, and the like. In this manner, the polishing current distribution can be averaged out across the surface of wafer 31 as wafer 31 is rotated about the Z-axis.

Electrolyte 34 returns to electrolyte reservoir 36 through outlets 5, 7 and 9, suitably formed in sections 112, 114 and 116, respectively. A pressure leak valve 38 is suitably placed between the outlet of pump 33 and electrolyte reservoir 36 to allow electrolyte 34 to leak back to electrolyte reservoir 36 when LMFCs 21, 22, and 23 are closed. Additionally, a heater 42, a temperature sensor 40, and a heater controller 44 suitably control the temperature of electrolyte 34 in electrolyte reservoir 36. In the present exemplary embodiment, wafer polisher 50 and electrolyte 34 are preferably operated at an operating temperature of about 15 degrees Celsius to about 60 degrees Celsius, and preferably at about 45 degrees Celsius.

Figure 10:
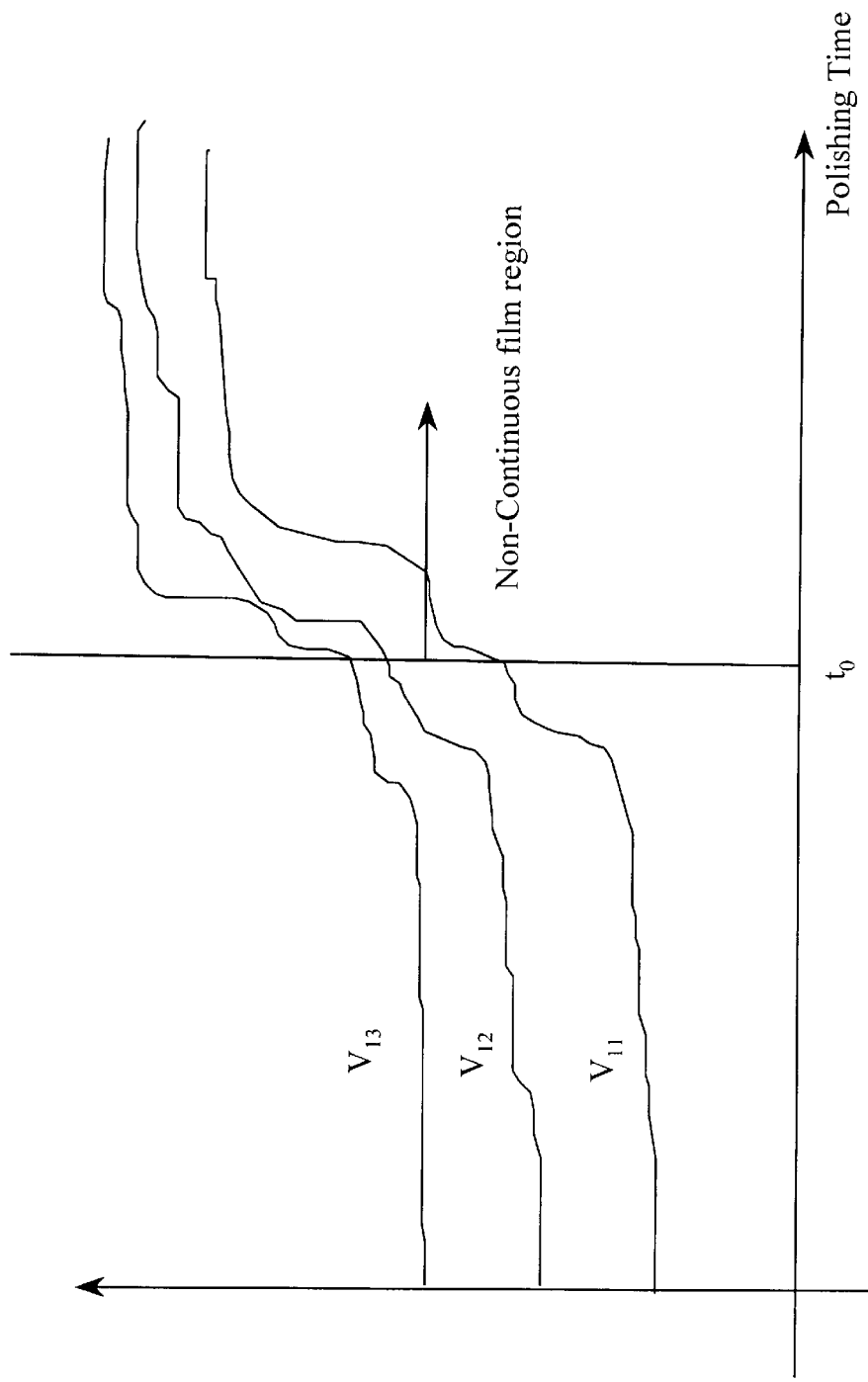
FIG. 10 is a plot of various waveforms depicting a portion of an electropolishing process in accordance with various aspects of the present invention.

With reference to FIG. 1A, wafer 31 is suitably electropolished for a period of time (i.e., an electropolishing time period), until metal layer 121 is removed from barrier layer 122, while metal layer 121 remains within trenches 125 (as depicted in FIG. 1B). With reference now to FIG. 7B, the requisite electropolishing time period can be determined by measuring the output voltage and current of power supplies 11, 12 and 13. More particularly, the resistance of barrier layer 122 is typically significantly greater than metal layer 121. For example, when barrier layer 122 includes titanium, titanium-nitride, tantalum, tantalum-nitride, tungsten, or tungsten-nitride and metal layer 121 includes copper, the resistance of barrier layer 122 is typically about 50 to about 100 times greater than the resistance of metal layer 121. Accordingly, the potential measured from edge to center of wafer 31 after polishing metal layer 121 away from the non-trench portions of wafer 31 is larger than that before polishing. As such, as detailed in the table below with reference to FIGS. 7A, 7B and 10, by comparing the output voltages of power supplies 11, 12 and 13, the portions of metal layer 121 above wafer 31 which have been removed can be suitably determined:

TABLE 1

1. If $V_{11}$ (Voltage of power supply 11) and $V_{12}$ (Voltage of power supply 12) are small in value, and $V_{13}$ (Voltage of power supply 13) is large in value, then metal layer 121 on wafer 31 above cathode 1 has been removed;

2. If $V_{11}$ is small in value, and $V_{12}$ and $V_{13}$ are large in value, then metal layer 121 on wafer 31 above cathode 3 has not been removed. Additionally, metal layer 121 above cathode 2 has been removed. However, the condition of metal layer 121 on wafer 31 above cathode 1 is unknown. Therefore, the following additional conditions can be consulted to determine the condition of metal layer 121 on wafer 31 above cathode 1:

a. If $V_{12}$ and $V_{13}$ are close to each other in value, then metal layer 121 on wafer 31 above cathode 1 has not been removed; or b. If $V_{12}$ and $V_{13}$ are apart from each other in value, then metal layer 121 on wafer 31 above cathode 1 has been removed;

3. If $V_{11}$, $V_{12}$ and $V_{13}$ are large in value, then metal layer 121 on wafer 31 above cathode 3 has been removed. However, the condition of metal layer 121 on wafer 31 above cathodes 2 and 1 is unknown. Therefore, the following additional conditions can be consulted to determine the condition of metal layer 121 on wafer 31 above cathodes 2 and 1:

a. If $V_{11}$, $V_{12}$, $V_{13}$ are apart from each other in value, then metal layer 121 on wafer 31 above cathode 2 and cathode 1 have been removed;

b. If $V_{11}$ and $V_{12}$ are apart from each other in value, and $V_{12}$ and $V_{13}$ are close to each other in value, then metal layer 121 on wafer 31 above cathode 2 has been removed. Additionally, metal layer 121 on wafer 31 above cathode 1 has not been removed;

c. If $V_{11}$ and $V_{12}$ are close to each other in value, and $V_{12}$ and $V_{13}$ are apart from each other in value, then metal layer 121 on wafer 31 above cathode has not been removed. Additionally, metal layer 121 on wafer 31 above cathode 1 has been removed; or d. If $V_{12}$ and $V_{13}$ are close to $V_{11}$ in value, then metal layer 121 on wafer 31 above cathode 1 and 2 are has not been removed.

In the table described above, $V_{11}$, $V_{12}$ and $V_{13}$ were described as being large and/or small. It should be recognized, however, that the terms large and small are relative and not meant to relate to any particular voltages. For example, when $V_{11}$ and $V_{12}$ are described above as being small, $V_{11}$ and $V_{12}$ are small in comparison to $V_{13}$. As alluded to above $V_{11}$ and $V_{12}$ could be as much as about 50 to about 100 times smaller than $V_{13}$.

In this manner, by referring to the above table, the areas of wafer 31, which require additional electropolishing, can be suitably determined. As will be described later in conjunction with an alternative embodiment of the present invention, monitors can be suitably configured to measure the voltage and current provided by each one of power supplies 11, 12 and 13. This data can be suitably transmitted to a control system, which can include the above table in electronic format. For example, the above table can be encoded and stored in an appropriate electronic storage medium, such as on magnetic tape, magnetic disk, compact disk, and the like, or in an appropriate electronic device, such as on an integrated circuit, memory chip, and the like. The control system can then execute appropriate commands to continue or to stop the electropolishing of a particular portion of wafer 31. It should be recognized that the control system described above can be integrated into an appropriate computer system, which can be a component of a wafer electropolishing tool, an example of which is described below.

Additionally, it should be appreciated, however, that various techniques can be used to determine the appropriate electropolishing time period. For example, as will be described in greater detail below in conjunction with an alternative embodiment, sensors can be used to measure the thickness of metal layer 121 (FIG. 1A) on wafer 31 (FIG. 1A and FIG. 7B).

Figure 53:
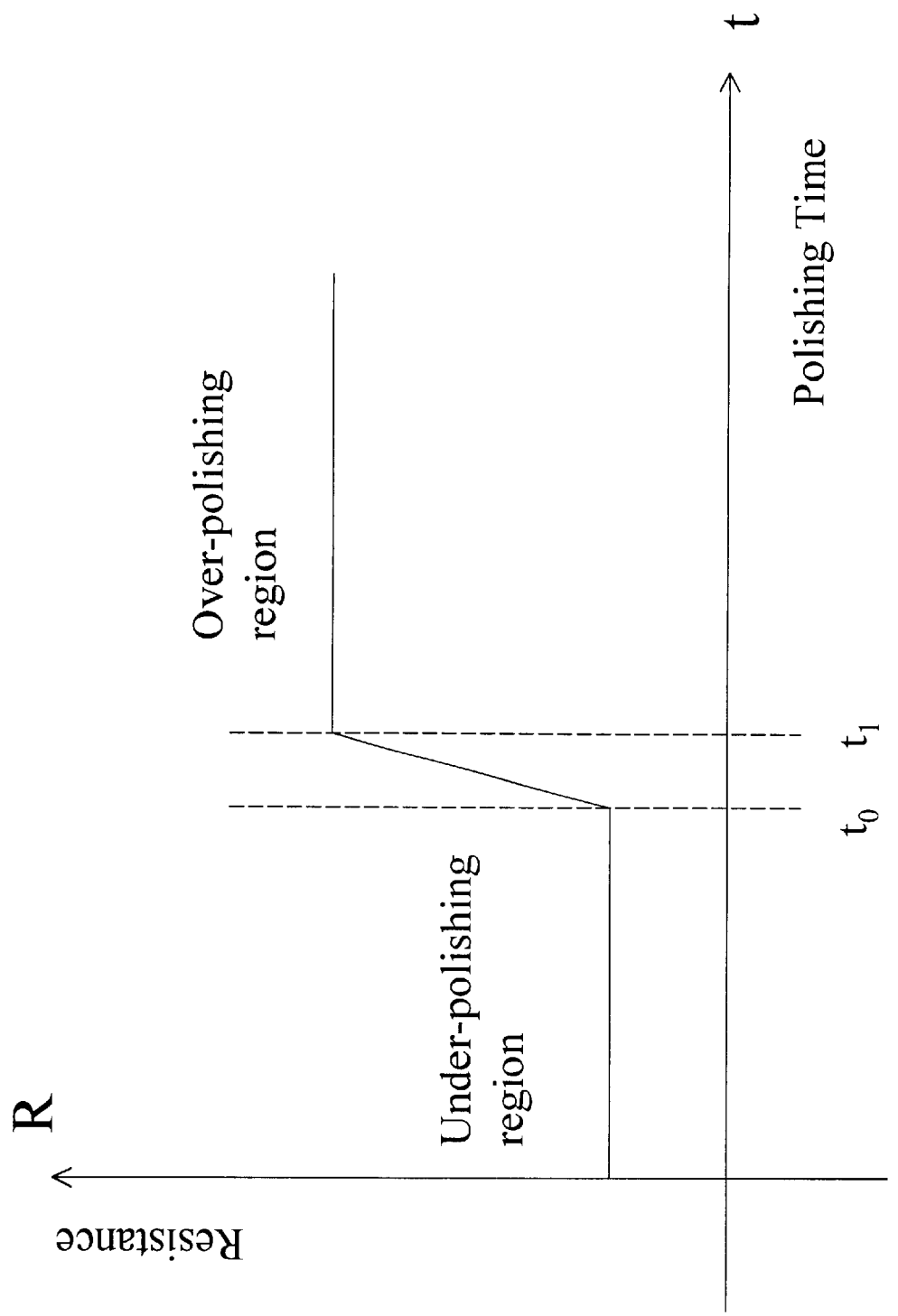
FIG. 53 is a waveform depicting a portion of a wafer processing operation in accordance with various aspects of the present invention.

Alternatively, with reference to FIG. 53, an end-point detector system can be suitably employed to determine the appropriate electropolishing time period. In accordance with an exemplary embodiment, the measured electrical resistance from edge to edge of wafer 31 (FIG. 1A) is monitored using appropriate measurement tools. As depicted in FIG. 53, as the surface area of metal layer 121 (FIG. 1A) on wafer 31 (FIG. 1A) is reduced due to electropolishing, the electrical resistance measured from edge to edge of wafer 31 (FIG. 1A) increases. Accordingly, the appropriate time at which to stop electropolishing is preferably around the time at which the measured electrical resistance from edge to edge of wafer 31 changes rapidly. With specific reference to FIG. 53, this would be at or near t0 and t1. The region beyond t1 is called the over-polishing region, meaning that wafer 31 (FIG. 1B) has been polished such that the level of metal layer 121 (FIG. 1B) within trench 125 (FIG. 1B) extends below the level of barrier layer 122 (FIG. 1B). The region before t0 is called the under-polishing region, meaning that metal layer 121 (FIG. 1A) has not been entirely removed from dielectric layer 122 (FIG. 1A) on gates 126 (FIG. 1A). The resistance signal can be sent to a computer, which can then send the appropriate signal to stop the polishing process.

With reference to FIGS. 7A and 7B, using the exemplary embodiment of the present invention described above, the following process steps can be employed to selectively electropolish portions of wafer 31:

Step 1: Turn on power supply 13;
Step 2: Turn on LMFC 23 only, such that electrolyte 34 only contacts the portion of wafer 31 above cathode 1 to electropolish metal layer 121 (FIG. 1A) above cathode 1;
Step 3: Turn off power supply 13 and turn off LMFC 23, when the thickness of metal layer 121 (FIG. 1A) reaches a set value or thickness;
Step 4: Repeat steps 1 to 3 for cathode 2, using LMFC 22 and power supply 12; and
Step 5: Repeat steps 1 to 3 for cathode 3, using LMFC 21 and power supply 11.

In addition to the above described electropolishing sequence of cathode 1, then cathode 2, and then cathode 3, the electropolishing sequence can also be as follows:
1) cathode 3, then cathode 2, and then cathode 1;
2) cathode 2, then cathode 1, and then cathode 3;
3) cathode 2, then cathode 3, and then cathode 1;
4) cathode 3, then cathode 1, and then cathode 2; or
5) cathode 1, then cathode 3, and then cathode 2.

By selectively polishing portions of wafer 31, metal layer 121 (FIG. 1A) can be electropolished more uniformly from wafer 31, even when wafer 31 is a large diameter wafer. For example, the present invention can be used with a wafer 31 having a diameter of 300 millimeters or greater. In the present context, a uniform electropolish refers to electropolishing wafer 31 such that metal layer 121 is removed to an even thickness across substantially all of the surface area of wafer 31. In general, in conventional electropolishing systems, the greater the diameter of wafer 31, the greater the nonuniformity of the electropolish. For example, the areas of wafer 31 near the center can be overpolished while the areas of wafer 31 near the edges of wafer 31 can be underpolished. This can be due in part to the varying charge densities applied across wafer 31 by conventional electropolishing systems.

In addition to selectively polishing portions of wafer 31, using the exemplary embodiment of the present invention described above, the following process steps can be employed to electropolish the entire surface of wafer 31 substantially at one time:

Step 1: Turn on all power supplies 11, 12 and 13. As described above, the current of each power supply 11, 12 and 13 can be suitably set proportionate to the surface area of wafer 31 covered by the corresponding cathode;
Step 2: Turn on LMFCs 21, 22 and 23. As also described above, the flow rate of electrolyte 34 from each LMFC 21, 22 and 23 can be suitably set proportionate to the surface area of wafer 31 covered by the corresponding cathode; and
Step 3: Turn off power supplies 11, 12 and 13 at the same time when the thickness uniformity of metal layer 121 (FIG. 1A) reaches a set value or thickness. Also, power supplies 11, 12 and 13 can be turned off at different times to adjust the thickness uniformity of metal layer 121 (FIG. 1A).

In this manner, the rate of removal of metal layer 121 from different portions of wafer 31 can be suitably controlled to more uniformly electropolish metal layer 121 on wafer 31.

Having thus described the structure and operation of an exemplary embodiment, an application of the present invention in the context of a damascene process will be described below. It should be recognized, however, that such description is not intended as a limitation on the use or applicability of the present invention, but is instead provided to enable a full and complete description of the present exemplary embodiment.

With reference again to FIG. 1A, in general, when metal layer 121 is suitably formed on wafer 31, recesses 127 can form over trenches 125. As depicted in FIG. 1A, even after electropolishing, recesses 127 can remain in the metal layer 121 formed within trenches 125. This can be due in part to the original uneven topology of metal layer 121 depicted in FIG. 1A. Additionally, overpolishing can contribute to the formation of recesses 127 within trenches 125. The existence of recesses 127 can adversely affect the performance of the semiconductor device. Accordingly, recesses 127 having a recess depth 128 greater than about 500 Angstroms are typically considered undesirable. It should be recognized, however, that the amount of recess depth 128, which is acceptable, can vary depending on the particular application. For example, for a high precision semiconductor device, a recess depth 128 of only a few Angstroms can be acceptable. However, for a low cost semiconductor device, a recess depth 128 greater than 500 Angstroms can be acceptable.

In accordance with one aspect of the present invention, the electropolishing time period can be suitably controlled to prevent the formation of recesses 127 with recess depth 128 of greater than about 500 Angstroms. However, this can increase processing cost and reduce processing throughput. Accordingly, in accordance with another aspect of the present invention, an electropolishing and electroplating process can be suitably combined with a chemical mechanical polishing (CMP) process to remove recesses 127. In general, CMP processes can suitably produce a planar surface on wafer 31 with recesses 127 having a recess depth 128 between about 100 and about 500 Angstroms.

Figure 1C:
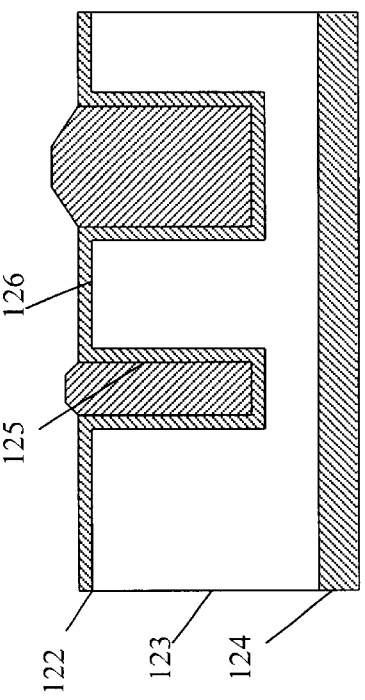

With reference to FIG. 1B, as described above, metal layer 121 is suitably electropolished from barrier layer 122 formed on mesas 126. With reference to FIG. 1C, wafer 31 then undergoes a replating process to replate a sufficient amount of metal to fix recesses 127 (FIG. 1B), meaning that metal is plated onto metal layer 121, which is formed in trenches 125 (FIG. 1B), without replating over barrier layer 122 on mesas 126. With reference to FIG. 7B, as alluded to earlier, wafer 31 can be suitably replated by reversing the polarity of power supplies 11, 12 and 13. In this manner, as also described in greater detail below, wafer 31 can be suitably replated without necessarily having to transfer wafer 31 to another station.

Next, in accordance with another aspect of the present invention, the metal layer 121 within trenches 125, which has been replated, is suitably planarized, and the barrier layer 122 is suitably removed. In the present exemplary embodiment, wafer 31 is preferably planarized using a CMP process. By having removed the majority of metal layer 121 using the above described electropolishing process, only a small amount of metal layer 121 now needs to be removed using CMP, which reduces overall processing time and cost.

Figure 3:
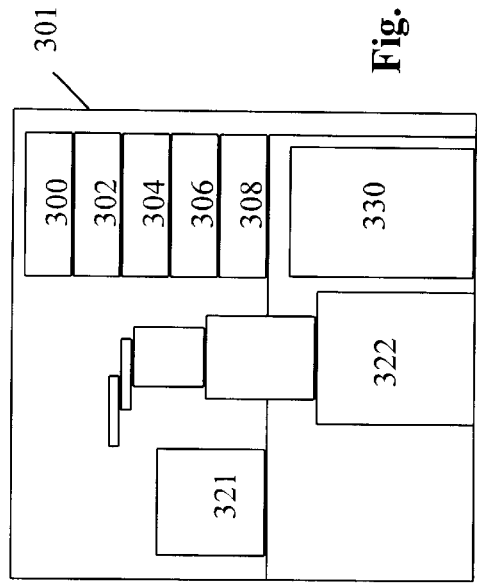
FIGS. 3A–3C are schematic top, cross section, and side views, respectively, of a wafer processing tool in accordance with various aspects of the present invention.
Figure 3:
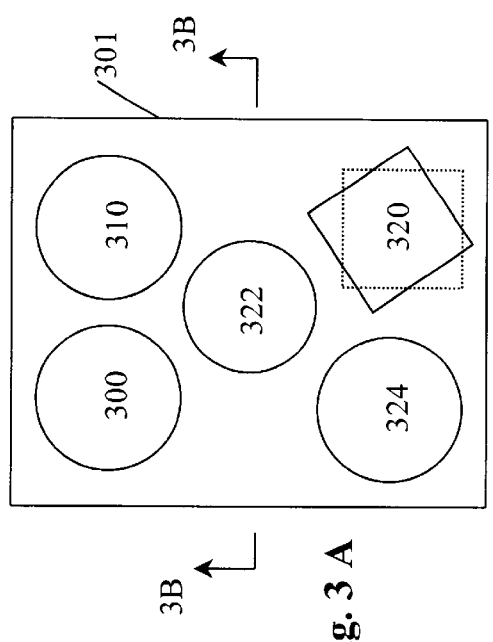
Figure 3:
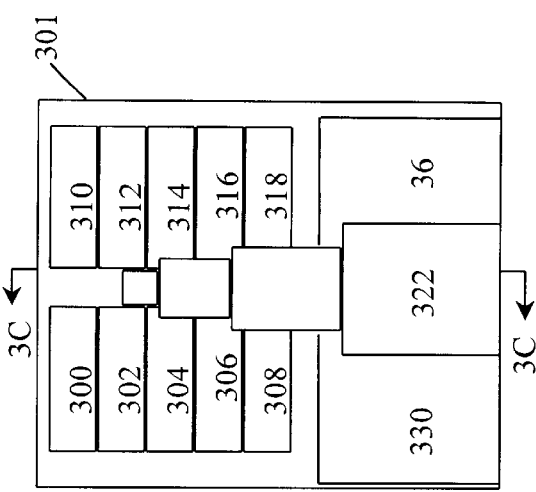
Figure 4A:
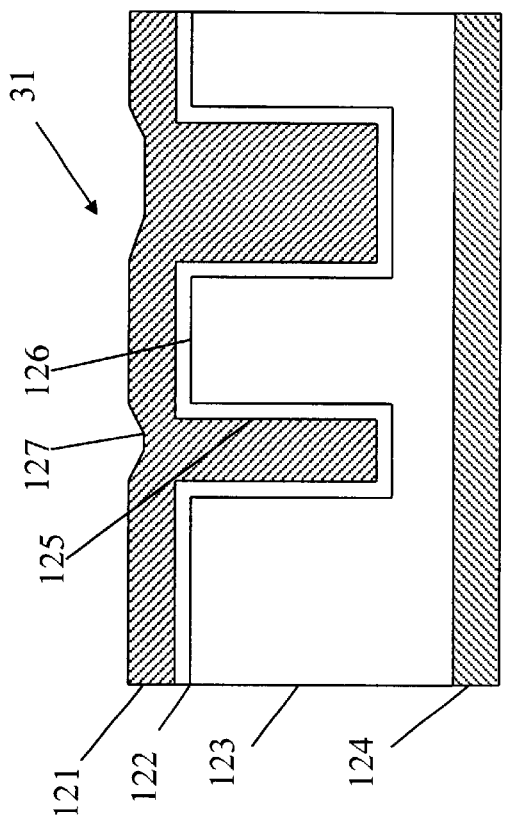
FIGS. 4A–4D are cross section views of another wafer in accordance with various aspects of the present invention.
Figure 4B:
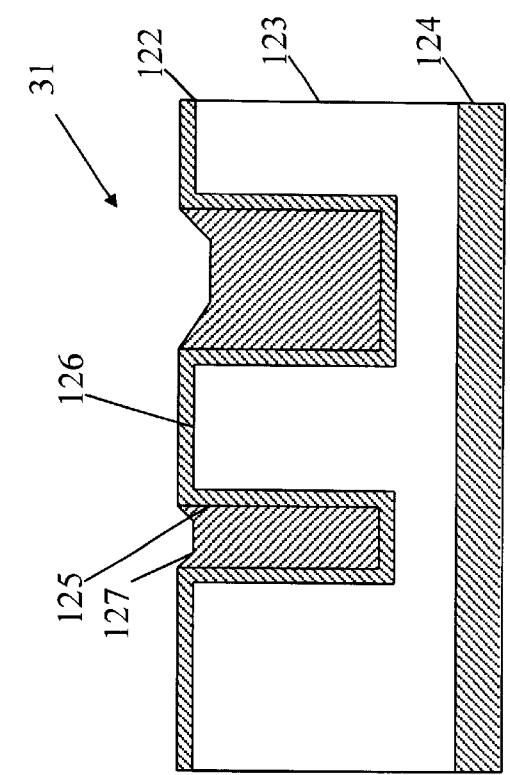
Figure 4C:
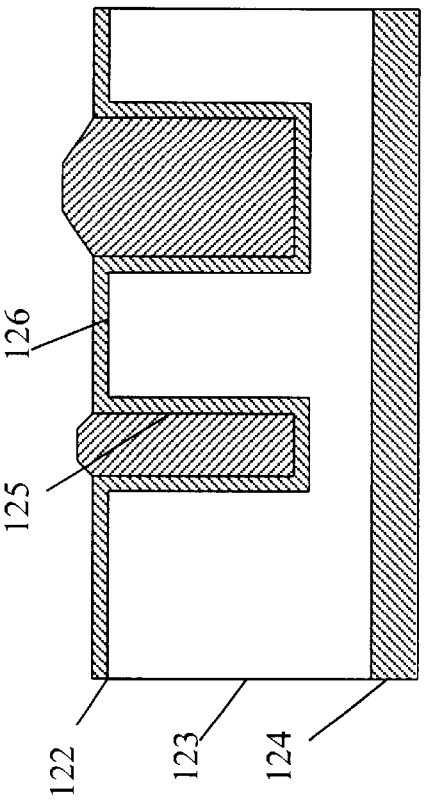
Figure 4D:
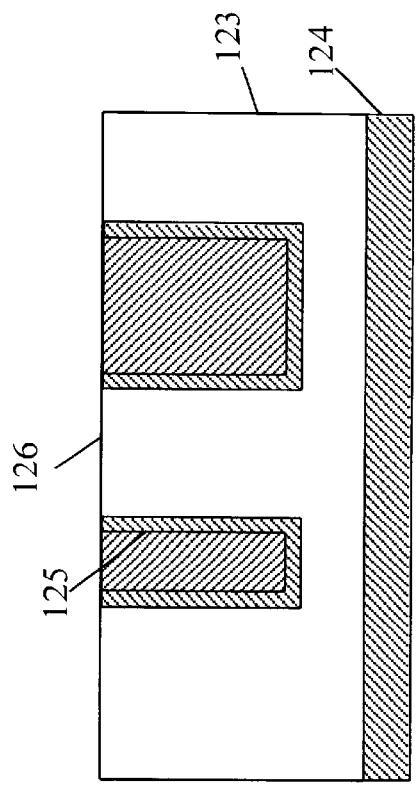

With reference now to FIGS. 3A to 3C, a wafer processing-tool 301, according to various aspects of the present invention, is shown. In an exemplary embodiment of the present invention, wafer processing tool 301 preferably includes electroplating/electropolishing cells 300, 302, 304, 306 and 308, cleaning cells 310, 312, 314, 316 and 318, a CMP cell 324, wafer cassette 320, and a robot 322.

Figure 1D:
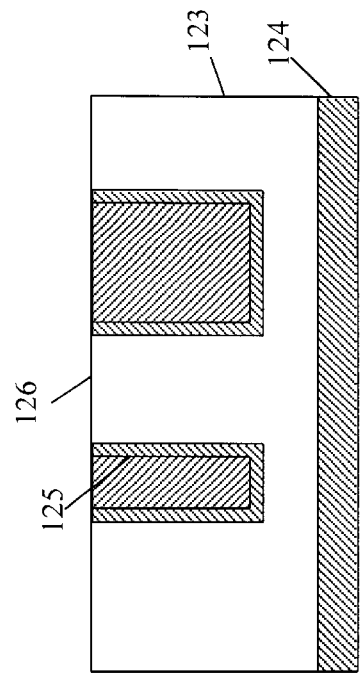

Robot 322 begins by transferring a wafer from wafer cassette 320 to any one of electroplating/electropolishing cells 300, 302, 304, 306, or 308. The wafer is suitably electroplated with a metal layer 121 (FIG. 1A). Next, the wafer is suitably electropolished to remove metal layer 121 from barrier layer 122 (FIG. 1B). Next, the wafer is suitably replated to fix recesses 127 (FIGS. 1B and 1C). Robot 322 then transfers the wafer to any one of cleaning cells 310, 312, 314, 316, or 318. After the wafer is cleaned, robot 322 transfers the wafer to CMP cell 324, where the metal layer 121 is planarized and barrier layer 122 is removed (FIG. 1D). Robot 322 then transfers the wafer to any one of cleaning cells 300, 302, 304, 306, or 308 for the wafer to be cleaned and dried. Finally, robot 322 transfers the wafer to wafer cassette 320 and begins again with another wafer.

It should be recognized, however, that various modifications can be made to the configuration of wafer processing tool 301 without deviating from the spirit and/or scope of the present invention. For example, the initial electroplating and electropolishing of the wafer can be performed in separate cells. In general, different electrolytes are used for electroplating and electropolishing. For electroplating, a sulfuric acid is typically used. For electropolishing, a phosphoric acid is typically used. Although sulfuric acid can be used for electropolishing, the resulting surface can be non-uniform. Similarly, although phosphoric acid can be used for electroplating, the resulting surface can be non-uniform. A non-uniform surface can be acceptable for the replating process described above. However, a non-uniform surface can be unacceptable for the initial plating of metal layer 121. Accordingly, when a uniform surface is preferred, the electroplating and electropolishing of the wafer can be performed in separate cells with different chemistries. Alternatively, when electroplating and electropolishing is performed in the same cell, the chemistry of the electrolyte solution within the cell can be varied. For example, for the replating process described above, a sulfuric acid solution can be added to facilitate a better electroplating process.

Figure 2:
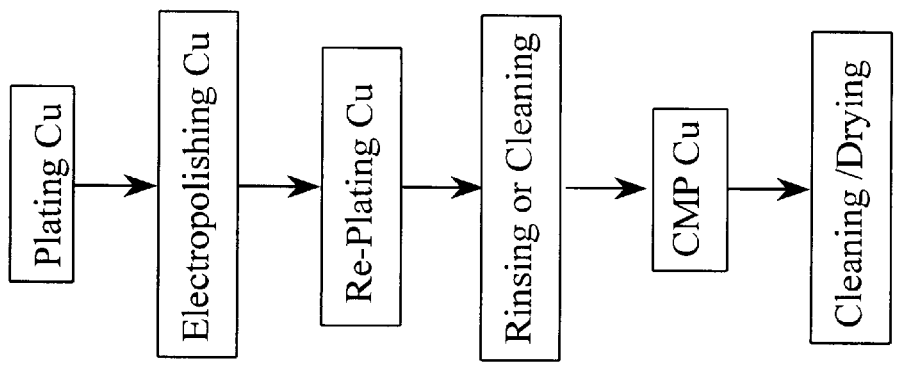
FIG. 2 is a flow chart for processing wafers in accordance with various aspects of the present invention.

With reference to FIG. 2, the processing steps performed by wafer processing tool 301 are set forth in a flow chart format. It should be recognized, however, that various modifications can be made to the steps depicted in the flow chart in FIG. 2. For example, the wafers may be queued after the re-plating step, then rinsed and cleaned in a batch process.

Figure 5:
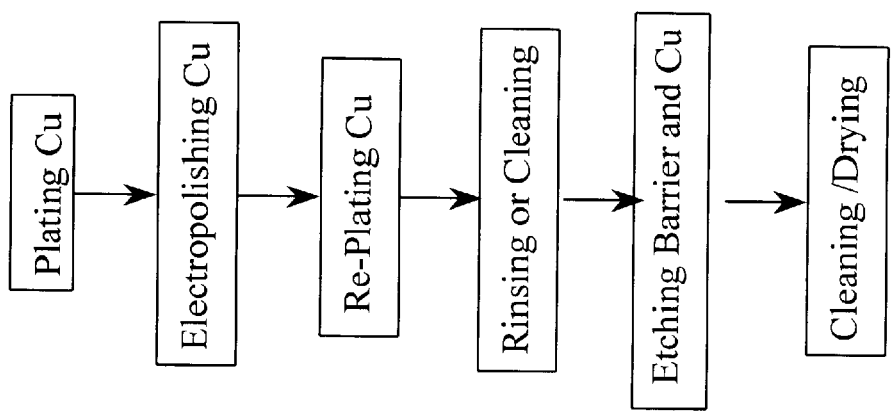
FIG. 5 is another flow chart for processing wafers in accordance with various aspects of the present invention.
Figure 6:
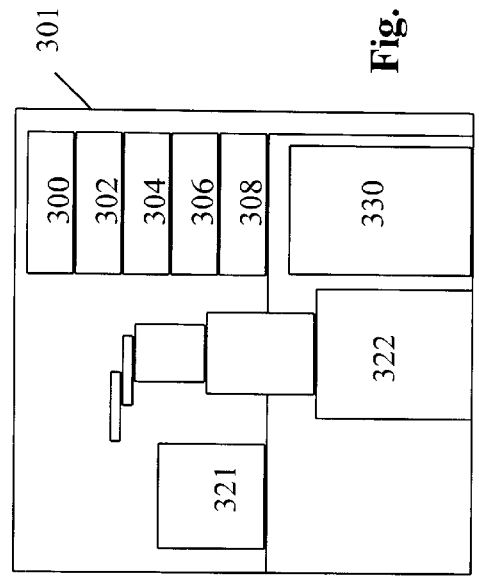
FIGS. 6A–6C are schematic top, cross section, and side views, respectively, of another wafer processing tool in accordance with various aspects of the present invention.
Figure 6:
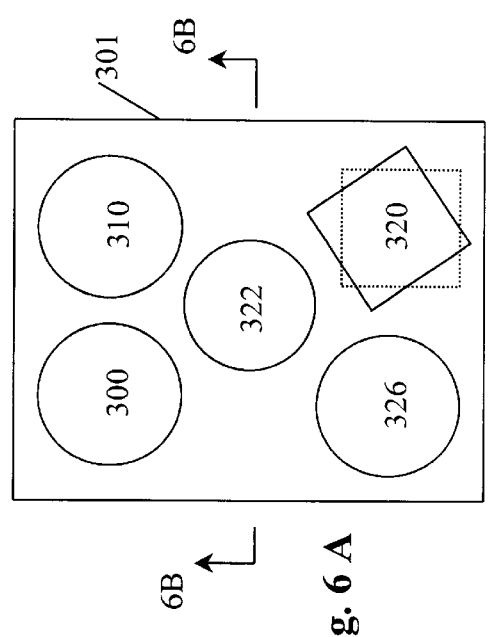
Figure 6:
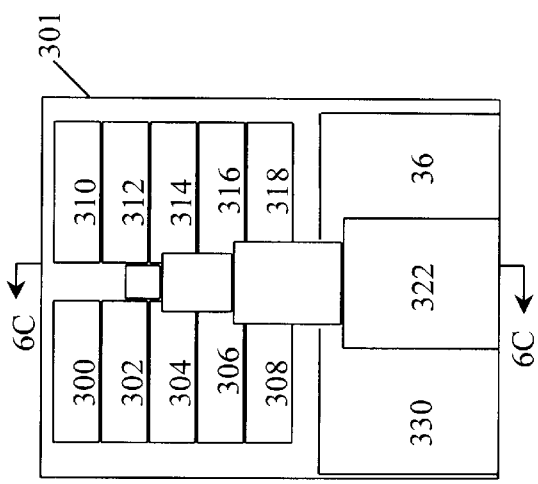

With reference to FIGS. 4A to 4D, one alternative to polishing wafer 31 using CMP after replating wafer 31 is to etch metal layer 121 and barrier layer 122 from wafer 31 using any convenient etching process. Accordingly, with reference to FIGS. 6A to 6C, wafer processing tool 301 can be modified to include an etching cell 326. Similarly, with reference to FIG. 5, the processing steps performed by wafer processing tool 301 can be modified to include an etching step.

In the following description and associated drawing figures, various alternative embodiments in accordance with various aspects of the present invention will be described and depicted. It should be recognized, however, that these alternative embodiments are not intended to demonstrate all of the various modifications, which can be made to the present invention. Rather, these alternative embodiments are provided to demonstrate only some of the many modifications which are possible without deviating from the spirit and/or scope of the present invention.

Figure 11:
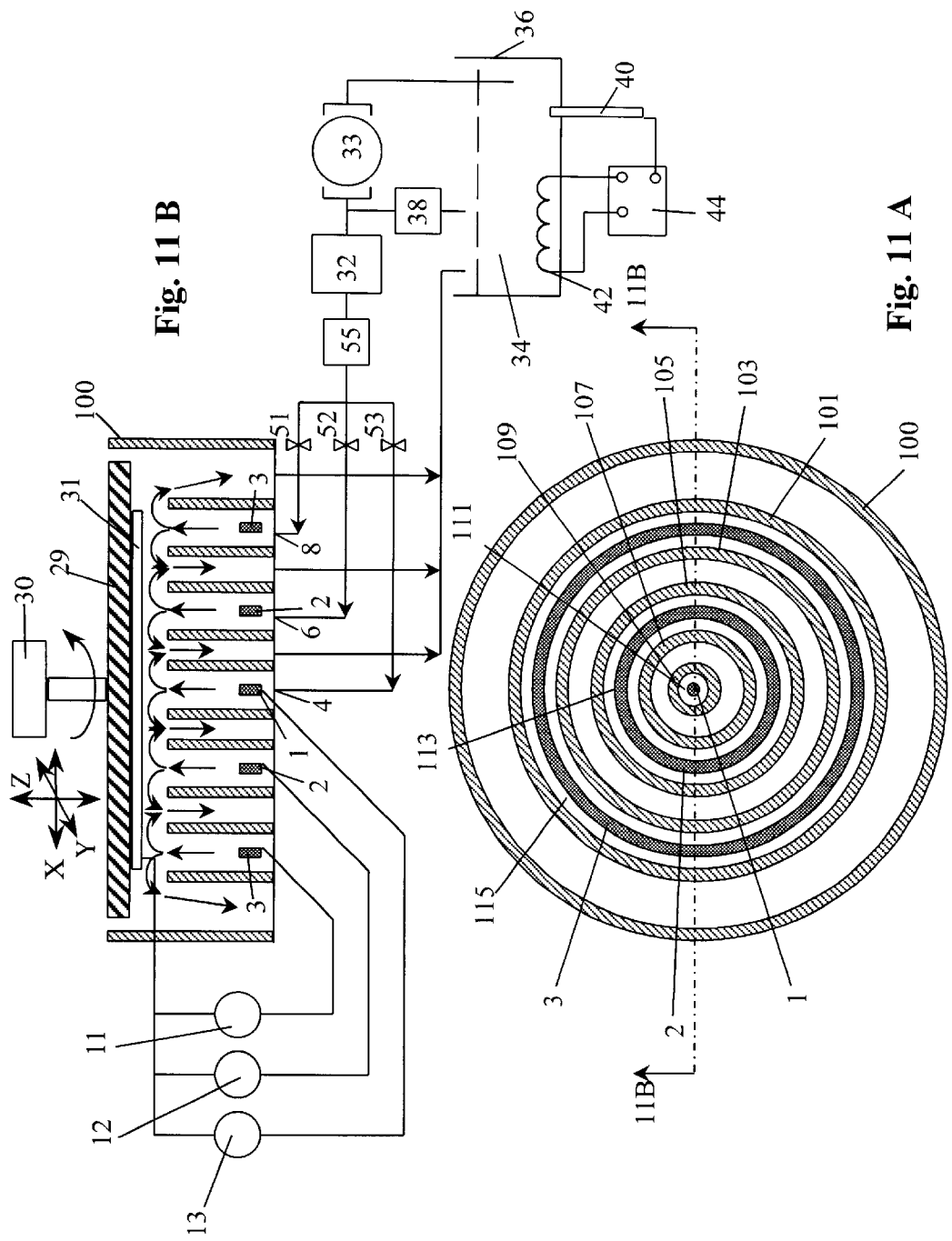
FIG. 11A is a top view of a portion of another alternative embodiment in accordance with various aspects of the present invention.
FIG. 11B is a view, partly in cross section, taken along the line 11B—11B in FIG. 11A, and partly in block diagram form, of the alternative embodiment shown in FIG. 11A.

With reference now to FIGS. 11A and 11B, an alternative embodiment of the present invention, according to various aspects of the present invention, is shown. The embodiment of FIGS. 11A and 11B is similar to that of FIGS. 7A and 7B except that LMFCs 21, 22 and 23 (FIGS. 7A and 7B) have been replaced by LMFC 55 and valves 51, 52 and 53. In the present alternative embodiment, valves 51, 52 and 53 are preferably on/off valves. The flow rate set of LMFC 55 can be preferably determined based on the status of each valve as follows:

Flow rate set of LMFC 55=F.R.3×f(valve 51)+F.R.2×f(valve 52)+ F.R.1×f(valve 53)

Where, F.R. 3 is the set point of flow rate to inlet 4, F.R. 2 is the set point of flow rate to inlet 6, F.R. 3 is the set point of flow rate to inlet 8, and f (valve #) is a valve status function defined as follows:

f(valve #)=
  1, when valve # is turned on;
  0, when valve # is turned off.

As alluded to above, the flow rates can be set proportionate to the volumes of sections 115, 113 and 111.

Figure 12:
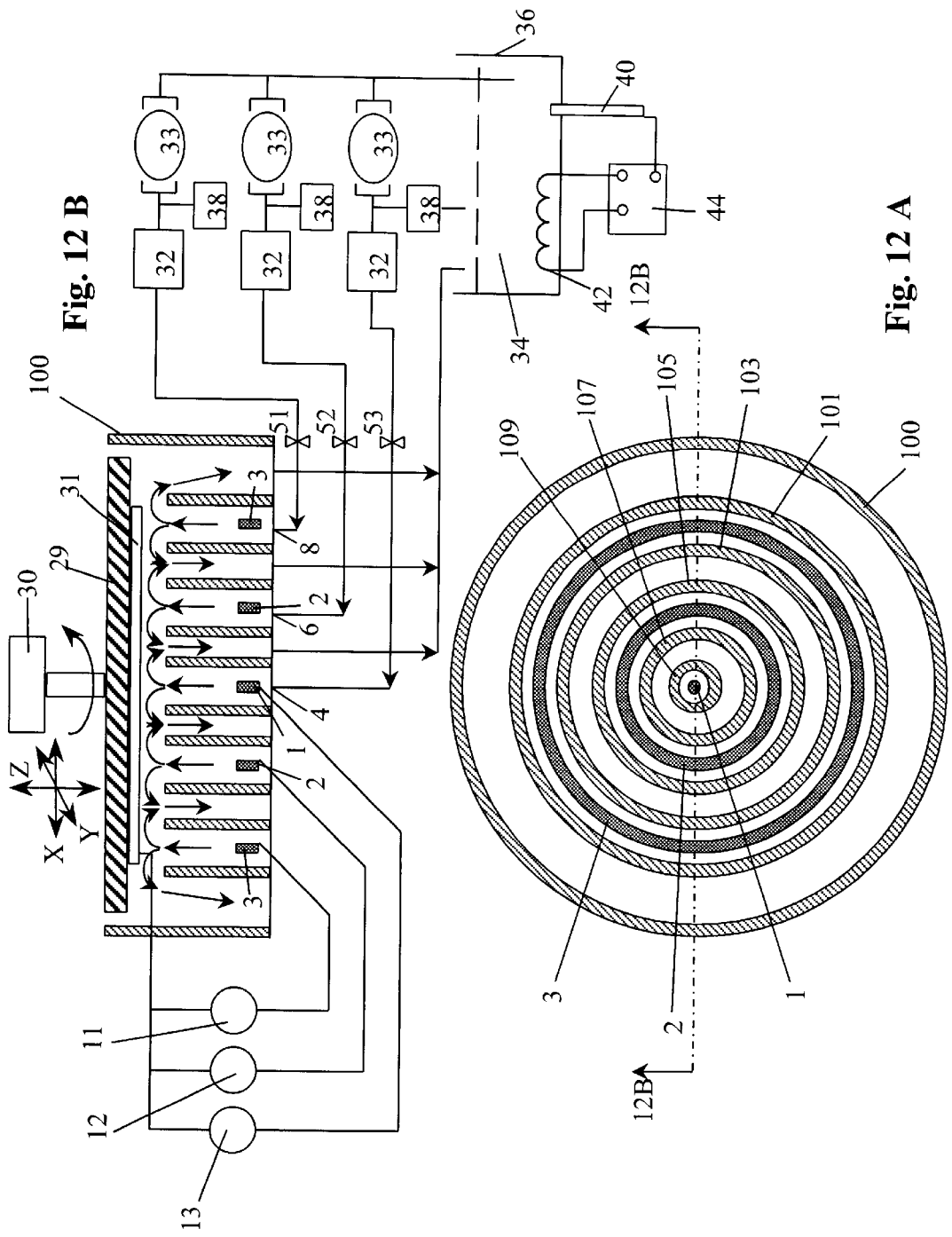
FIG. 12A is a top view of a portion of a second alternative embodiment in accordance with various aspects of the present invention.
FIG. 12B is a view, partly in cross section, taken along the line 12B—12B in FIG. 12A, and partly in block diagram form, of the alternative embodiment shown in FIG. 12A.

With reference now to FIGS. 12A and 12B, another alternative embodiment of the present invention, according to various aspects of the present invention, is shown. The embodiment of FIGS. 12A and 12B is similar to that of FIGS. 7A and 7B except that LMFCs 21, 22 and 23 (FIGS. 7A and 7B) have been replaced by three pumps 33 and on/off valves 51, 52 and 53. In the present alternative embodiment, the delivery of electrolyte 34 into polishing receptacle 100 through inlets 4, 6 and 8 can be preferably controlled independently by each one of three pumps 33 and one on/off valve 51, 52, or 53.

Figure 13:
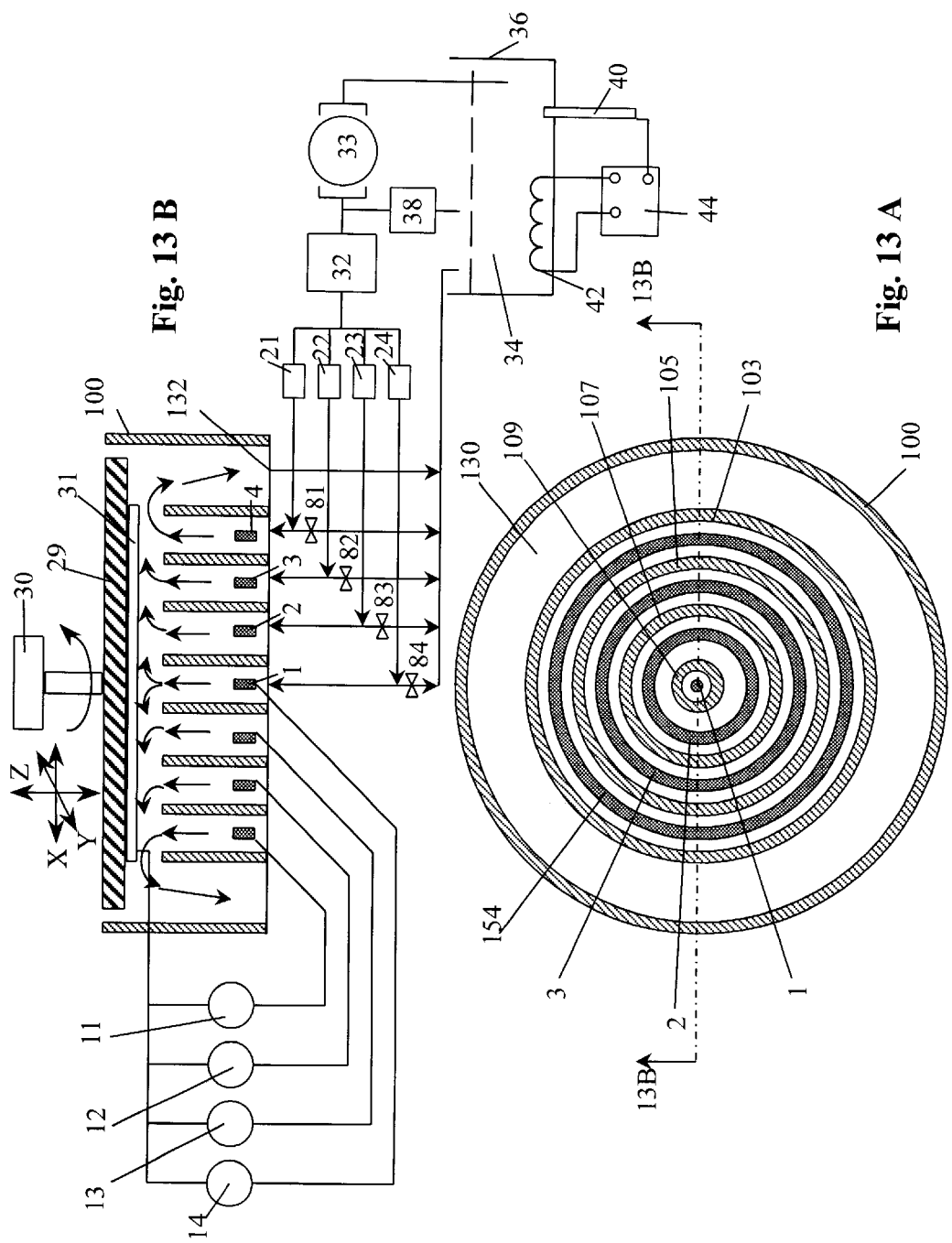
FIG. 13A is a top view of a portion of a third alternative embodiment in accordance with various aspects of the present invention.
FIG. 13B is a view, partly in cross section, taken along the line 13B—13B in FIG. 13A, and partly in block diagram form, of the alternative embodiment shown in FIG. 13A.

With reference now to FIGS. 13A and 13B, still another alternative embodiment of the present invention, according to various aspects of the present invention, is shown. In contrast to the exemplary embodiment shown in FIGS. 7A and 7B, in the present alternative embodiment, a cathode is preferably disposed in every section of polishing receptacle 100 except section 132. For example, additional cathode 4 is suitably disposed between section walls 103 and 105. Additionally, on/off valves 81, 82, 83 and 84 are suitably disposed between the electrolyte reservoir 36 and the outlets of LMFCs 21, 22, 23 and 24. Accordingly, when an on/off valve 81, 82, 83 or 84 is in an open position, electrolyte 34 can suitably flow back into electrolyte reservoir 36 through the open valve from polishing receptacle 100.

Using the present alternative embodiment described above, the following process steps can be suitably employed to selectively electropolish portions of wafer 31:

Step 1: Turn on power supply 14;

Step 2: Turn on LMFC 24 and open valves 81, 82, and 83. Turn off LMFCs 21, 22, and 23 and close valve 84, such that electrolyte 34 only contacts the portion of wafer 31 above cathode 1. Electrolyte 34 then returns to electrolyte reservoir 36 through outlet 132 suitably formed in section 130. Electrolyte 34 also returns to electrolyte reservoir 34 through open valves 81, 82 and 83;

Step 3: When the thickness of metal layer 121 (FIG. 1A) reaches a set-value or thickness, turn off power supply 14 and turn off LMFC 24;

Step 4: Repeat steps 1 to 3 for cathode 2 (Turn on LMFC 23. Open valves 81, 82 and 84. Turn on power supply 13. Turn off LMFCs 21, 22 and 24. Close valve 83. Turn off power supplies 11, 12 and 14);

Step 5: Repeat steps 1 to 3 for cathode 3 (Turn on LMFC 22. Open valves 81, 83 and 84. Turn on power supply 12. Turn off LMFCs 21, 23 and 24. Close valve 82. Turn off power supplies 11, 13 and 14); and Step 6: Repeat steps 1 to 3 for cathode 4 (Turn on LMFC 21. Open valves 82, 83 and 84. Turn on power supply 11. Turn off LMFCs 22, 23 and 24. Close valve 81. Turn off power supplies 12, 13, and 14).

It should be recognized that rather than polishing from periphery of the wafer to center of the wafer, polishing also can be performed from center to periphery, or can be performed by randomly choosing a cathode sequence.

In addition to selectively electropolishing portions of wafer 31, using the present alternative embodiment described above, the following process steps can be employed to electropolish the entire surface of wafer 31 at one time:

Step 1: Turn on power supplies 11, 12, 13 and 14. As described earlier, the current of each power supply 11, 12, 13 and 14 can be suitably set proportionate to the surface area of wafer 31 covered by the corresponding cathode.

Step 2: Turn on LMFCs 21, 22, 23 and 24 and turn off valves 81, 82, 83, 84. As also described earlier, the flow rate of electrolyte 34 from LMFCs 21, 22, 23 and 24 can be suitably set proportionate to the surface area of wafer 31 covered by the corresponding cathode; and Step 3: Turn off power supplies 11, 12, 13 and 14 at the same time when metal layer 121 (FIG. 1A) reaches a set value or thickness. Also, power supplies 11, 12, 13 and 14 can be turned off at different times to adjust the thickness uniformity of metal layer 121 (FIG. 1A).

Figure 14:
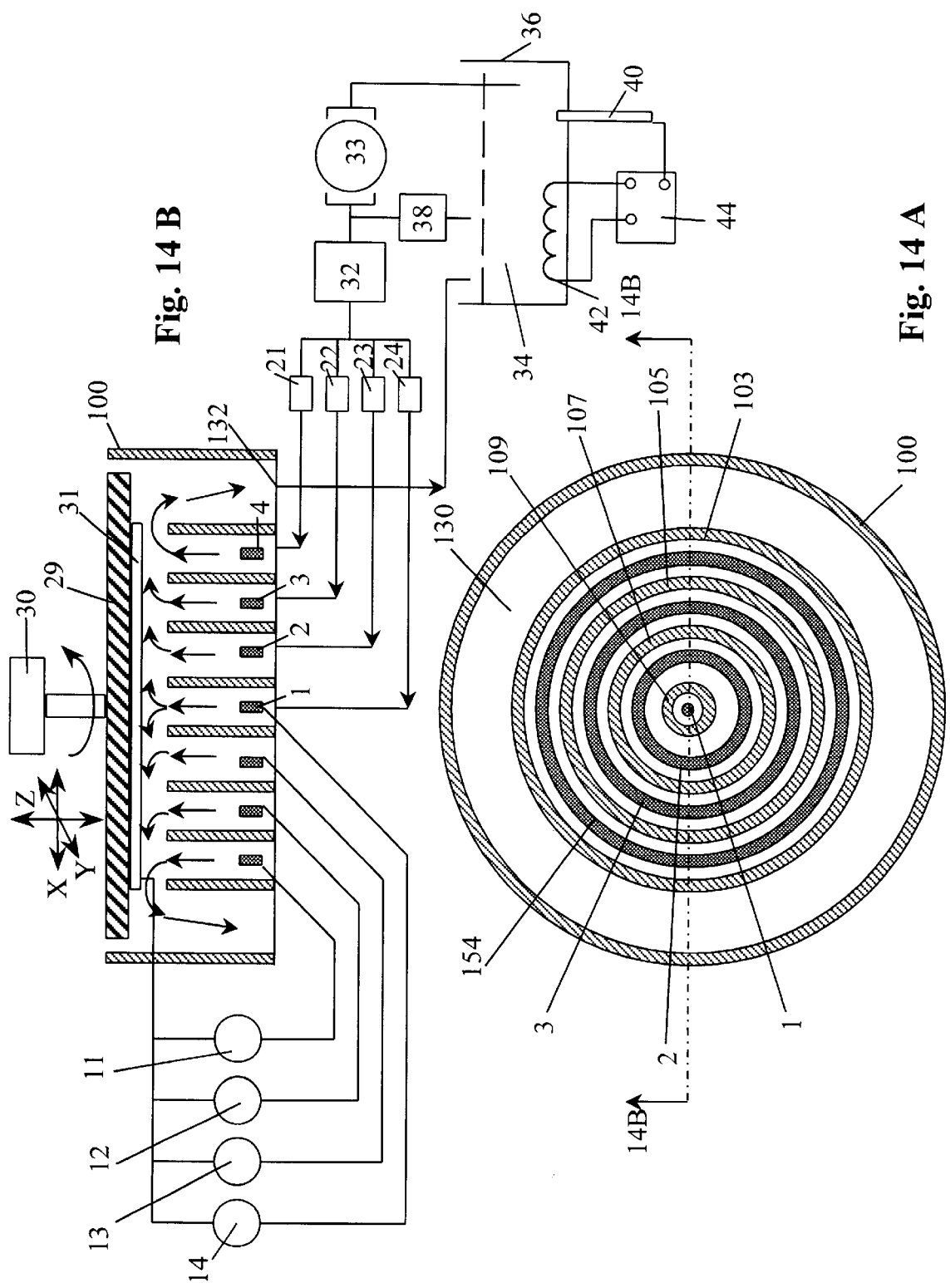
FIG. 14A is a top view of a portion of a fourth alternative embodiment in accordance with various aspects of the present invention.
FIG. 14B is a view, partly in cross section, taken along the line 14B—14B in FIG. 14A, and partly in block diagram form, of the alternative embodiment shown in FIG. 14A.

With reference now to FIGS. 14A and 14B, yet another alternative embodiment of the present invention, according to various aspects of the present invention, is shown. The embodiment of FIGS. 14A and 14B is similar to that of FIGS. 13A and 13B except that on/off valves 81, 82, 83 and 84 (FIGS. 13A and 13B) have been removed. Accordingly, electrolyte 34 returns to electrolyte reservoir 36 only through section 130.

Using the present alternative embodiment described above, the following process steps can be suitably employed to selectively electropolish portions of wafer 31:

Step 1: Turn on power supply 14 to output negative potential to electrode 1 (cathode 1). Turn on power supplies 11, 12 and 13 to output positive potential to electrode 4, 3 and 2 (anodes 4, 3 and 2), respectively;

Step 2: Turn on LMFC 24 only and turn off LMFCs 21, 22, and 23. Wafer 31 is steeped in electrolyte 34, however, only the portion of wafer 31 above cathode 1 contacts electrolyte 34 from LMFC 24 and negative potential from cathode 1. Therefore, only the portion of metal layer 121 (FIG. 1A) on wafer 31 above cathode 1 is suitably electropolished;

Step 3: When metal layer 121 (FIG. 1A) reaches a set-value or thickness, turn off power supply 14 and turn off LMFC 24;

Step 4: Repeat steps 1 to 3 for cathode 2 (Turn on power supply 13 to output negative potential to cathode 2, and power supplies 11, 12, and 14 to output positive potential to anodes 4, 3, and 1, respectively. Turn on LMFC 23 and turn off LMFCs 21, 22 and 24);

Step 5: Repeat steps 1 to 3 for cathode 3 (Turn on power supply 12 to output negative potential to cathode 3. Turn on power supplies 11, 13 and 14 to output positive potential to anodes 4, 2 and 1, respectively. Turn on LMFC 22 and turn off LMFCs 21, 23 and 24); and Step 6: Repeat steps 1 to 3 for cathode 4 (Turn on power supply 11 to output negative potential to cathode 4. Turn on power supplies 12, 13 and 14 to output positive potential to anodes 1, 2 and 3, respectively. Turn on LMFC 21 and turn off LMFCs 22, 23 and 24).

In the above selective polishing process, instead of polishing from the center of wafer 31 to the periphery of wafer 31, the polishing also can be performed from the periphery to the center, or can be performed randomly depending on the cathode sequence.

In addition to selectively electropolishing portions of wafer 31, using the present alternative embodiment described above, the following process steps can be employed to electropolish the entire surface of wafer 31 at one time:

Step 1: Turn on power supplies 11, 12, 13 and 14. As described earlier, the current of each power supply 11, 12, 13 and 14 can be suitably set proportionate to the surface area of wafer 31 covered by the corresponding cathode;

Step 2: Turn on LMFCs 21, 22, 23 and 24. As also described earlier, the flow rate of electrolyte 34 from LMFCs 21, 22, 23 and 24 can be suitably set proportionate to the surface area of wafer 31 covered by the corresponding cathode; and Step 3: Turn off power supplies 11, 12, 13 and 14 at the same time when metal layer 121 (FIG. 1A) reaches a set value or thickness. Also, power supplies 11, 12, 13 and 14 can be turned off at different times to adjust the thickness uniformity of metal layer 121 (FIG. 1A).

Figure 15:
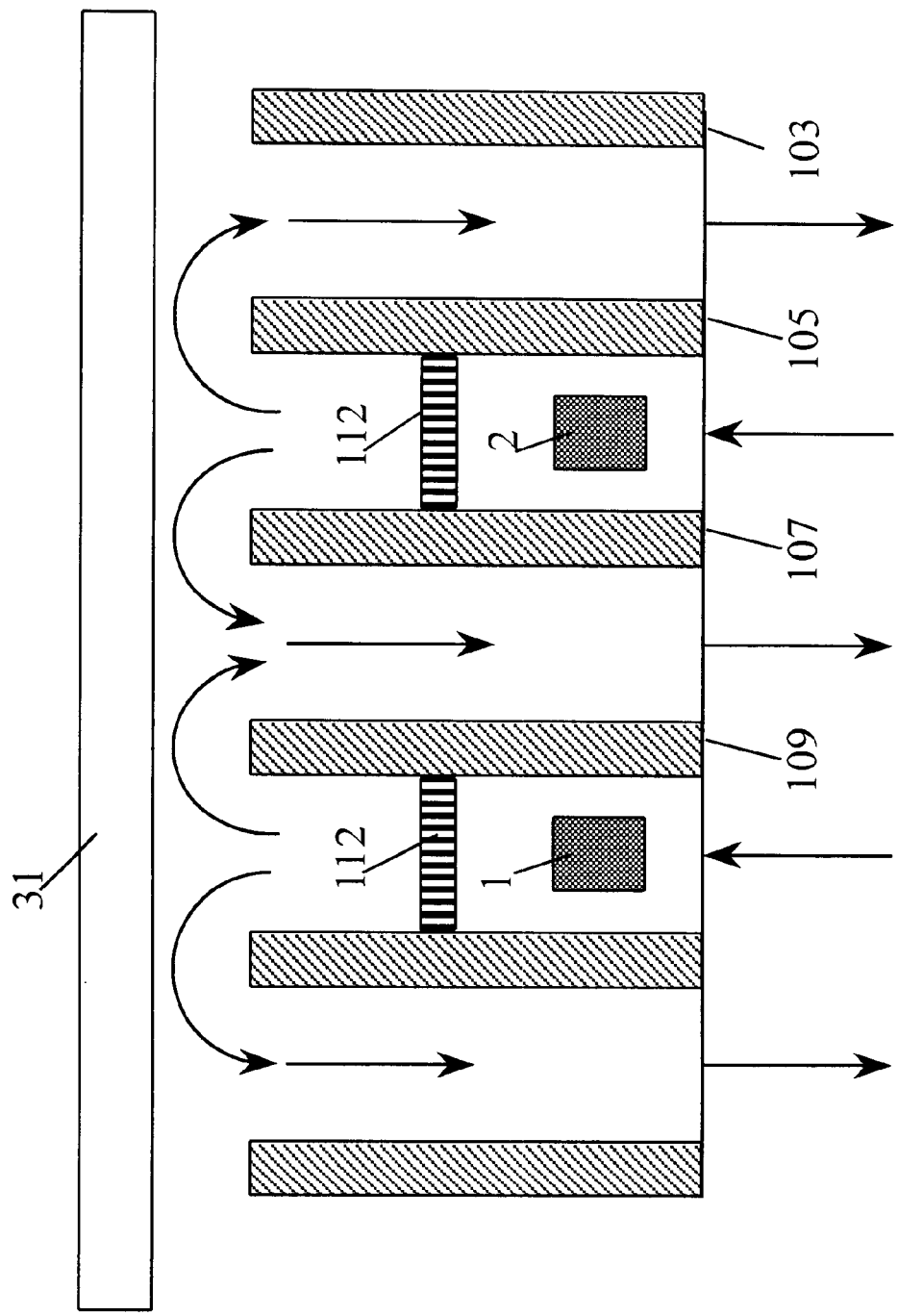
FIG. 15 is a cross section view of a fifth alternative embodiment in accordance with various aspects of the present invention.

With reference now to FIG. 15, another alternative embodiment of the present invention, according to various aspects of the present invention, is shown. The embodiment of FIG. 15 is similar to that of FIGS. 7A and 7B except that a diffuser ring 112 has been added above each cathode. In accordance with one aspect of the present invention, diffuser ring 112 preferably facilitates a more uniform flow of electrolyte 34 along section walls 109, 107, 105 and 103. As such, metal layer 121 (FIG. 1A) can be suitably electropolished more uniformly from wafer 31.

Additionally, diffuser ring 112 can be suitably formed using any convenient method. For example, diffuser ring 112 can be machined to have a number of holes. Alternatively, diffuser ring 112 can include any suitable porous material having porosity preferably in the range of about 10% to about 90%. Additionally, in the present alternative embodiment, diffuser ring 112 is preferably formed from anti-acid, anti-corrosion, particle and contamination free materials.

Figure 16:
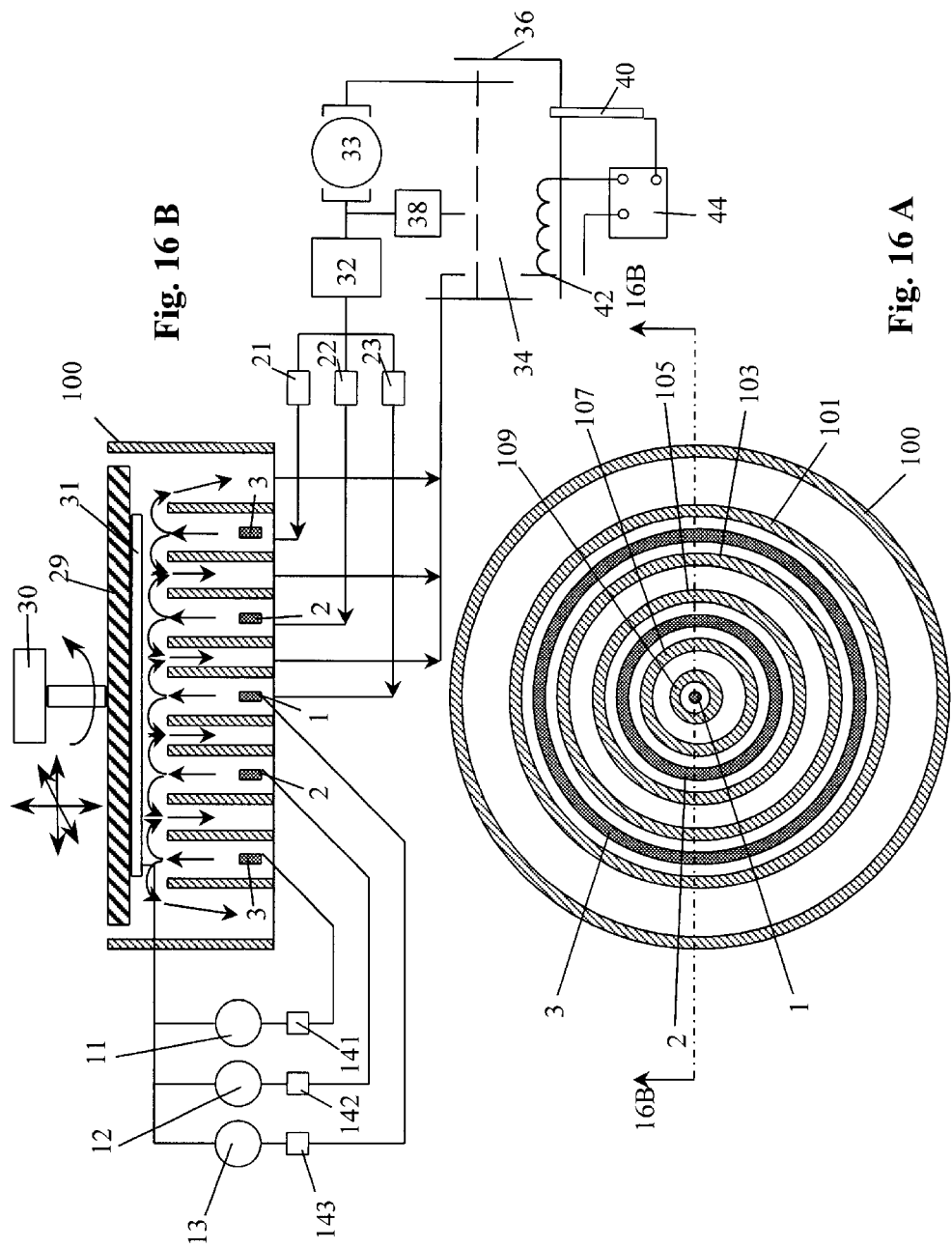
FIG. 16A is a top view of a portion of a sixth alternative embodiment in accordance with various aspects of the present invention.
FIG. 16B is a view, partly in cross section, taken along the line 16B—16B in FIG. 16A, and partly in block diagram form, of the alternative embodiment shown in FIG. 16A.

With reference now to FIGS. 16A and 16B, still another alternative embodiment of the present invention, according to various aspects of the present invention, is shown. The embodiment of FIGS. 16A and 16B is similar to that of FIGS. 7A and 7B except that charge accumulator meters 141, 142 and 143 have been added to power supplies 11, 12 and 13, respectively. In accordance with one aspect of the present invention, charge accumulator meters 141, 142 and 143 preferably measure the charge each power supply 11, 12 and 13 provides during the electropolishing process. The total number of atoms of copper removed can be calculated by dividing the accumulated charge by two. The total number of atoms of copper removed can then be used to determine how much copper remains to be electropolished.

Figure 17:
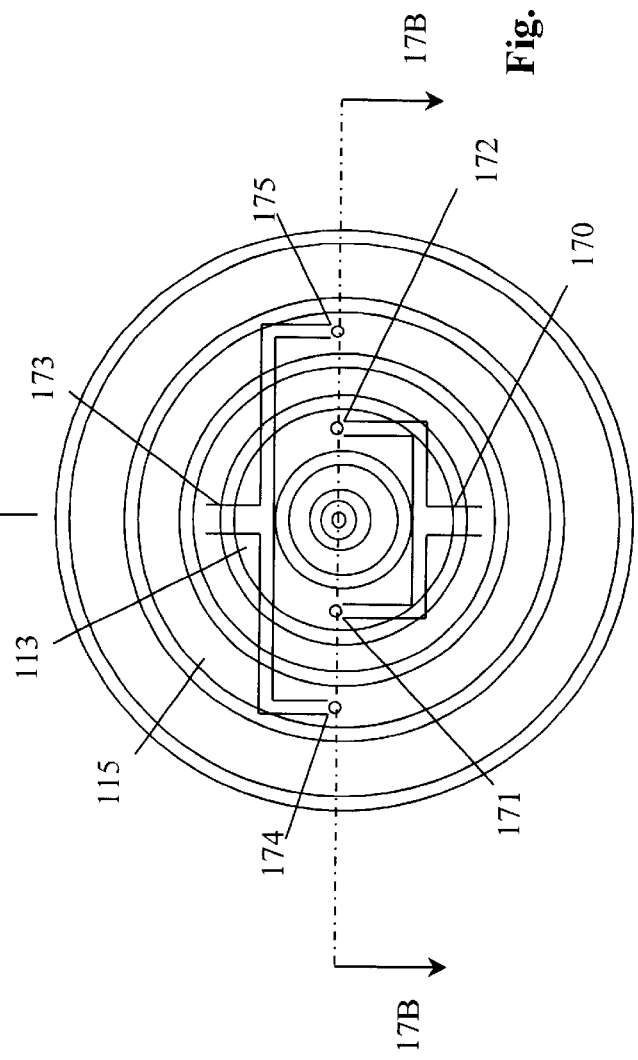
FIG. 17A is a top view of a portion of a seventh alternative embodiment in accordance with various aspects of the present invention.
FIG. 17B is a view, partly in cross section, taken along the line 17B—17B in FIG. 17A, and partly in block diagram form, of the alternative embodiment shown in FIG. 17A.
Figure 17:
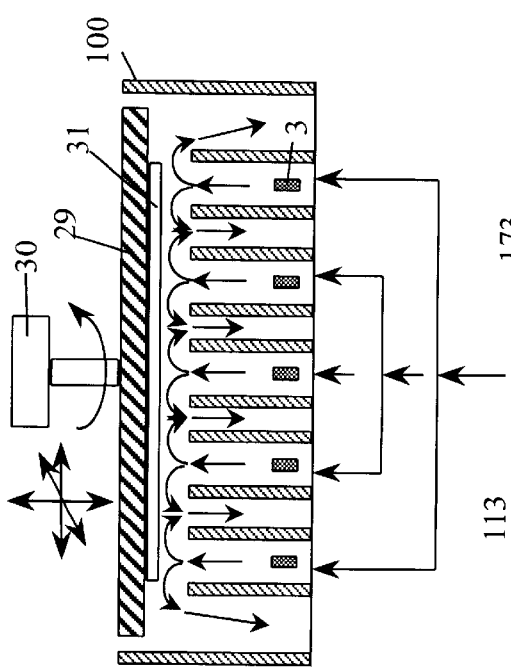

With reference now to FIGS. 17A and 17B, yet another alternative embodiment of the present invention, according to various aspects of the present invention, is shown. The embodiment of FIGS. 17A and 17B is similar to that of FIGS. 7A and 7B except that polishing receptacle 100 suitably includes a plurality of inlets 171, 172, 174 and 175 suitably disposed in sections 113 and 115 for delivery of electrolyte 34. More particularly, in the present alternative embodiment, electrolyte 34 is preferably delivered into section 113 through feed line 170 and inlets 171 and 172. Electrolyte 34 is preferably delivered into section 115 through electrolyte feed line 173 and inlets 174 and 175. By delivering electrolyte 34 into polishing receptacle 100 using a plurality of inlets 171, 172, 174 and 175, a more uniform flow profile can be preferably obtained. Furthermore, it should be recognized that sections 113 and 115 can include any number of additional inlets.

With reference now to FIGS. 18A and 18B, two additional alternative embodiments of the present invention, according to various aspects of the present invention, are shown. The embodiment of FIG. 18A is similar to that of FIGS. 13A and 13B and FIGS. 14A and 14B except that the height of section walls 109, 107, 105 and 103 increases outward along the radial direction. In contrast, in the embodiment of FIG. 18B, the height of section walls 109, 107, 105 and 103 decreases outward along the radial direction. In this manner, the flow pattern of electrolyte 34 can be further controlled to enhance the electropolishing process.

With reference now to FIGS. 19A and 19B, two additional alternative embodiments of the present invention, according to various aspects of the present invention, are shown. The embodiment of FIG. 19A is similar to that of FIGS. 7A and 7B except that the height of section walls 109, 107, 105, 103 and 101 increases outward along the radial direction. In contrast, in the embodiment of FIG. 19B, the height of section walls 109, 107, 105, 103 and 101 decreases outward along the radial direction. In this manner, the flow pattern of electrolyte 34 can be further controlled to enhance the electropolishing process.

With reference now to FIGS. 20A and 20B, yet another alternative embodiment of the present invention, according to various aspects of the present invention, is shown. The embodiment of FIGS. 20A and 20B is similar to that of FIGS. 7A and 7B, except that section walls 109, 107 105, 103 and 101 are configured to move up and down to adjust the flow pattern of electrolyte 34. As shown in FIG. 20B, section walls 105 and 107 move up, such that electrolyte 34 flows toward the portion of wafer 31 above section walls 105 and 107.

Using the present alternative embodiment described above, the following process steps can be suitably employed to selectively electropolish portions of wafer 31:

Step 1: Turn on power supply 13;

Step 2: Turn on LMFC 23 only and move section wall 109 close to wafer 31, such that electrolyte 34 only contacts the portion of wafer 31 above section wall 109. In this manner, metal layer 121 (FIG. 1A) on the portion of wafer 31 above section wall 109 is suitably electropolished;

Step 3: When metal layer 121 (FIG. 1A) reaches a set-value or thickness, turn off power supply 13, turn off LMFC 23, and move section wall 109 to a lower position;

Step 4: Repeat steps 1 to 3 for section walls 105 and 107 using LMFC 22, section walls 105 and 107, and power supply 12; and Step 5: Repeat steps 1 to 3 for section walls 101 and 103 using LMFC 21, section walls 101 and 103, and power supply 11).

In addition to selectively electropolishing portions of wafer 31, using the present alternative embodiment described above, the following process steps can be employed to electropolish the entire surface of wafer 31 at one time:

Step 1: Turn on power supplies 11, 12 and 13. As described earlier, the current of each power supply 11, 12 and 13 can be suitably set proportionate to the surface area of wafer 31 covered by the corresponding cathode.

Step 2: Turn on LMFCs 21, 22 and 23, and move all section walls 101, 103, 105, 107 and 109 adjacent to wafer 31. As also described earlier, the flow rate of electrolyte 34 from LMFCs 21, 22 and 23 can be suitably set proportionate to the surface area of wafer 31 covered by the corresponding cathode; and Step 3: Turn off power supplies 11, 12, and 13 at the same time when metal layer 121 (FIG. 1A) reaches a set value or thickness. Also, power supplies 11, 12 and 13 can be turned off at different times to adjust the thickness uniformity of metal layer 121 (FIG. 1A).

Figure 21:
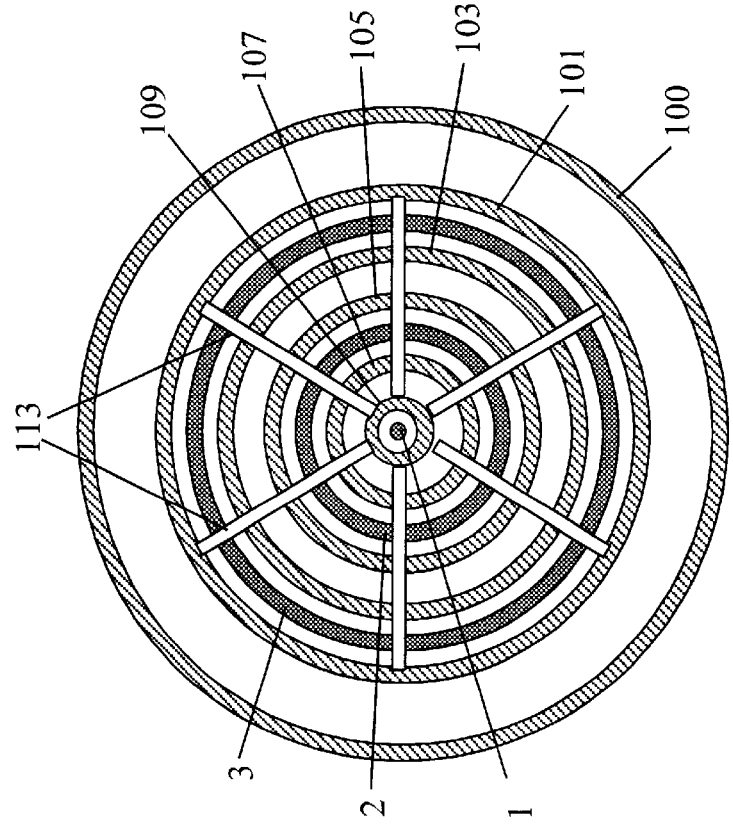
FIG. 21A is a top view of a portion of a thirteenth alternative embodiment in accordance with various aspects of the present invention.
FIG. 21B is a top view of a portion of a fourteenth alternative embodiment in accordance with various aspects of the present invention.
Figure 21B:
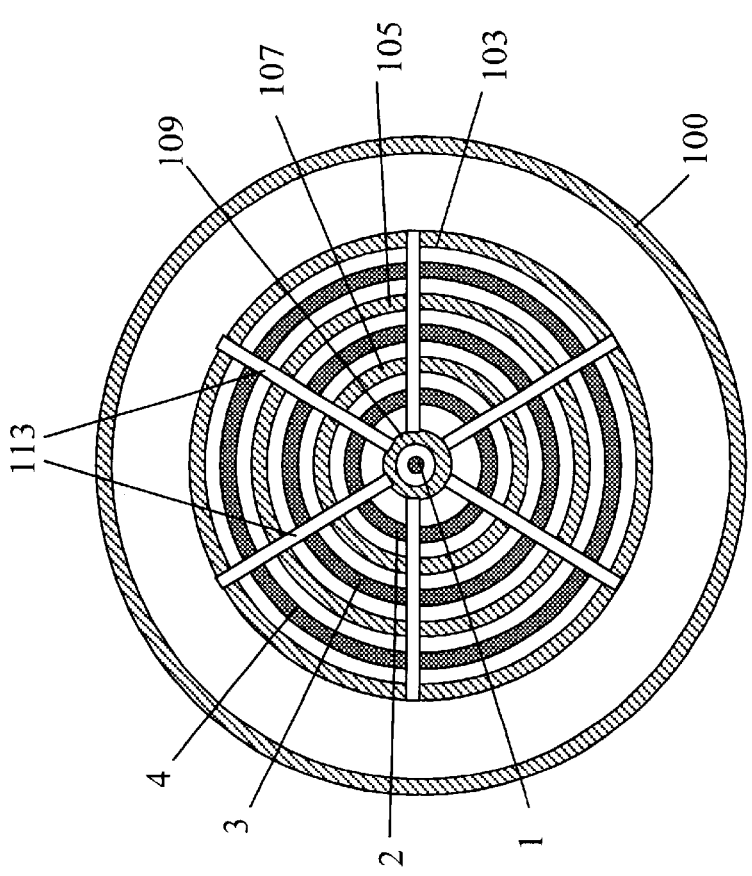

With reference now to FIGS. 21A and 21B, two additional alternative embodiments of the present invention, according to various aspects of the present invention, are shown. The embodiment of FIG. 21A is similar to that of FIGS. 7A and 7B, except that, in the present alternative embodiment, cathodes 1, 2, 3 and 4 and section walls 109, 107, 105 and 103 are divided into six sections. The embodiment of FIG. 21B is similar to FIGS. 13A and 13B, except that, in the present alternative embodiment, cathodes 1, 2 and 3 and section walls 109, 107, 105, 103 and 101 are divided into six sections. It should be recognized, however, that with regard to both embodiments in FIGS. 21A and 21B, any number of sections can be used without deviating from the spirit and/or scope of the present invention.

Additionally, as described in the table below, the cathodes can be connected to one or more power supplies and the sections can be connected to one or more LMFCs in various combinations:

TABLE 2

| Combination No. | Various ways to connect the cathodes to one or more power supplies | Various ways to connect one or more sectors to one or more LMFCs |
|---|---|---|
| 1 | Each cathode is connected to an independent power supply | Each sector is connected to an independent LMFC |
| 2 | Each cathode is connected to an independent power supply | Sectors on the same radius are connected to an independent LMFC |
| 3 | Each cathode is connected to an independent power supply | All sectors are connected to an independent LMFC |
| 4 | Cathodes on the same radius are connected to an independent power supply | Each sector is connected to an independent LMFC |
| 5 | Cathodes on the same radius are connected to an independent power supply | Sectors on the same radius are connected to an independent LMFC |
| 6 | Cathodes on the same radius are connected to an independent power supply | All sectors are connected to an independent LMFC |
| 7 | All cathodes are connected to an independent power supply | Each sector is connected to an independent LMFC |
| 8 | All cathodes are connected to an independent power supply | Sectors on the same radius are connected to an independent LMFC |
| 9 | All cathodes are connected to an independent power supply | All sectors are connected to an independent LMFC |

In the above table, the operation of combination numbers 1, 2, 4 and 5 are the same as described earlier in conjunction with various alternative embodiments. The operation of combination numbers 3, 6, 7, 8 and 9 will be described in greater detail below in conjunction with various other alternative embodiments.

Figure 23:
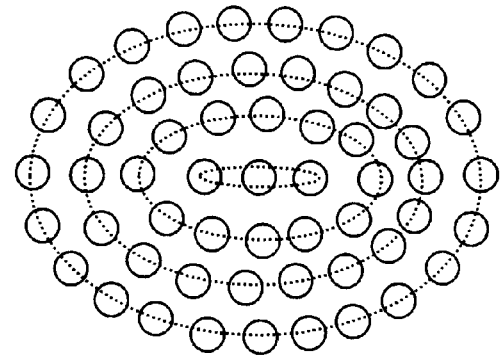
FIG. 23A is a top view of a portion of a sixteenth alternative embodiment in accordance with various aspects of the present invention.
FIG. 23B is a top view of a portion of a seventeenth alternative embodiment in accordance with various aspects of the present invention.
FIG. 23C is a top view of a portion of an eighteenth alternative embodiment in accordance with various aspects of the present invention.
Figure 23:
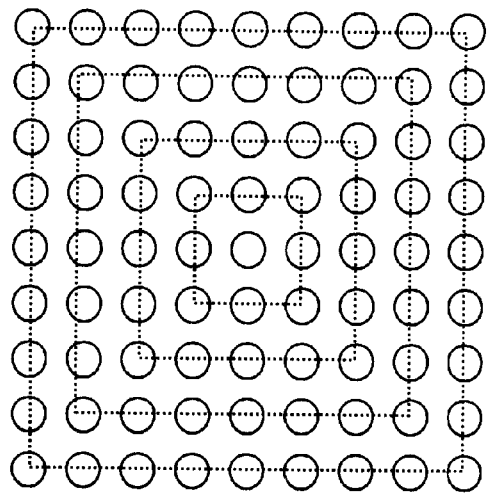
Figure 23:
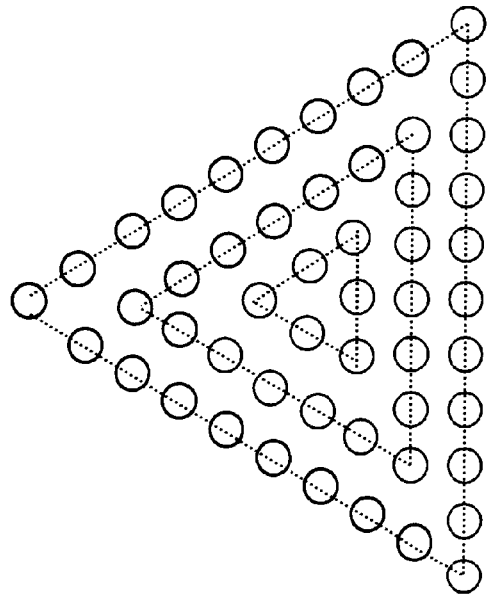

With reference now to FIGS. 22A and 22B, still another alternative embodiment of the present invention, according to various aspects of the present invention, is shown. The embodiment of FIGS. 22A and 22B is similar to that of FIGS. 7A and 7B, except that cathodes 1, 2 and 3 (FIGS. 7A and 7B) and section walls 109, 107, 105, 103 and 101 (FIGS. 7A and 7B) have been replaced by a plurality of rod-type cathodes 501 suitably disposed within a plurality of tubes 503. In the present alternative embodiment, electrolyte 34 (FIG. 7B) is preferably delivered to electropolishing receptacle 100 through plurality of tubes 503, contacts the surface of wafer 31, then drains out of electropolishing receptacle 100 through a plurality of drainage holes 500. As depicted in FIG. 22A, in the present alternative embodiment, cathodes 501, plurality of tubes 503, and plurality of drainage holes 500 are preferably arranged in a circular pattern. However, with reference to FIGS. 23A to 23C, cathodes 501, plurality of tubes 503, and plurality of drainage holes 500 can also be configured in various other patterns, such as a triangle (FIG. 23A), a square (FIG. 23B), an ellipse (FIG. 23C), and the like.

Additionally, as described in the table below, cathodes 501 and plurality of tubes 503 can be connected to power supplies 11, 12 and 13 (FIG. 7B) and LMFCs 21, 22 and 23 (FIG. 7B), respectively, in various combinations:

TABLE 3

| Combination No. | Various ways to connect cathodes 501 to one or more power supplies | Various ways to connect plurality of tubes 503 to one or more LMFCs |
|---|---|---|
| 1 | Each cathode is connected to an independent power supply | Each tube is connected to an independent LMFC |
| 2 | Each cathode is connected to an independent power supply | Tubes on the same radius are connected to an independent LMFC |
| 3 | Each cathode is connected to an independent power supply | All tubes are connected to an independent LMFC |
| 4 | Cathodes on the same radius are connected to an independent power supply | Each tube is connected to an independent LMFC |
| 5 | Cathodes on the same radius are connected to an independent power supply | Tubes on the same radius are connected to an independent LMFC |
| 6 | Cathodes on the same radius are connected to an independent power supply | All tubes are connected to an independent LMFC |
| 7 | All cathodes are connected to an independent power supply | Each tube is connected to an independent LMFC |
| 8 | All cathodes are connected to an independent power supply | Tubes on the same radius are connected to an independent LMFC |
| 9 | All cathodes are connected to an independent power supply | All tubes are connected to an independent LMFC |

In the above table, the operation of combination numbers 1, 2, 4 and 5 are the same as described earlier in conjunction with various alternative embodiments. The operation of combination numbers 3, 6, 7, 8 and 9 will be described in greater detail below in conjunction with various other alternative embodiments.

With reference now to FIGS. 24A and 24B, another alternative embodiment of the present invention, according to various aspects of the present invention, is shown. The embodiment of FIGS. 24A and 24B is similar to that of FIGS. 7A and 7B, except that cathodes 1, 2 and 3 (FIGS. 7A and 7B) and section walls 109, 107, 105, 103 and 101 (FIGS. 7A and 7B) have been replaced with cathode 240, bar 242, and valves 202, 204, 206, 208, 210, 212, 214, 216 and 218. In the present alternative embodiment, the number of power supplies has been reduced to power supply 200. Additionally, valves 202, 204, 206, 208, 210, 212, 214, 216 and 218 are preferably on/off valves used to control the flow of electrolyte 34 onto wafer 31.

Furthermore, valves 202, 204, 206, 208, 210, 212, 214, 216 and 218 are disposed symmetrically on bar 242 to facilitate a more uniform electropolishing process.

Using the present alternative embodiment described above, the following process steps can be suitably employed to selectively electropolish portions of wafer 31:

Step 1: Turn on power supply 200;

Step 2: Turn on pump 33, LMFC 55, and drive mechanism 30. Turn on valves 202 and 218, such that electrolyte 34 only contacts the portion of wafer 31 above valves 202 and 218. In this manner, metal layer 121 (FIG. 1A) on the portion of wafer 31 above valves 202 and 218 is electropolished;

Step 3: When metal layer 121 (FIG. 1A) reaches a set-value or thickness, turn off power supply 200, LMFC 55, and valves 202 and 218;

Step 4: Repeat steps 1 to 3 for valves 204 and 216;

Step 5: Repeat steps 1 to 3 for valves 206 and 214;

Step 6: Repeat steps 1 to 3 for valves 208 and 212; and

Step 7: Repeat steps 1 to 3 for valves 210.

Figure 8:
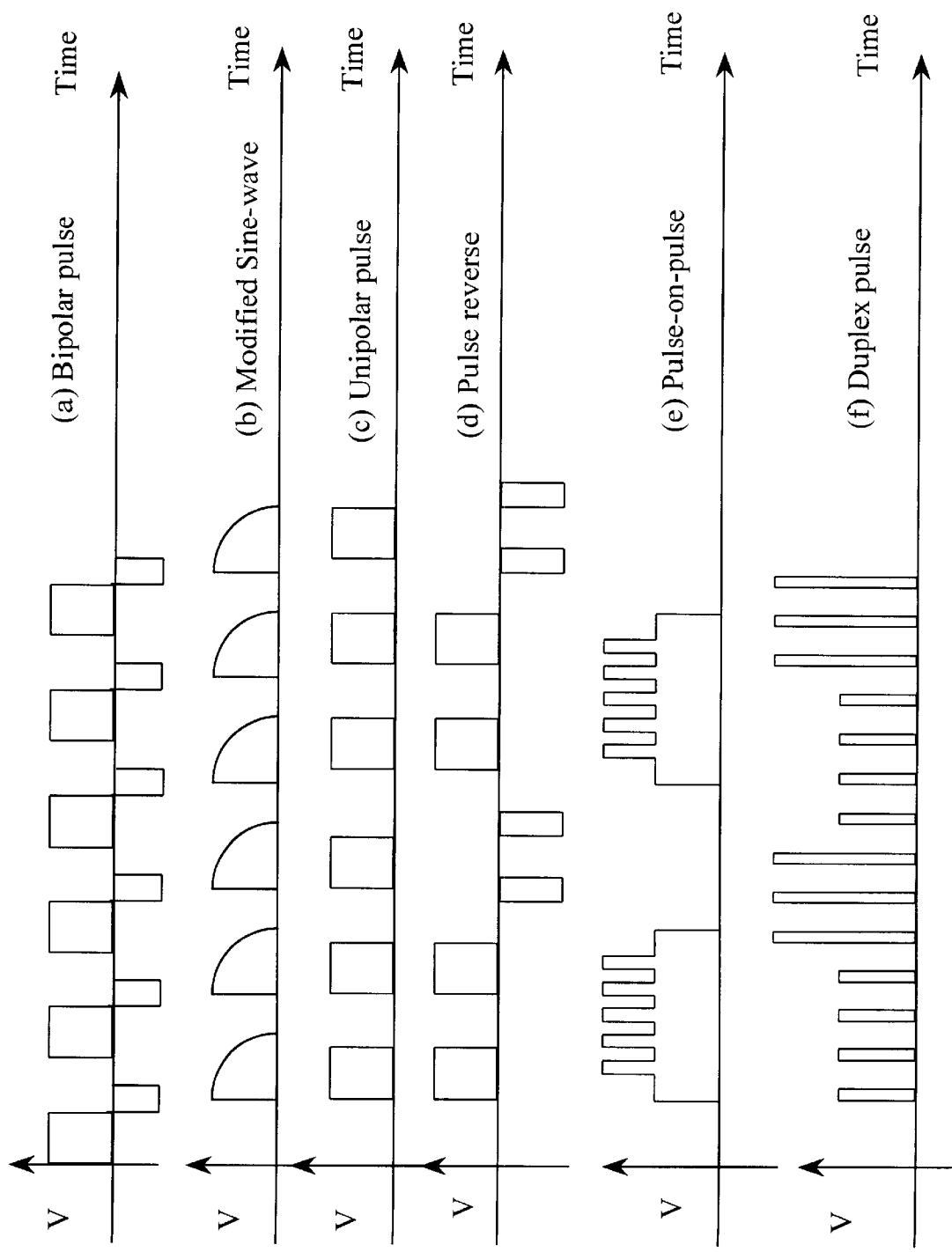
FIG. 8 is a plot of various waveforms, which may be used in conjunction with the electropolishing apparatus shown in FIG. 7A.
Figure 9:
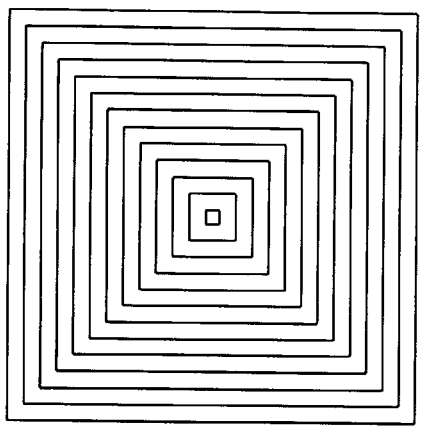
FIGS. 9A–9D are top views of a portion of alternative embodiments of electropolishing apparatus in accordance with various aspects of the present invention.
Figure 9:
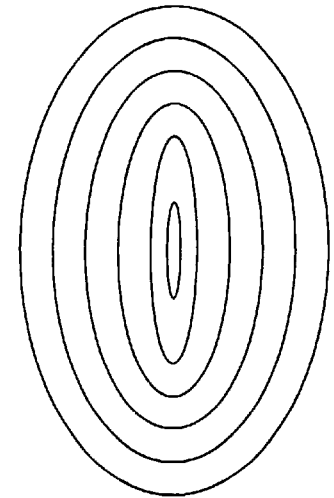
Figure 9:
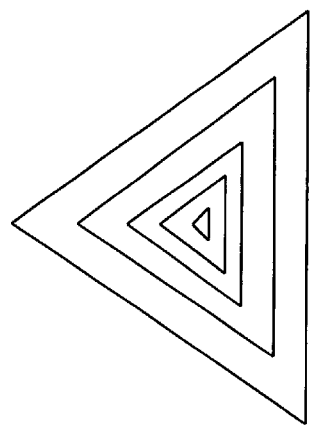
Figure 9:
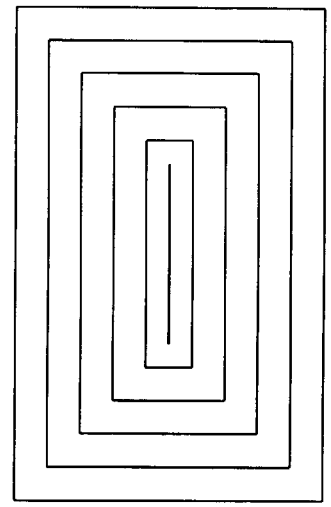

During the above described polishing process, power supply 200 can be operated in DC mode, or in a variety of pulse modes, as shown in FIG. 8. Also, the power supply can be turned on after turning on pump 33 and valves 202 and 216, or 204 and 214, or 206 and 212, or 210.

In addition to selectively electropolishing portions of wafer 31, using the present alternative embodiment described above, the following process steps can be employed to electropolish the entire surface of wafer 31 at one time:

Step 1: Turn on power supply 200;

Step 2: Turn on LMFC 55 and all valves 202, 204, 206, 208, 210, 212, 214, 216 and 218, such that electrolyte 34 contacts substantially the entire surface area of wafer 31; and Step 3: Turn off power supply 200 and all valves when the film thickness reaches a set value. Also, valves 202, 204, 206, 208, 210, 212, 214, 216 and 218 can be turned off at different times to adjust the thickness uniformity of metal layer 121 (FIG. 1A) on wafer 31.

Figure 25:
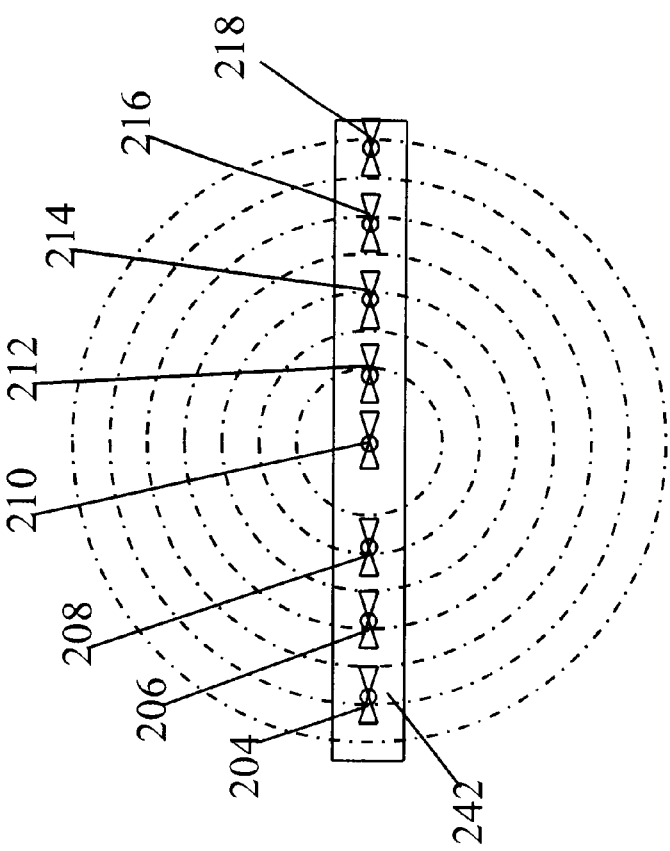
FIG. 25 is a top view of a portion of a twentieth alternative embodiment in accordance with various aspects of the present invention.

With reference now to FIG. 25, still another alternative embodiment of the present invention, according to various aspects of the present invention, is shown. The embodiment of FIG. 25 is similar to that of FIGS. 24A and 24B, except that all valves are disposed on bar 242 at different radii on bar 242 to facilitate a more uniform electropolish.

Using the present alternative embodiment described above, the following process steps can be suitably employed to selectively electropolish portions of wafer 31:

Step 1: Turn on power supply 200 (FIG. 24B);

Step 2: Turn on pump 33 (FIG. 24B), LMFC 55 (FIG. 24B), and drive mechanism 30 (FIG. 24B). Turn on valve 218, such that electrolyte 34 only contacts the portion of wafer 31 above valve 218. In this manner, metal layer 121 (FIG. 1A) on the portion of wafer 31 above valve 218 is electropolished;

Step 3: When metal layer 121 (FIG. 1A) reaches a set-value or thickness, turn off power supply 200 (FIG. 24B), LMFC 55 (FIG. 24B), and valves 218;

Step 4: Repeat steps 1 to 3 for valve 204;

Step 5: Repeat steps 1 to 3 for valve 216;

Step 6: Repeat steps 1 to 3 for valve 206; and

Step 7: Repeat steps 1 to 3 for valves 214, 208, 212, and 210, respectively.

During the above described polishing process, power supply 200 (FIG. 24B) can be operated in DC mode, or in a variety of pulse modes, as shown in FIG. 8. Additionally, the electroplating sequence can be started from the center of wafer 31 to the edge of wafer 31 without deviating from the spirit and/or scope of the present invention.

In addition to selectively electropolishing portions of wafer 31, using the present alternative embodiment described above, the following process steps can be employed to electropolish the entire surface of wafer 31 at one time:

Step 1: Turn on power supply 200 (FIG. 24B);

Step 2: Turn on LMFC 55 (FIG. 24B) and all valves 202, 204, 206, 208, 210, 212, 214, 216 and 218, such that electrolyte 34 contacts substantially the entire surface area of wafer 31; and Step 3: Turn off power supplies 200 (FIG. 24B) and all valves when the film thickness reaches a set value. Also, valves 202, 204, 206, 208, 210, 212, 214, 216 and 218 can be turned off at different times to adjust the thickness uniformity of metal layer 121 (FIG. 1A) on wafer 31 (FIG. 24B).

Figure 26:
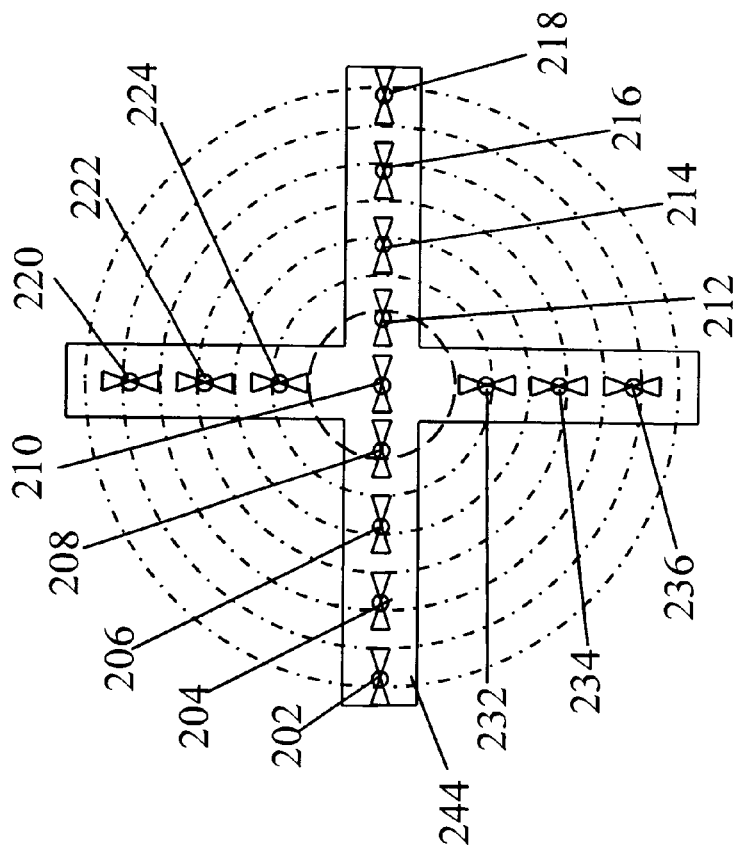
FIG. 26 is a top view of a portion of a twenty-first alternative embodiment in accordance with various aspects of the present invention.

With reference now to FIG. 26, yet another alternative embodiment of the present invention, according to various aspects of the present invention, is shown. The embodiment of FIG. 26 is similar to that of FIG. 25 except that an additional bar has been added to form a cross-shaped bar 244. Valves 202 and 218, 204 and 216, 206 and 214, 208 and 212 are placed symmetrically on the horizontal portion of bar 244 (as depicted in FIG. 26). Similarly, valves 220 and 236, 222 and 234, 224 and 232 are placed symmetrically on vertical portion of bar 244 (as depicted in FIG. 26). Additionally, as depicted in FIG. 26, the valves on horizontal portion of bar 244 are disposed at different radii than the valves on the vertical portion of bar 244.

Using the present alternative embodiment described above, the following process steps can be suitably employed to selectively electropolish portions of wafer 31:

Step 1: Turn on power supply 200 (FIG. 24B);

Step 2: Turn on pump 33 (FIG. 24B), LMFC 55 (FIG. 24B), and drive mechanism 30 (FIG. 24B). Turn on valves 218 and 202, such that electrolyte 34 only contacts the portion of wafer 31 above valves 218 and 202. In this manner, metal layer 121 (FIG. 1A) on the portion of wafer 31 above valves 218 and 202 is electropolished.

Step 3: When metal layer 121 (FIG. 1A) reaches a set-value or thickness, turn off power supply 200 (FIG. 24B), LMFC 55 (FIG. 24B), valves 218 and 202;

Step 4: Repeat steps 1 to 3 for valves 220 and 236;

Step 5: Repeat steps 1 to 3 for valves 204 and 216;

Step 6: Repeat steps 1 to 3 for valves 222 and 234; and

Step 7: Repeat steps 1 to 3 for valves 206 and 214, 224 and 232, 208 and 212, and 210 only, respectively.

During the above described polishing process, power supply 200 (FIG. 24B) can be operated in DC mode, or in a variety of pulse modes, as shown in FIG. 8.

In addition to selectively electropolishing portions of wafer 31, using the present alternative embodiment described above, the following process steps can be employed to electropolish the entire surface of wafer 31 at one time:

Step 1: Turn on power supply 200 (FIG. 24B);

Step 2: Turn on pump 33 (FIG. 24B), LMFC 55 (FIG. 24B), and all valves 202, 204, 206, 208, 210, 212, 214, 216, 218, 220, 222, 224, 232, 234 and 236, such that electrolyte 34 only contacts substantially the entire surface area of wafer 31; and Step 3: Turn off power supply 200 (FIG. 24B) and all valves when the thickness of metal layer 121 (FIG. 1A) reaches a set value. All valves 202, 204, 206, 208, 210,

212, 214, 216, 218, 220, 222, 224, 232, 234 and 236 can be turned off at different times to adjust the thickness uniformity of metal layer 121 (FIG. 1A) on wafer 31 (FIG. 24B).

Figure 27C:
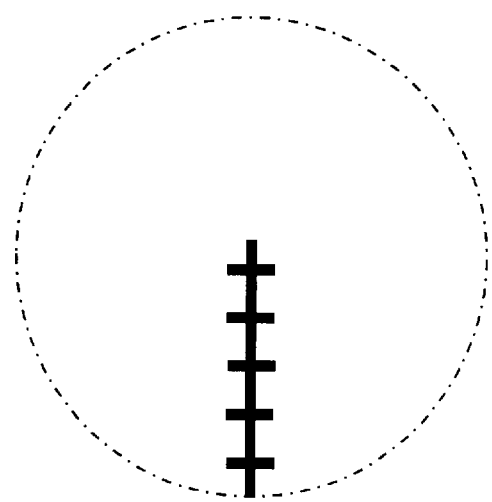
FIG. 27C is a top view of a portion of a twenty-fourth alternative embodiment in accordance with various aspects of the present invention.
Figure 27B:
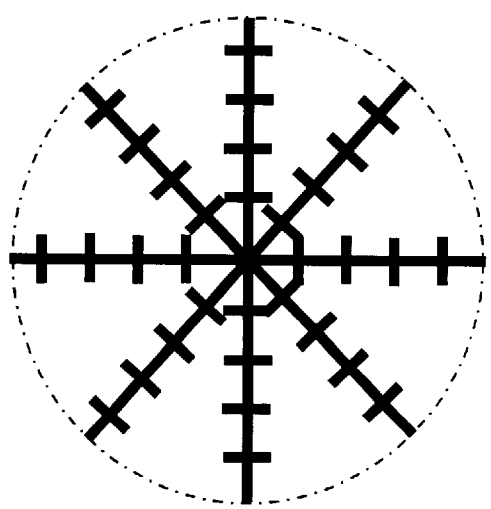
FIG. 27B is a top view of a portion of a twenty-third alternative embodiment in accordance with various aspects of the present invention.
Figure 27A:
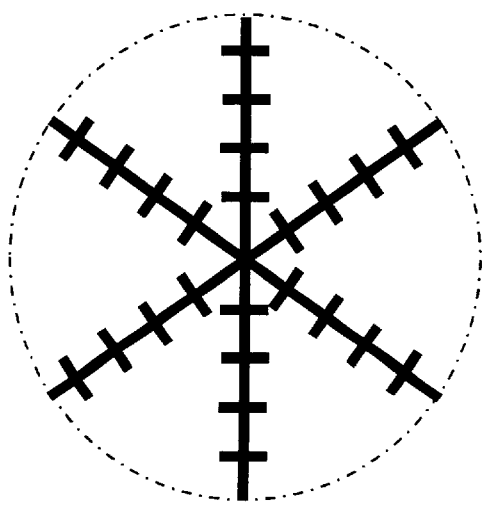
FIG. 27A is a top view of a portion of a twenty-second alternative embodiment in accordance with various aspects of the present invention.

With reference now to FIGS. 27A, 27B, and 27C, three additional alternative embodiments of the present invention, according to various aspects of the present invention, are shown. The embodiment of FIG. 27A is similar to that of FIGS. 24A and 24B except that, in the present alternative embodiment, three bars are used. The angle between two adjacent bars is preferably about 60°. The embodiment of FIG. 27B is similar to those of FIGS. 24A and 24B except that four bars are used. The angle between two adjacent bars is preferably about 45°. The embodiment of FIG. 27C is similar to those of FIGS. 24A and 24B except that half of a bar is used. It should be recognized, however, that any number of bars can be used without deviating from the spirit and/or scope of the present invention. Additionally, the adjacent bars can be set at various angles again without deviating from the spirit and/or scope of the present invention.

In the alternative embodiments described thus far, the electropolishing sequence can be started from valves close to the periphery of wafer 31, or started from the center of wafer 31, or started randomly. Starting from the center of wafer 31 is preferred since the non-polished metal layer 121 (FIG. 1A) (with larger diameter) can be used to conduct current for polishing the next portion of metal layer 121 (FIG. 1A) (with smaller diameter).

Figure 28:
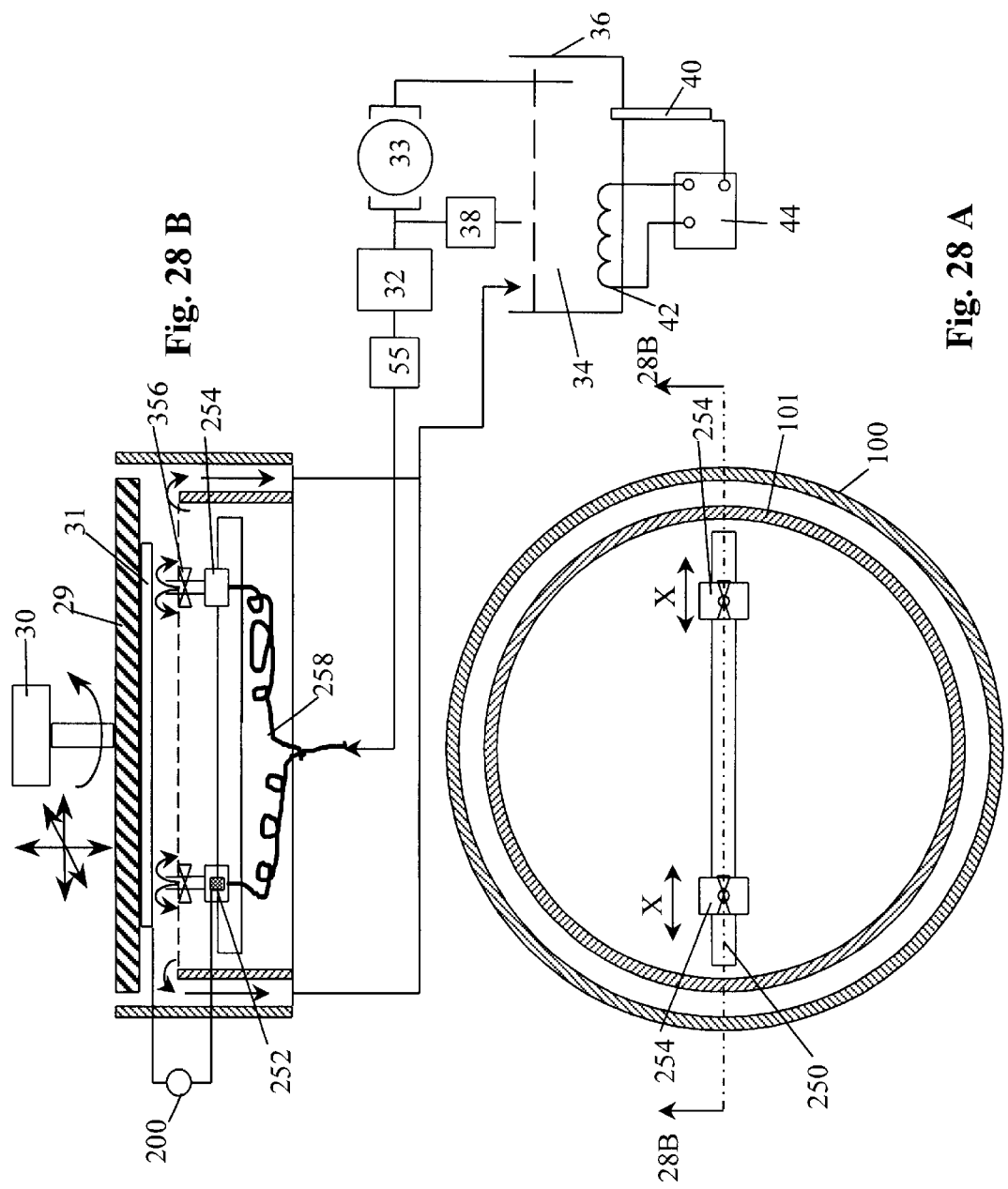
FIG. 28A is a top view of a portion of a twenty-fifth alternative embodiment in accordance with various aspects of the present invention.
FIG. 28B is a view, partly in cross section, taken along the line 28B—28B in FIG. 28A, and partly in block diagram form, of the alternative embodiment shown in FIG. 28A.

With reference now to FIGS. 28A and 28B, still another alternative embodiment of the present invention, according to various aspects of the present invention, is shown. The embodiment of FIGS. 28A and 28B is similar to that of FIGS. 24A and 24B except that position fixed valves (jet) 202, 204, 206, 208, 210, 212, 214, 216 and 218 are replaced by two movable cathode jet means 254. Cathode jet means 254 are placed under wafer 31 and sit on guide bar 250. Cathode jet means 254 apply electrolyte to specific portions of wafer 31, and itself can move along the X direction as shown in FIGS. 28A and 28B. Additionally, in the present exemplary embodiment, fresh electrolyte is supplied through flexible pipe 258.

Using the present alternative embodiment described above, the following process steps can be suitably employed to selectively electropolish portions of wafer 31:

Step 1: Turn on power supply 200;
Step 2: Turn on pump 33, LMFC 55, driving mechanism 30 and valves 356, such that electrolyte 34 only contacts the portions of wafer 31 above valves 356. In this manner, metal layer 121 (FIG. 1A) on the portions of wafer 31 above valves 356 is electropolished;
Step 3: When metal layer 121 (FIG. 1A) reaches a set-value or thickness, turn off power supply 200, LMFC 55, and valves 356;
Step 4: Move cathode jet 254 to the next position; and
Step 5: Repeat steps 1 to 4 until metal layer 121 (FIG. 1A) has been electropolished from wafer 31.

Figure 29:
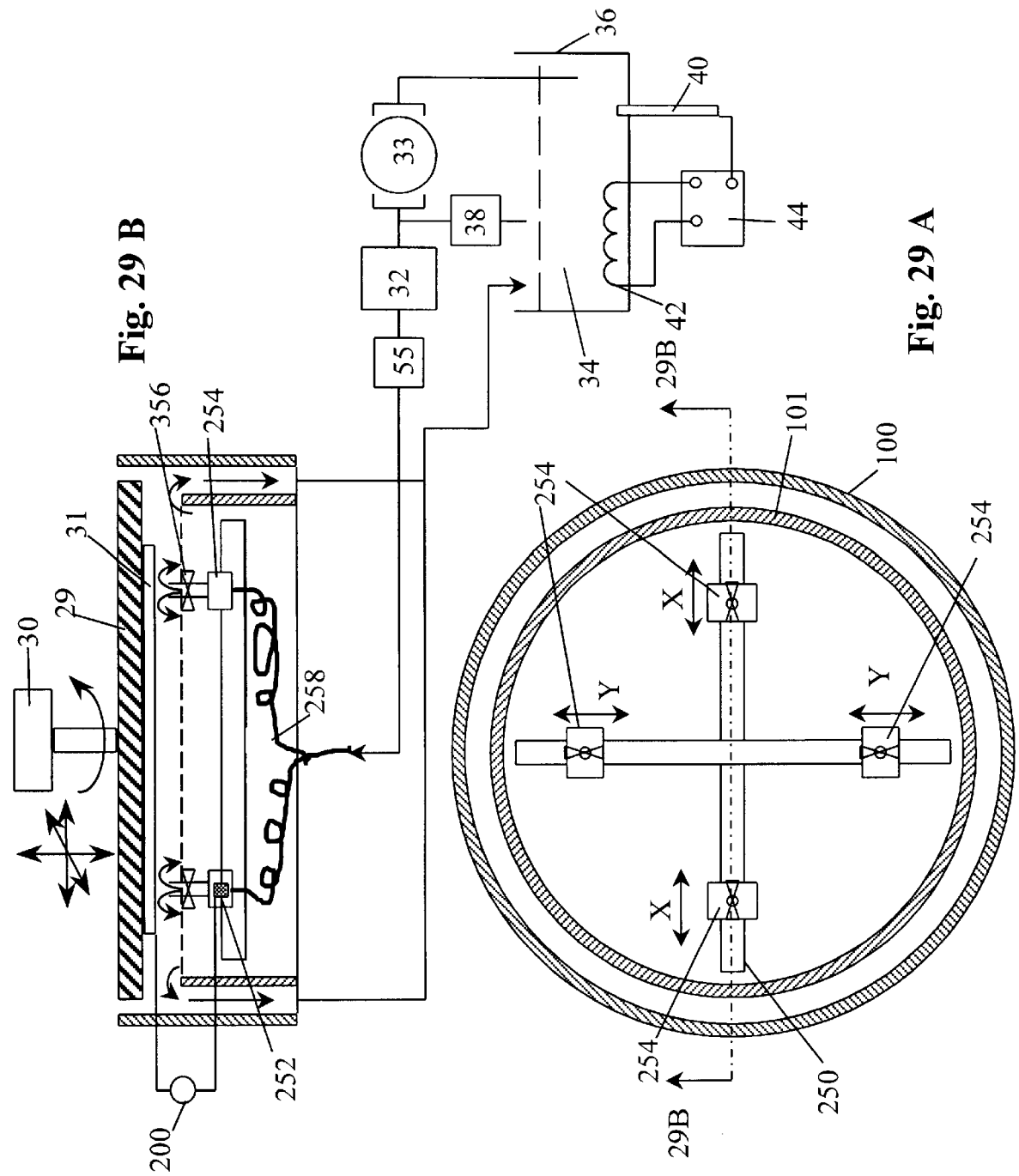
FIG. 29A is a top view of a portion of a twenty-sixth alternative embodiment in accordance with various aspects of the present invention.
FIG. 29B is a view, partly in cross section, taken along the line 29B—29B in FIG. 29A, and partly in block diagram form, of the alternative embodiment shown in FIG. 29A.

With reference now to FIGS. 29A and 29B, yet another alternative embodiment of the present invention, according to various aspects of the present invention, is shown. The embodiment of FIGS. 29A and 29B is similar to that of FIGS. 28A and 28B except that two additional moveable cathode jets are added in the Y direction in order to increase polishing speed. However, the process sequence is similar to that of FIGS. 28A and 28B.

Figure 30:
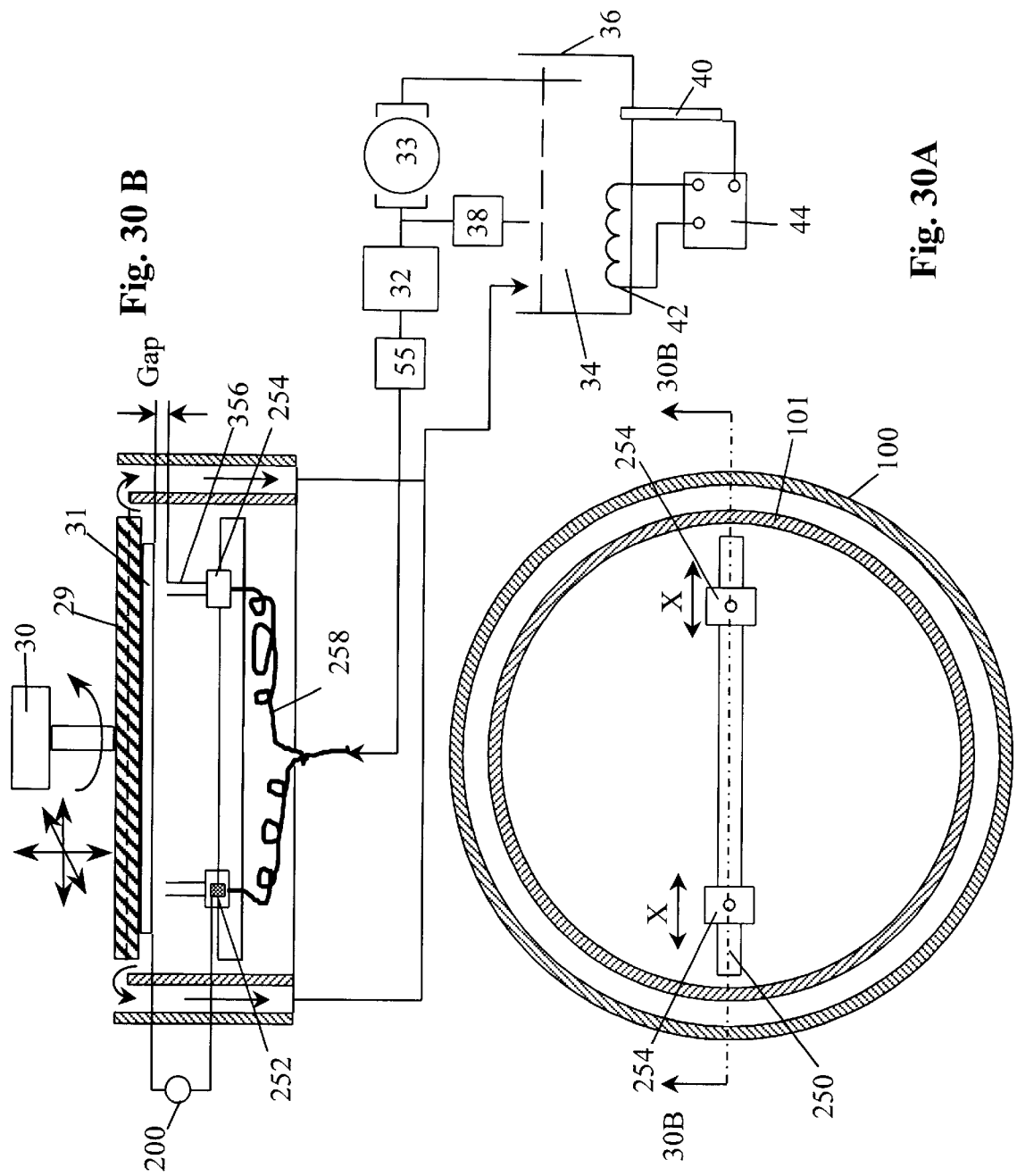
FIG. 30A is a top view of a portion of a twenty-seventh alternative embodiment in accordance with various aspects of the present invention.
FIG. 30B is a view, partly in cross section, taken along the line 30B—30B in FIG. 30A, and partly in block diagram form, of the alternative embodiment shown in FIG. 30A.

With reference now to FIGS. 30A and 30B, another alternative embodiment of the present invention, according to various aspects of the present invention, is shown. The embodiment of FIGS. 30A and 30B is similar to that of FIGS. 28A and 28B except that wafer 31 is immersed into electrolyte 34. Moveable cathodes 254 are placed very close to wafer 31 in order to focus polishing current on a specific portion of wafer 31. In the present alternative embodiment, the gap between moveable cathodes 254 and wafer 31 is in the range of about 0.1 millimeters to about 5 millimeters, and preferably about 1 millimeter. Again, the process sequence is similar to that of FIGS. 28A and 28B.

Figure 31:
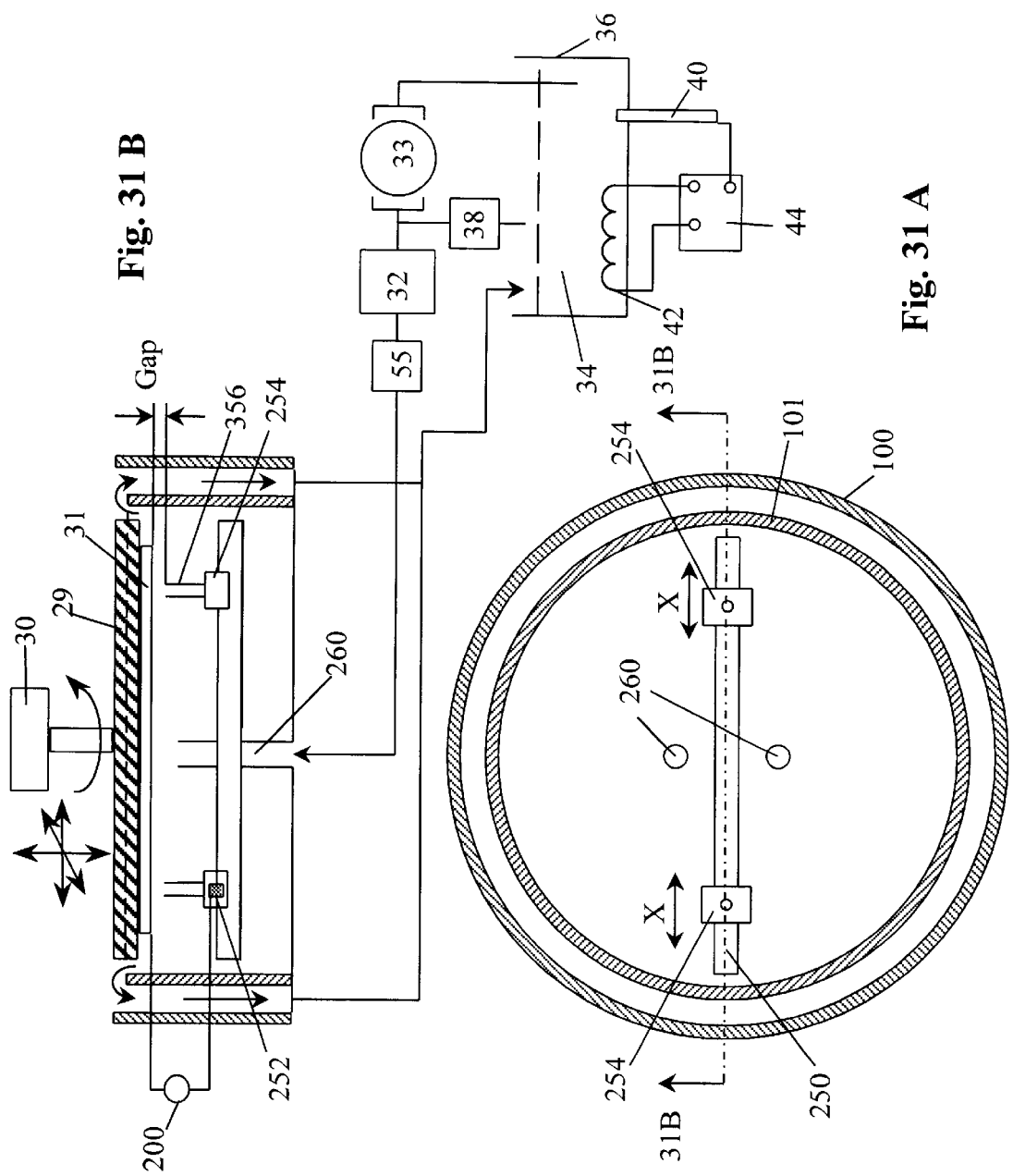
FIG. 31A is a top view of a portion of a twenty-eighth alternative embodiment in accordance with various aspects of the present invention.
FIG. 31B is a view, partly in cross section, taken along the line 31B—13B in FIG. 31A, and partly in block diagram form, of the alternative embodiment shown in FIG. 31A.

With reference now to FIGS. 31A and 31B, still another alternative embodiment of the present invention, according to various aspects of the present invention, is shown. The embodiment of FIGS. 31A and 31B is similar to that of FIGS. 30A and 30B except that fresh electrolyte 34 is input from the center of the receptacle through pipe 260 instead of cathode jet means 254 through flexible pipe 258. Wafer 31 is also immersed into electrolyte 34. Similarly, moveable cathodes 254 are placed very close to wafer 31 in order to focus polishing current on a specific portion of wafer 31. In the present alternative embodiment, the gap between moveable cathodes 254 and wafer 31 is in the range of about 0.1 millimeters to about 5 millimeters, and preferably about 1 millimeter. Again the process sequence is similar to that of FIGS. 28A and 28B.

Figure 32:
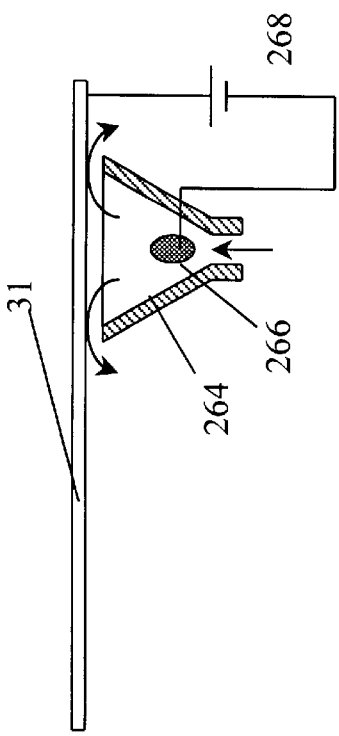
FIG. 32A is a cross section view of a portion of a twenty-ninth alternative embodiment in accordance with various aspects of the present invention.
FIG. 32B is a cross section view of a portion of a thirtieth alternative embodiment in accordance with various aspects of the present invention.
FIG. 32C is a cross section view of a portion of a thirty-first alternative embodiment in accordance with various aspects of the present invention.
FIG. 32D is a cross section view of a portion of a thirty-second alternative embodiment in accordance with various aspects of the present invention.
Figure 32:
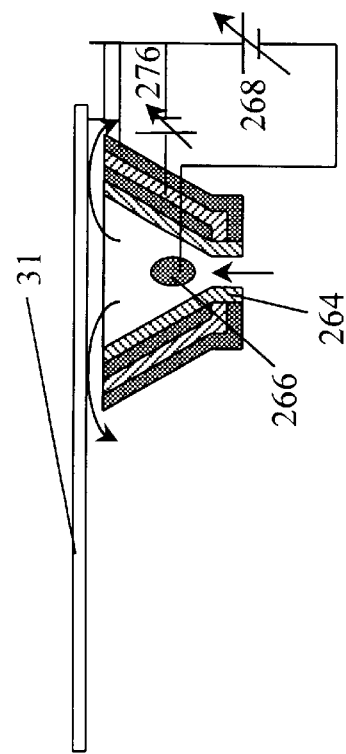
Figure 32:
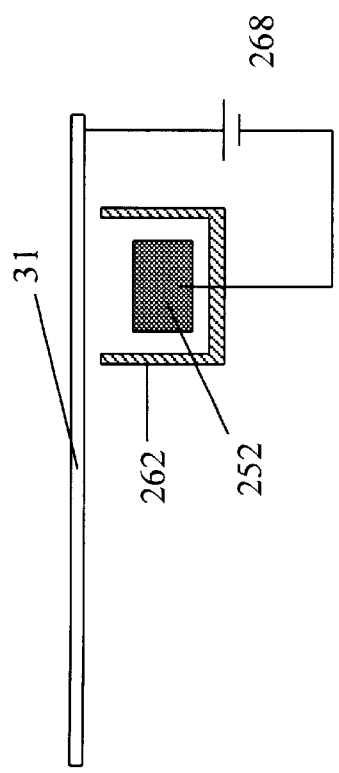
Figure 32:
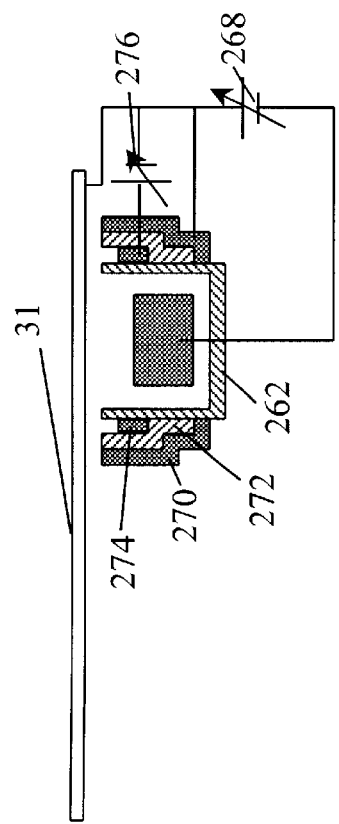

With reference now to FIGS. 32A, 32B, 32C and 32D, four additional alternative embodiments of the present invention, according to various aspects of the present invention, are shown. FIG. 32A shows a cathode means consisting of cathode 252 and case 262. Case 262 is made of insulator materials such as Teflon, CPVC, PVDF, or Polypropylene. FIG. 32B shows a cathode means consisting of cathode 266 and case 264. Electrolyte 34 is fed through a hole at the bottom of case 264. FIG. 32C shows a cathode means consisting of cathode 252, electrodes 274 and 270, insulator spacer 272, case 262, and power supplies 276 and 268. Electrode 274 is connected to the negative output of power supply 276, and electrode 270 is connected to cathode wafer 31. The function of electrode 274 is to trap any metal ions flowing out of case 262, therefore reducing film buildup in the area outside of case 262. The function of electrode 270 is to prevent electrical field leakage from electrode 274 to minimize any etch effect. The embodiment of FIG. 32D is similar to that of FIG. 32C except that case 264 has a hole at the bottom for electrolyte 34.

Figure 34:
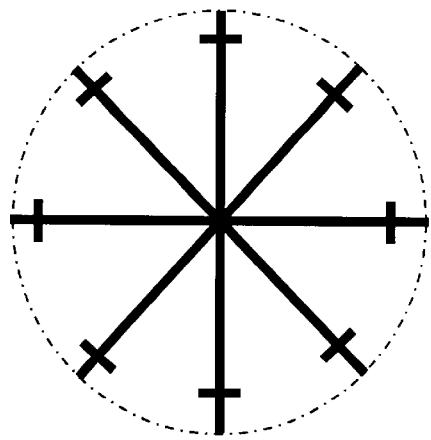
FIG. 34A is a top view of a portion of a thirty-third alternative embodiment in accordance with various aspects of the present invention.
FIG. 34B is a top view of a portion of a thirty-fourth alternative embodiment in accordance with various aspects of the present invention.
FIG. 34C is a top view of a portion of a thirty-fifth alternative embodiment in accordance with various aspects of the present invention.
FIG. 34D is a top view of a portion of a thirty-sixth alternative embodiment in accordance with various aspects of the present invention.
Figure 34:
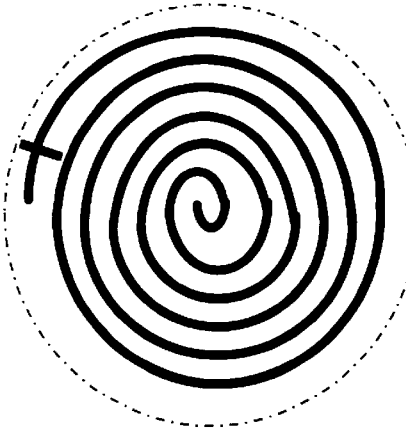
Figure 34:
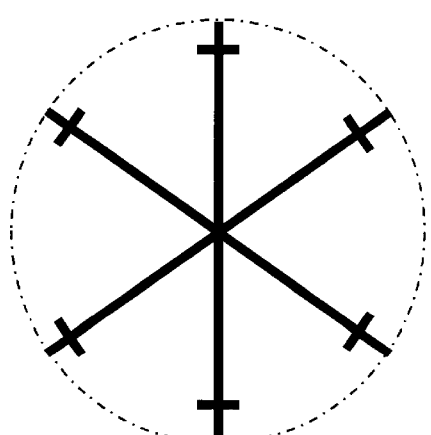
Figure 34:
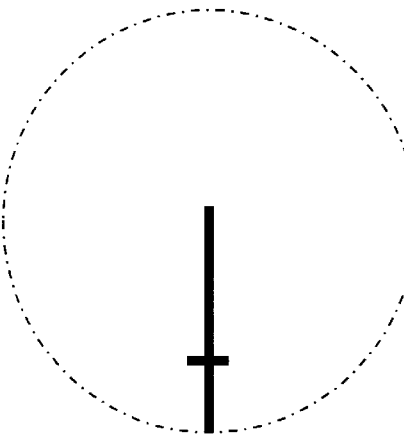

With reference now to FIGS. 34A, 34B, 34C and 34D, four additional alternative embodiments of the present invention, according to various aspects of the present invention, are shown. The embodiment of FIG. 34 A is similar to those of FIGS. 28A and 28B except that three bars are used. The angle between two adjacent bars is about 60°. The embodiment of FIG. 34B is similar to those of FIGS. 28A and 28B except that four bars are used. The angle between two adjacent bars is about 45°. The embodiment of FIG. 34C is similar to those of FIGS. 28A and 28B except that half of a bar is used. Again, it should be recognized that any number of bars can be employed without deviating from the spirit and/or scope of the present invention. The embodiment of FIG. 34D is similar to those of FIGS. 28A and 28B except that the straight bar is replaced by a spiral bar.

Figure 35:
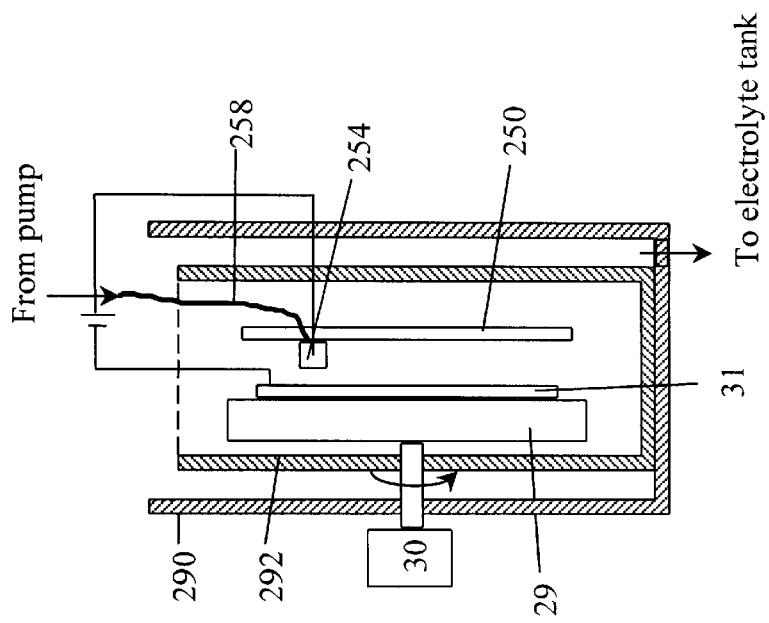
FIG. 35A is a cross section view of a portion of a thirty-seventh alternative embodiment in accordance with various aspects of the present invention.
FIG. 35B is a cross section view of a portion of a thirty-eighth alternative embodiment in accordance with various aspects of the present invention.
Figure 35:
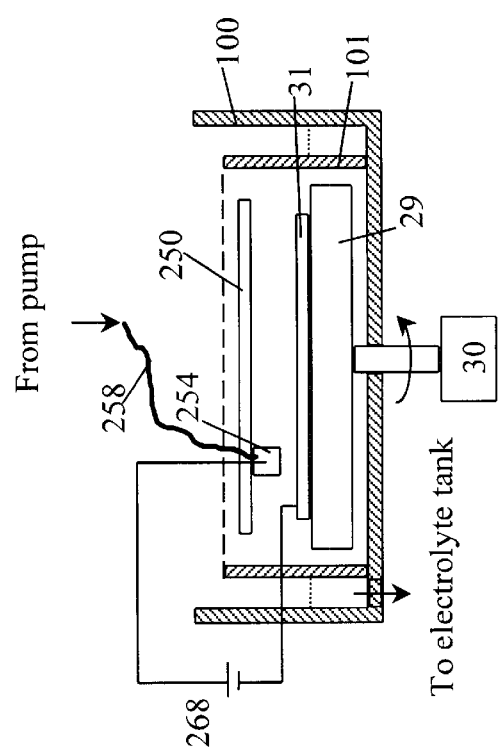

With reference now to FIG. 35, two additional alternative embodiments of the present invention, according to various aspects of the present invention, are shown. The embodiments of FIGS. 35A and 35B are similar to those of FIGS. 28A and 28B except wafer 31 is positioned upside down and vertically, respectively.

Figure 36:
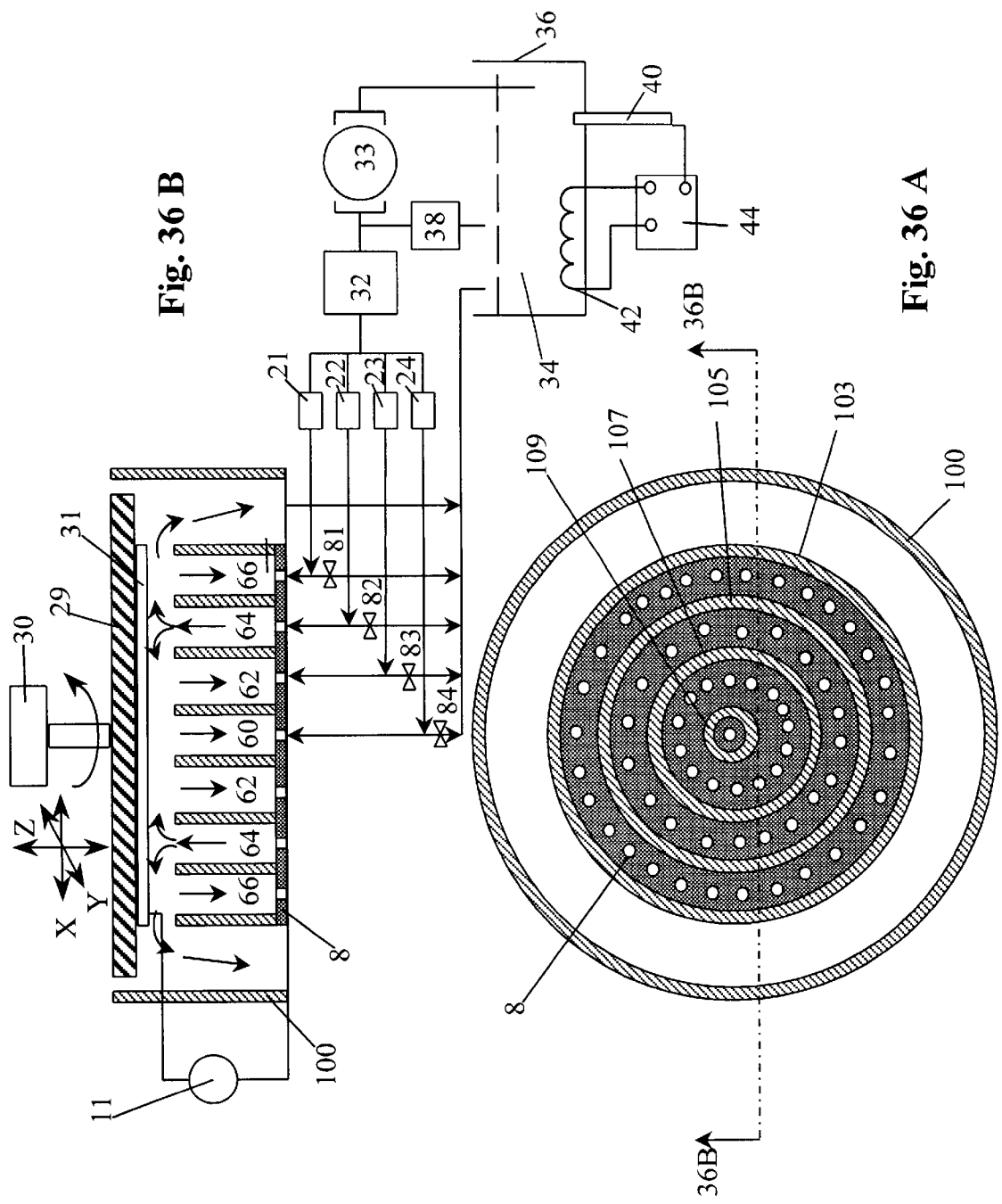
FIG. 36A is a top view of a portion of a thirty-ninth alternative embodiment in accordance with various aspects of the present invention.
FIG. 36B is a view, partly in cross section, taken along the line 36B—36B in FIG. 36A, and partly in block diagram form, of the alternative embodiment shown in FIG. 36A.

With reference now to FIGS. 36A and 36B, another alternative embodiment of the present invention, according to various aspects of the present invention, is shown. The embodiment of FIGS. 36A and 36B is similar to that of FIGS. 14A and 14B except that all cathodes are replaced by a one-piece cathode 8. In the present alternative embodiment, cathode 8 is connected to single power supply 11. Furthermore, the present alternative embodiment includes sub-polishing receptacles 60, 62, 64, and 66.

Using the present alternative embodiment described above, the following process steps can be suitably employed to selectively electropolish portions of wafer 31:

Step 1: Turn on power supply 11;

Step 2: Turn on LMFC 21 and valves 82, 83, and 84, turn off LMFCs 22, 23, 24 and valve 81, such that electrolyte 34 only contacts the portion of wafer 31 above sub-polishing receptacle 66, and then flows back to electrolyte reservoir 36 through the spaces between section walls 100 and 103, 103 and 105, 105 and 107, 107 and 109. In this manner, metal layer 121 (FIG. 1A) is electropolished from the portion of wafer 31 above sub-polishing receptacle 66;

Step 3: When metal layer 121 (FIG. 1A) reaches a set-value or thickness, turn off power supply 11 and turn off LMFC 21;

Step 4: Repeat steps 1 to 3 for LMFC 22 (turn on LMFC 22, valves 81, 83, 84, and power supply 11, and turn off LMFCs 21, 23, and 24, and valve 82);

Step 5: Repeat steps 1 to 3 for LMFC 23 (turn on LMFC 23, valves 81, 82, 84, and power supply 11, and turn off LMFCs 21, 22, and 24, and valve 83); and Step 6: Repeat steps 1 to 3 for LMFC 24 (turn on LMFC 24, valves 81, 82, 83, and power supply 11, and turn off LMFCs 21, 22, and 23, and valve 84).

In the above described polishing process, instead of polishing from the periphery of wafer 31 to the center of wafer 31, the polishing also can be performed from center to periphery, or can be performed randomly choosing various cathode sequences.

In addition to selectively electropolishing portions of wafer 31, using the present alternative embodiment described above, the following process steps can be employed to electropolish the entire surface of wafer 31 at one time:

Step 1: Turn on power supply 11;

Step 2: Turn on LMFCs 21, 22, 23 and 24 and turn off valves 81, 82, 83, and 84. The flow rate of electrolyte 34 from each LMFC is set as proportional to the surface area of wafer 31 covered by the corresponding cathode; and Step 3: Turn off power supply 11 and LMFCs 21, 22, 23, and 24 when metal layer 121 (FIG. 1A) reaches a set-value or thickness.

Figure 37:
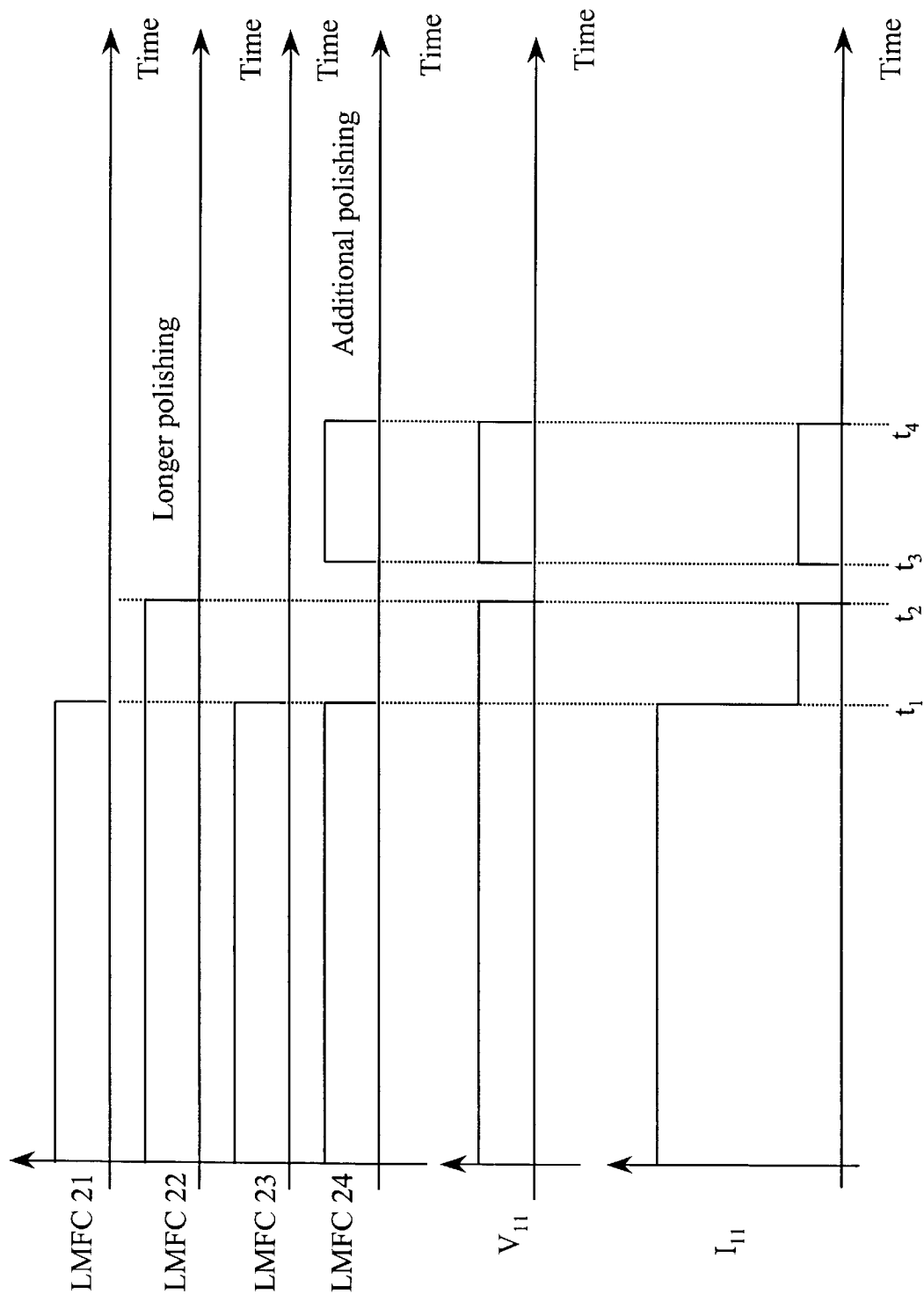
FIG. 37 is a set of waveforms depicting a portion of an electropolishing process in accordance with various aspects of the present invention.

LMFCs can be turned off at different times to adjust the thickness uniformity of metal layer 121 (FIG. 1A), as shown in FIG. 37. At time $t_1$, only LMFCs 21, 23, and 24 are turned off, and valves 81, 83, and 84 are also turned off. Therefore, electrolyte 34 does not contact wafer 31 except for the portion of wafer 31 above sub-polishing receptacle 64. As the power supply 11 remains turned on, metal layer 121 (FIG. 1A) is electropolished only from the portion of wafer 31 above sub-polishing receptacle 64. At time $t_2$, LMFC 22 is turned off. Similarly, LMFC 24 is turned on at time $t_3$ and turned off at time $t_4$ to obtain extra polishing of portions of wafer 31 above sub-polishing receptacle 60. Times $t_2$ and $t_4$ can be fine-tuned by measuring wafer thickness uniformity.

Figure 38:
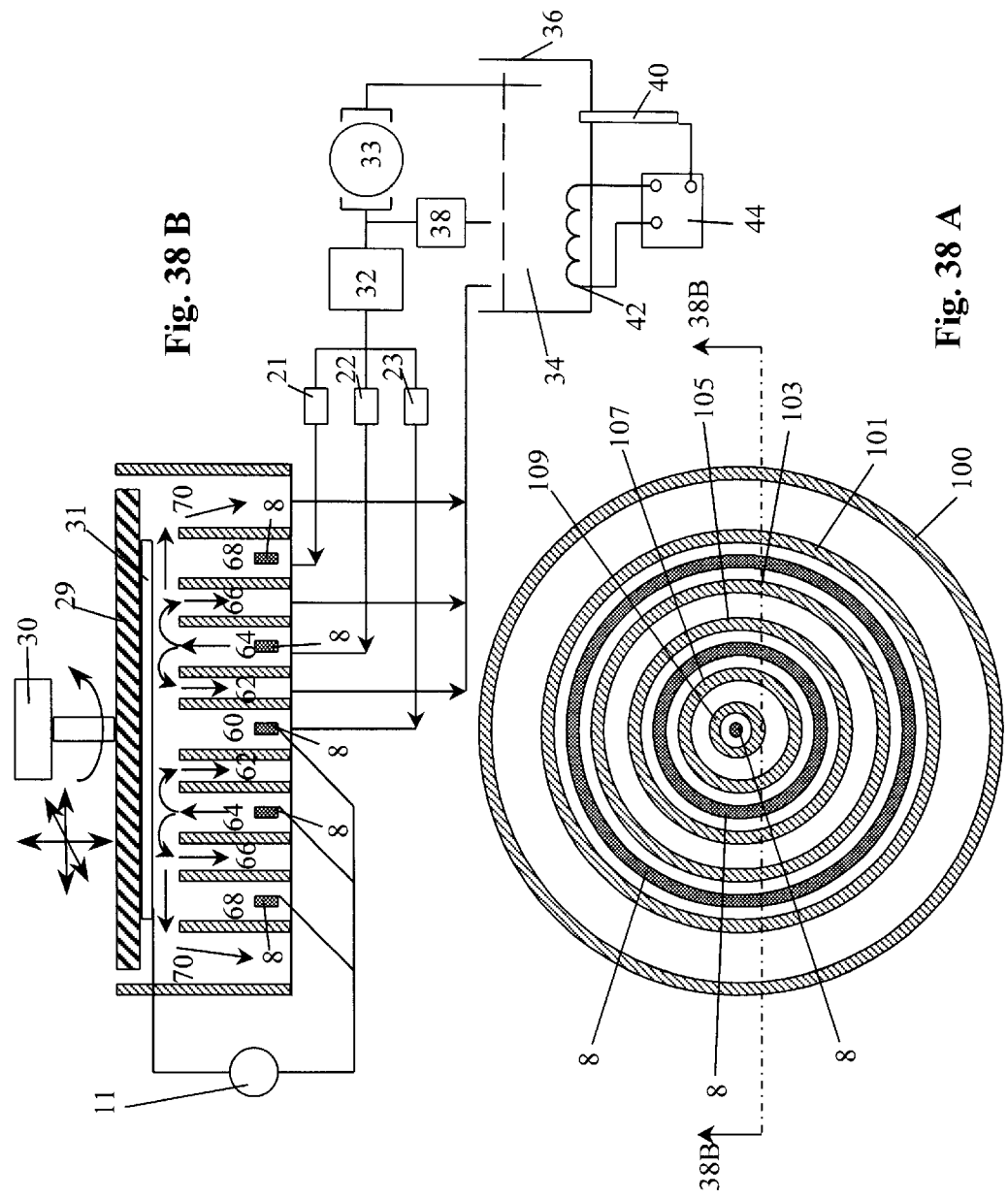
FIG. 38A is a top view of a portion of a fortieth alternative embodiment in accordance with various aspects of the present invention.
FIG. 38B is a view, partly in cross section, taken along the line 38B—38B in FIG. 38A, and partly in block diagram form, of the alternative embodiment shown in FIG. 38A.

With reference now to FIGS. 38A and 38B, still another alternative embodiment of the present invention, according to various aspects of the present invention, is shown. The embodiment of FIGS. 38A and 38B is similar to that of FIGS. 7A and 7B except that all cathodes are connected to single power supply 11. Additionally, the present embodiment includes sub-polishing receptacles 60, 62, 64, 66, 68, and 70. Since the electrolyte only contacts the portion of wafer 31 being selectively electropolished, a majority of the polishing current will come from the cathode and go to that portion of wafer 31. The polishing process steps are similar to those of FIGS. 7A and 7B, with power supply 11 replacing power supplies 12 and 13.

Figure 39:
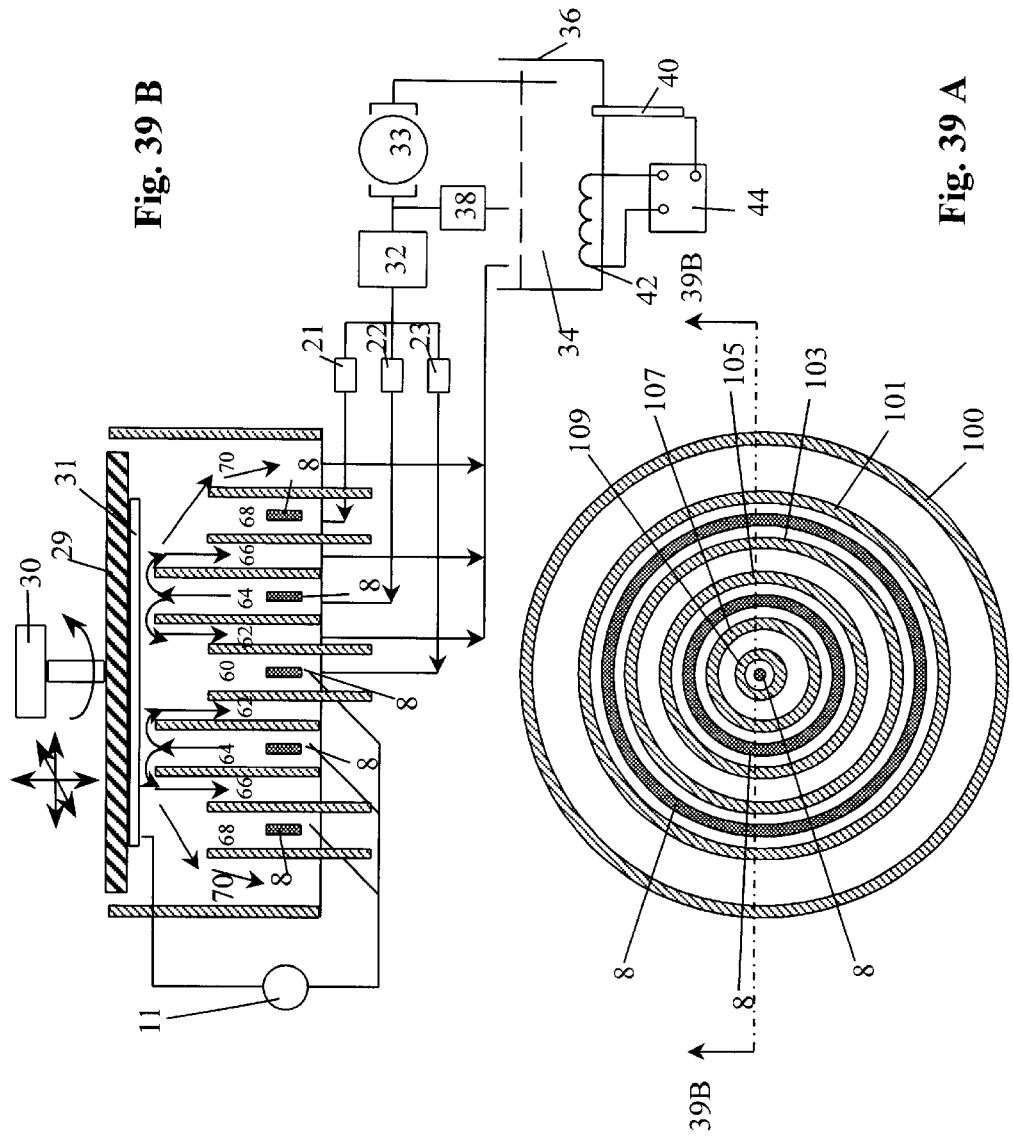
FIG. 39A is a top view of a portion of a forty-first alternative embodiment in accordance with various aspects of the present invention.
FIG. 39B is a view, partly in cross section, taken along the line 39B—39B in FIG. 39A, and partly in block diagram form, of the alternative embodiment shown in FIG. 39A.
Figure 41:
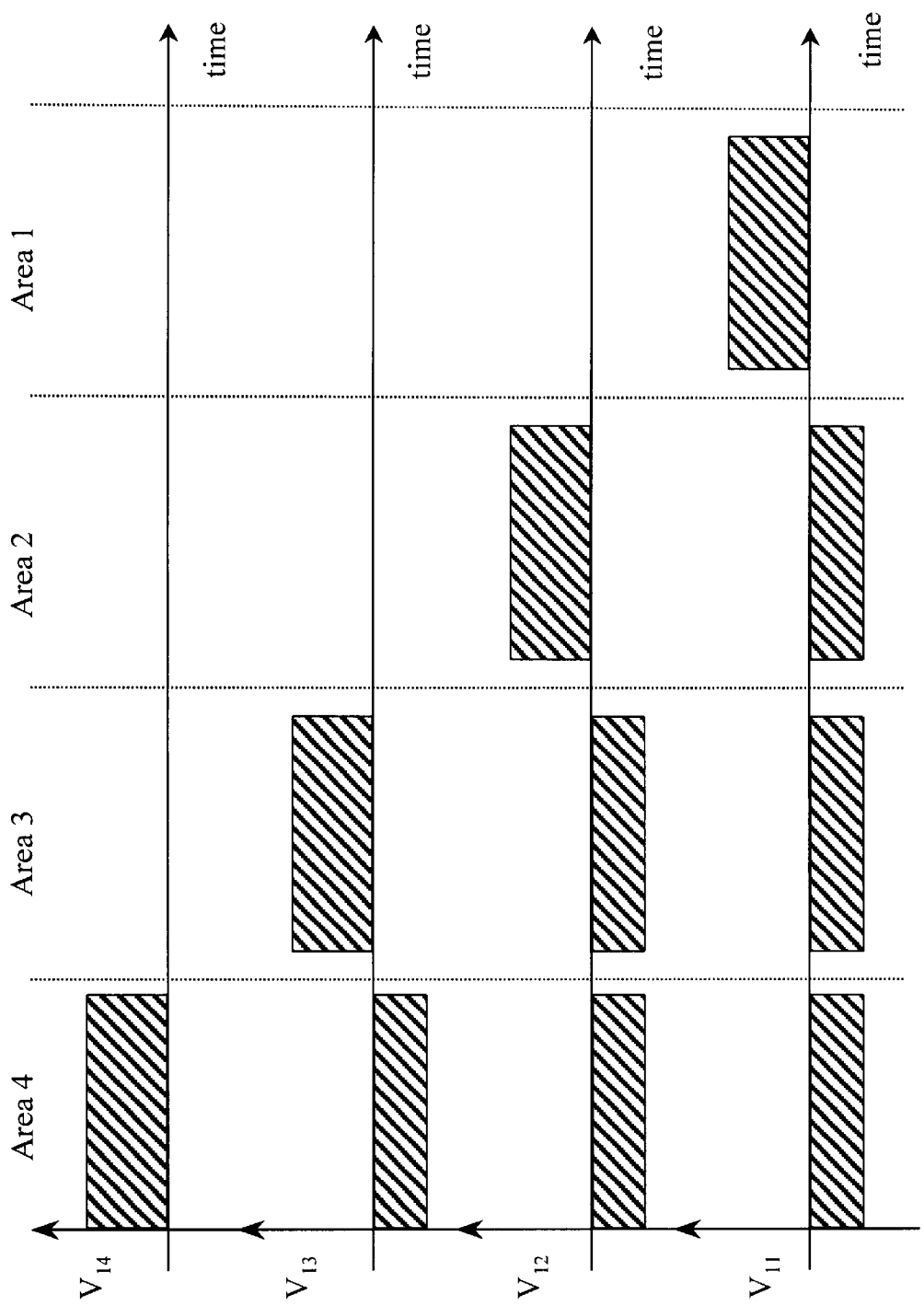
FIG. 41 is a set of waveform diagrams depicting a portion of an electropolishing process in accordance with various aspects of the present invention.

With reference now to FIGS. 39A and 39B, yet another alternative embodiment of the present invention, according to various aspects of the present invention, is shown. The embodiment of FIGS. 39A and 39B is similar to that of FIGS. 38A and 38B except that section walls 101, 103, 105, 107 and 109 can move up and down to adjust the flow pattern. As shown in FIG. 41, section walls 105 and 107 are moved up, so that the electrolyte flows toward the portion of wafer 31 above section walls 105 and 107.

Using the present alternative embodiment described above, the following process steps can be suitably employed to selectively electropolish portions of wafer 31:

Step 1: Turn on power supply 11;

Step 2: Turn on LMFC 21 only and move section walls 101 and 103 close to wafer 31, such that electrolyte 34 only contacts the portion of wafer 31 above section walls 101 and 103. In this manner, metal layer 121 (FIG. 1A) on the portion of wafer 31 above section walls 101 and 103 will be electropolished;

Step 3: When metal layer 121 (FIG. 1A) reaches a set-value or thickness, turn off power supply 11, turn off LMFC 21, and move section walls 101 and 103 to a lower position;

Step 4: Repeat steps 1 to 3 for section walls 105 and 107, using LMFC 22 and section walls 105 and 107, respectively; and Step 5: Repeat steps 1 to 3 for section wall 109, using LMFC 23 and section wall 109.

In addition to selectively electropolishing portions of wafer 31, using the present alternative embodiment described above, the following process steps can be employed to electropolish the entire surface of wafer 31 at one time:

Step 1: Turn on power supply 11;

Step 2: Turn on LMFCs 21, 22, and 23, and move all section walls 101, 103, 105, and 107 and tube 109 close to wafer 31. The flow rate of electrolyte 34 from each of LMFCs 21, 22, 23 and 24 is set proportional to the surface area of wafer 31 covered by the corresponding cathode; and Step 3: Move all section walls down to a lower position, and turn off all LMFCs at the same time, then turn off power supply 11. Each pair of section walls can also be moved down at a different time, with power supply 11 on, in order to adjust thickness uniformity. For example, as shown in FIGS. 39A and 39B, section walls 105 and 107 are being kept at higher positions with LMFC 22 on. Wafer 31 will be selectively electropolished in the area between section walls 105 and 107.

Figure 40:
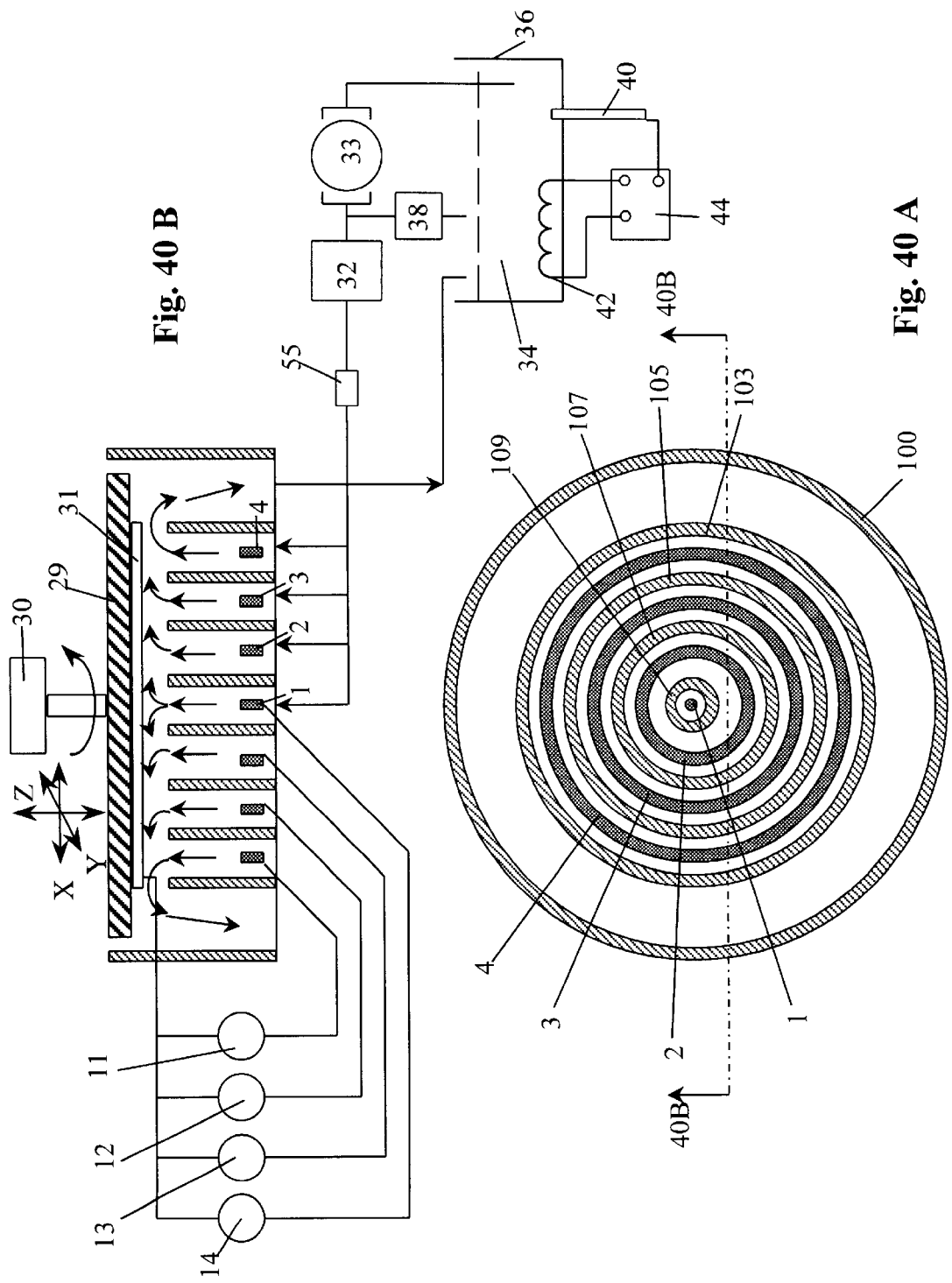
FIG. 40A is a top view of a portion of a forty-second alternative embodiment in accordance with various aspects of the present invention.
FIG. 40B is a view, partly in cross section, taken along the line 40B—40B in FIG. 40A, and partly in block diagram form, of the alternative embodiment shown in FIG. 40A.

With reference now to FIGS. 40A and 40B, another alternative embodiment of the present invention, according to various aspects of the present invention, is shown. FIGS. 40A and 40B illustrate an embodiment with multiple power supplies and a single LMFC for polishing metal layer 121

(FIG. 1A) directly on a substrate with a barrier layer on top. The embodiment of FIGS. 40A and 40B is similar to that of FIGS. 14A and 14B except that LMFCs 21, 22, 23 and 24 are replaced by a single LMFC 55.

Using the present alternative embodiment described above, the following process steps can be suitably employed to selectively electropolish portions of wafer 31:

Step 1: Turn on power supply 11 to output negative potential to electrode 4, and turn on power supplies 12, 13, and 14 to output positive or zero potential to electrodes 3, 2, and 1, respectively;

Step 2: Turn on LMFC 55, thereby immersing the whole wafer into electrolyte 34. In this manner, metal layer 121 (FIG. 1A) will be polished away only from the portion of wafer 31 above cathode 4;

Step 3: When metal layer 121 (FIG. 1A) reaches a set-value or thickness, turn off power supply 11;

Step 4: Repeat steps 2 to 3 for cathode 3 (turn on power supply 12 to output positive potential to cathode 3, and power supplies 11, 13 and 14 to output negative potential to cathodes 4, 2 and 1);

Step 5: Repeat steps 2 to 3 for cathode 2 (turn on power supply 13 to output positive potential to cathode 2, and power supplies 11, 12 and 14 to output negative potential to cathodes 4, 3 and 1); and Step 6: Repeat steps 2 to 3 for cathode 1 (turn on power supply 14 to output positive potential to cathode 1, and power supplies 11, 12 and 13 to output negative potential to cathodes 4, 3 and 2).

Figure 42:
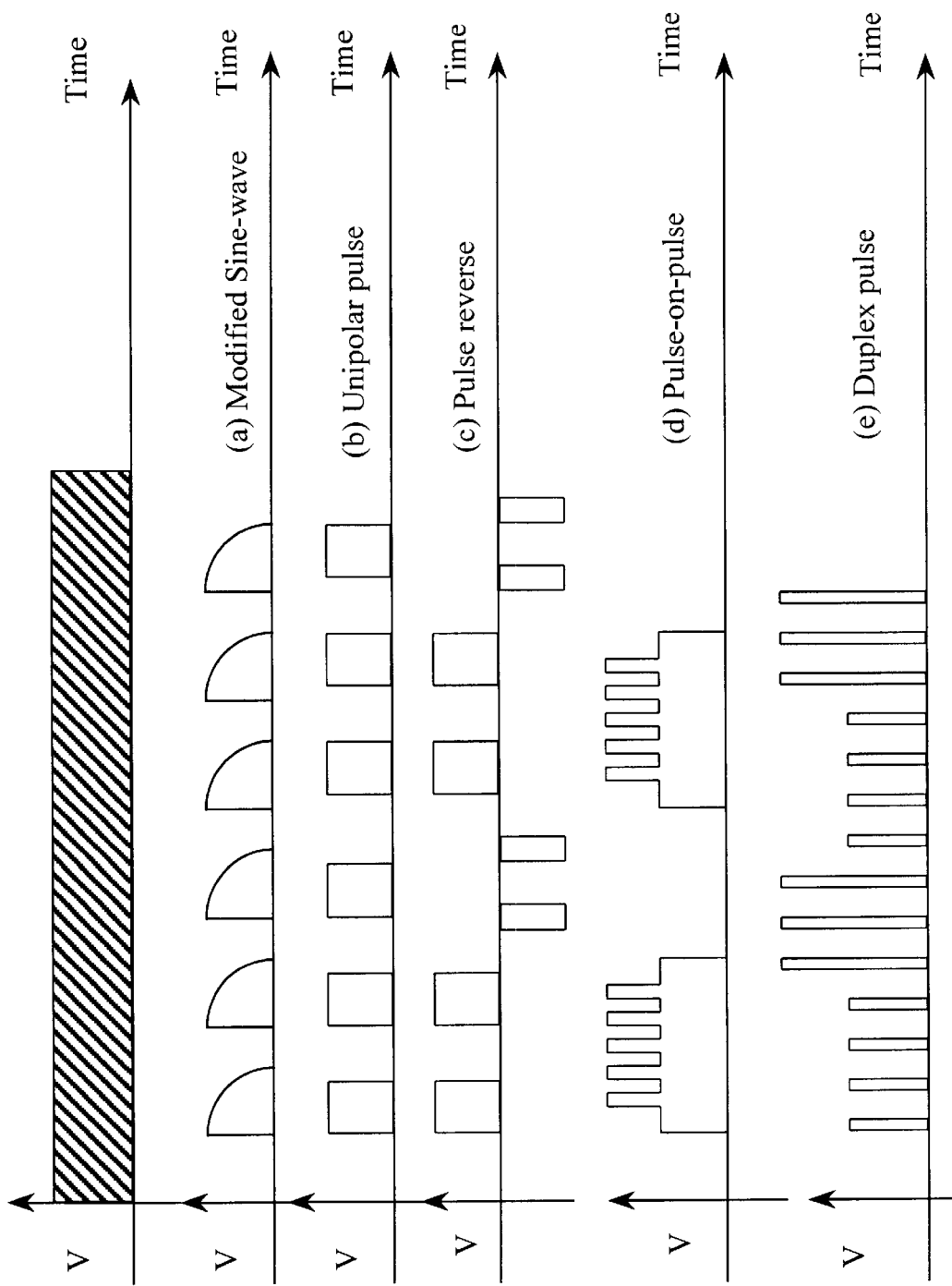
FIG. 42 is additional sets of waveforms, which may be used in conjunction with the present invention.

FIG. 41 shows the power supply turn on/off sequence for polishing wafer areas 4 (above cathode 4), 3, 2, and 1. The power supply output wave form can be selected from a variety of wave forms such as a modified sine-wave form, a unipolar pulse, a pulse reverse, a pulse-on-pulse, or a duplex pulse, as shown in FIG. 42.

In the above selective electropolishing process, instead of electropolishing from the periphery to the center of the wafer, electropolishing can also be performed from center to periphery, or can be performed randomly by choosing a cathode sequence.

In addition to selectively electropolishing portions of wafer 31, using the present alternative embodiment described above, the following process steps can be employed to electropolish the entire surface of wafer 31 at one time:

Step 1: Turn on power supplies 11, 12, 13 and 14. The current of each power supply is set as proportional to the surface area of wafer 31 covered by the corresponding cathode;

Step 2: Turn on LMFC 55; and

Step 3: Turn off power supplies 11, 12, 13 and 14 at the same time when metal layer 121 (FIG. 1A) reaches a set value or thickness. Also power supplies 11, 12, 13 and 14 can be turned off at different times to adjust the thickness uniformity of metal layer 121 (FIG. 1A).

With reference now to FIGS. 43A and 43B, still another alternative embodiment of the present invention, according to various aspects of the present invention, is shown. FIGS. 43A and 43B show an embodiment of the apparatus with multiple power supplies and a single LMFC for polishing metal layer 121 (FIG. 1A) directly on substrate 123 (FIG. 1A) with barrier layer 122 (FIG. 1A) on top. The embodiment of FIGS. 43A and 43B is similar to that of FIGS. 40A and 40B except that section walls can move up and down to adjust the flow pattern. As shown in FIGS. 43A and 43B, section walls 105 and 107 are moved up, so that the electrolyte flows toward the portion of wafer 31 above walls 105 and 107.

Using the present alternative embodiment described above, the following process steps can be suitably employed to selectively electropolish portions of wafer 31:

Step 1: Turn on power supply 1;

Step 2: Turn on LMFC 55 and move section walls 101 and 103 close to wafer 31, such that electrolyte 34 only contacts the portion of wafer 31 above section walls 101 and 103. In this manner, metal layer 121 (FIG. 1A) on the portion of wafer 31 above section walls 101 and 103 is electropolished;

Step 3: When metal layer 121 (FIG. 1A) reaches a set-value or thickness, turn off power supply 11, and move section walls 101 and 103 to a lower position;

Step 4: Repeat steps 1 to 3 for section wall 105 and 107, using section walls 105 and 107 and power supply 12; and Step 5: Repeat steps 1 to 3 for section wall 109, using section wall 109 and power supply 13.

In addition to selectively electropolishing portions of wafer 31, using the present alternative embodiment described above, the following process steps can be employed to electropolish the entire surface of wafer 31 at one time:

Step 1: Turn on power supplies 11, 12, and 13. The current from each power supply is set proportional to the surface area of wafer 31 that is covered by the corresponding cathode;

Step 2: Turn on LMFC 55, and move all section walls 101, 103, 105, 107 and section wall 109 close to wafer 31; and Step 3: Turn off power supplies 11, 12 and 13 at the same time when the thickness uniformity of metal layer 121 (FIG. 1A) reaches a set value or thickness. Also, power supplies 11, 12 and 13 can be turned off at different times to adjust the thickness uniformity of metal layer 121 (FIG. 1A).

Figure 44:
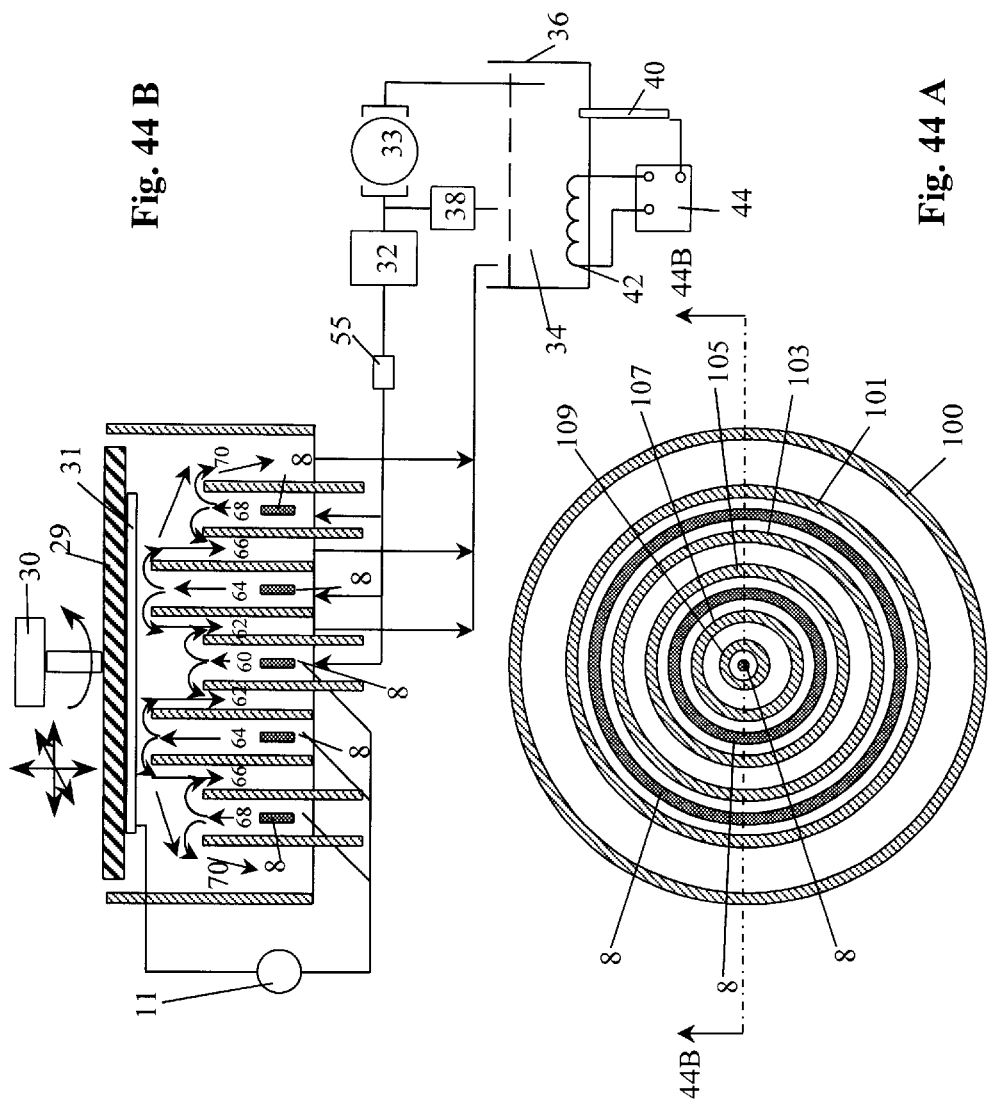
FIG. 44A is a top view of a portion of a forty-fourth alternative embodiment in accordance with various aspects of the present invention.
FIG. 44B is a view, partly in cross section, taken along the line 44B—44B in FIG. 44A, and partly in block diagram form, of the alternative embodiment shown in FIG. 44A.

With reference now to FIGS. 44A and 44B, yet another alternative embodiment of the present invention, according to various aspects of the present invention, is shown. FIGS. 44A and 44B show an embodiment of the apparatus with a single power supply and single LMFC for polishing metal layer 121 (FIG. 1A) directly on substrate 123 (FIG. 1A) with barrier layer 122 (FIG. 1A) on top. The embodiment of FIGS. 44A and 44B is similar to that of FIGS. 43A and 43B except that one power supply 11 is used, and all cathodes are connected to single power supply 11. Similarly, section walls can move up and down to adjust the flow pattern. As shown in FIGS. 44A and 44B, section walls 105 and 107 are moved up, so that the electrolyte flows toward the portion of wafer 31 above walls 105 and 107.

Using the present alternative embodiment described above, the following process steps can be suitably employed to selectively electropolish portions of wafer 31:

Step 1: Turn on power supply 11;

Step 2: Turn on LMFC 55 and move section walls 101 and 103 close to wafer 31, such that electrolyte 34 only contacts the portion of wafer 31 above section walls 101 and 103. In this manner, metal layer 121 (FIG. 1A) on the portion of wafer 31 above section walls 101 and 103 is electropolished;

Step 3: When metal layer 121 (FIG. 1A) reaches a set-value or thickness, turn off power supply 11, and move section walls 101 and 103 to a lower position;

Step 4: Repeat steps 1 to 3 for section walls 105 and 107 (move section walls 105 and 107 up close to wafer 31, and turn on power supply 11); and Step 5: Repeat steps 1 to 3 for section wall 109 (move section wall 109 up close to wafer 31, and turn on power supply 11).

In addition to selectively electropolishing portions of wafer 31, using the present alternative embodiment described above, the following process steps can be employed to electropolish the entire surface of wafer 31 at one time:

Step 1: Turn on power supply 11;

Step 2: Turn on LMFC 55, and move all section walls 101, 103, 105, 107 and 109 up close to wafer 31; and Step 3: Move all section walls down to a lower position at the same time, then turn off power supplies 11. Each pair of section walls can also be moved down at different times, with power supply 11 on, in order adjust thickness uniformity. For example, as shown in FIGS. 44A and 44B, section walls 105 and 107 are being kept at higher position with power supply 11 on. Wafer area above section wall 105 and 107 will have extra polishing film on that portion. The extra polishing time length and location can be determined by analyzing the thickness uniformity of wafer through later film characterization.

Figure 45:
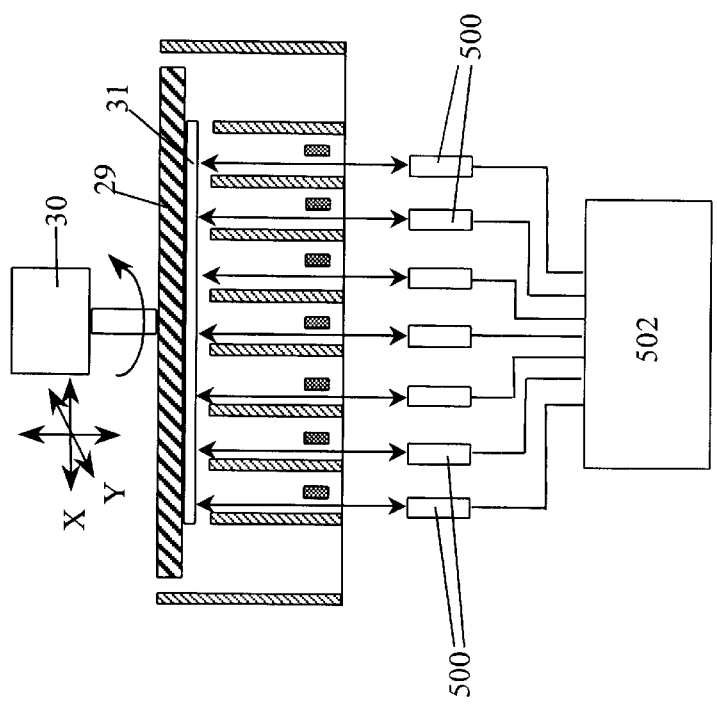
FIG. 45 is a view, partly in cross section, and partly in block diagram form, of a forty-fifth alternative embodiment in accordance with various aspects of the present invention.
Figure 46:
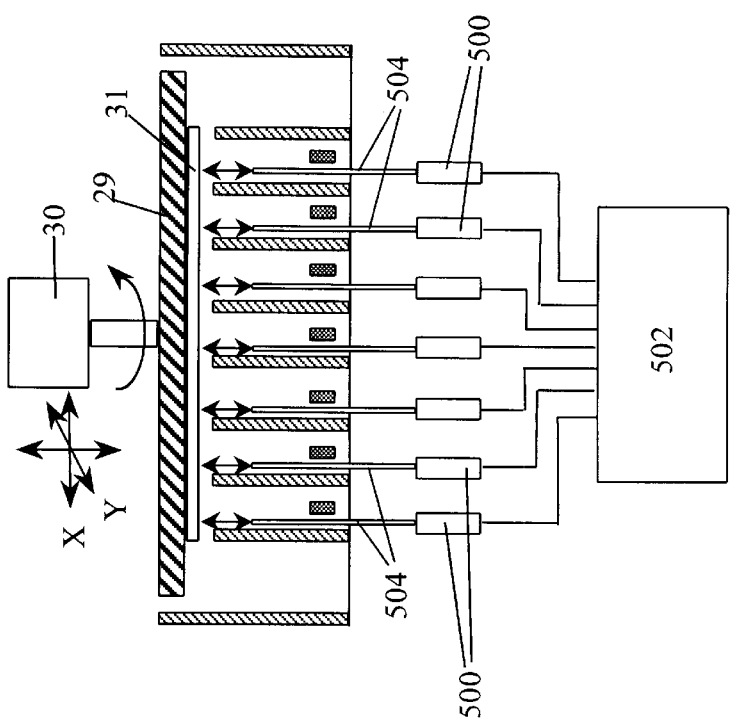
FIG. 46 is a view, partly in cross section, and partly in block diagram form, of a forty-sixth alternative embodiment in accordance with various aspects of the present invention.

With reference now to FIGS. 45 and 46, two additional alternative embodiments of the present invention, according to various aspects of the present invention, are shown. FIGS. 45 and 46 show embodiments configured with an in-situ film thickness uniformity monitor. Sensors 500 can be ultrasonic type thickness measurement sensors. Signal detected from sensors 500 is sent back to computer 502. The in-situ thickness data can be used to adjust or control polishing uniformity and final thickness.

Figure 47:
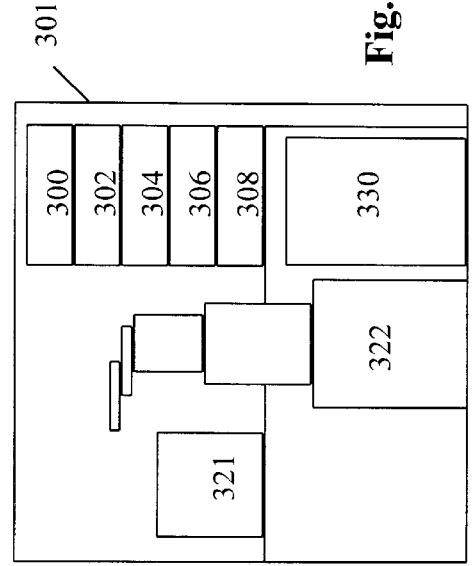
FIGS. 47A–47C are schematic top, cross section, and side views, respectively, of another embodiment of a wafer processing tool in accordance with various aspects of the present invention.
Figure 47:
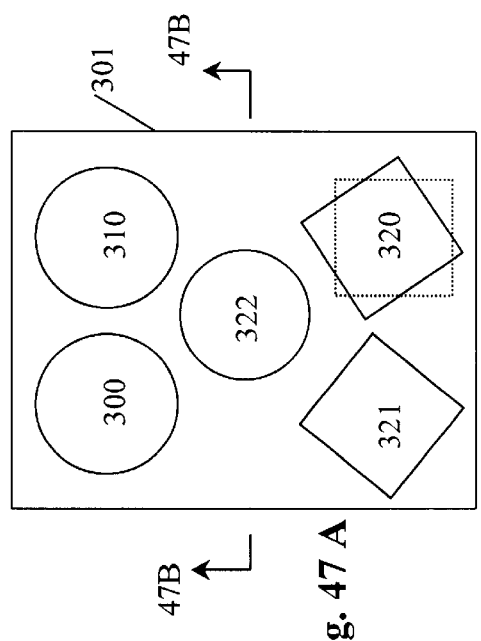
Figure 47:
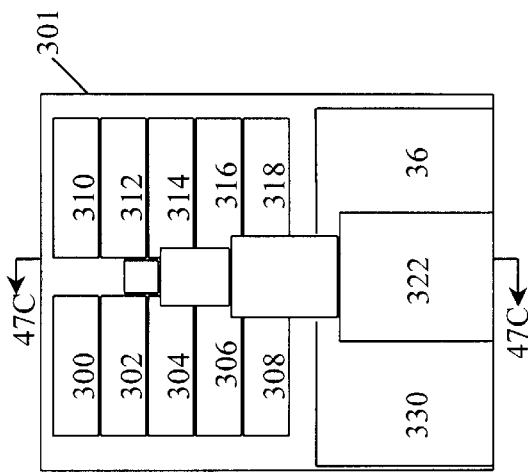

With reference now to FIG. 47, another alternative embodiment of the present invention, according to various aspects of the present invention, is shown. FIG. 47 shows an embodiment configured to be a stand-alone, fully computer-controlled wafer-processing tool with automatic wafer transfer, cleaning module with wafer dry-in and dry-out capability. It consists of five stacked polishing receptacles 300, 302, 304, 306 and 308, five stacked cleaning/dry chambers 310, 312, 314, 316 and 318, robot 322, wafer cassettes 320 and 321, electrolyte reservoir 36, and plumbing box 330. As described before, polishing receptacle 300 consists of cathodes, power supplies, section walls, a wafer chuck, and a driving mechanism that rotates or oscillates wafer 31 during the electropolishing process. Electrolyte reservoir 36 includes a temperature control. Plumbing box 330 consists of a pump, LMFCs, valves, filters, and plumbing. The polishing system further consists of computer control hardware, and an operating software package. The operation process sequence is described as follows:

Step A: Load wafer cassettes 320 and 321 manually or using robot 322;

Step B: Select recipe and push run button;

Step C: Initialize the system using the control software, including checking all system parameters, and monitoring for any alarms existing in the system;

Step D: After completing the initialization, robot 322 picks up a wafer from cassette 320 or 321 and sends the wafer to one of the polishing receptacles 300, 302, 304, 306, or 308;

Step E: Metal layer 121 (FIG. 1A) on the wafer is then electropolished;

Step F: After electropolishing, robot 322 picks up the polished wafer from the polishing receptacle, and transports it to one of cleaning/drying chambers 310, 312, 314, 316, or 318;

Step G: The electropolished wafer is then cleaned;

Step H: The electropolished wafer is then dried by spin-drying and/or $N_2$ purging; and Step I: Robot 322 picks up the dried wafer and transports the dried wafer to cassette 320 or 321.

Figure 48:
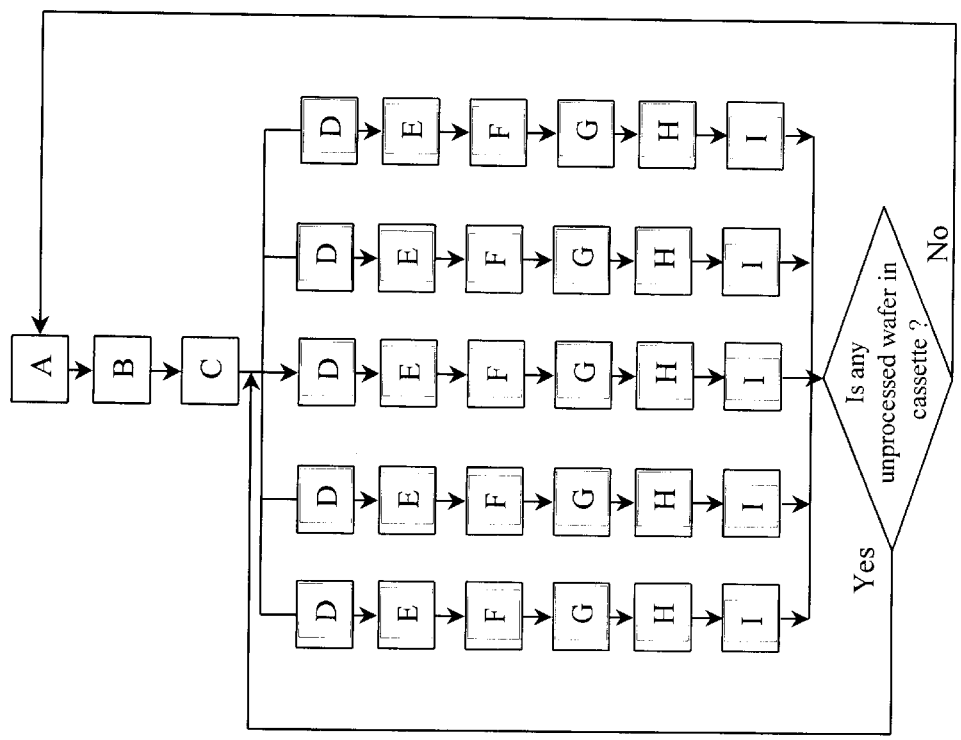
FIG. 48 is a flow chart depicting the operation of a portion of software for controlling a wafer processing tool in accordance with various aspects of the present invention.

FIG. 48 shows the process sequence for polishing multiple wafers simultaneously. The process sequence for polishing multiple wafers is similar to that for electropolishing a single wafer, except that the computer checks for any unprocessed wafers remaining in cassette 320 or 321 after process step I. If there is an unprocessed wafer remaining in cassette 320 or 321, then the system will return to step A, (i.e., loading new cassettes or exchanging cassettes). If there is still an unprocessed wafer remaining in cassette 320 and/or 321, the system will return to step D, (i.e., robot 322 picks up the unprocessed wafer from the cassette and transports it to one of the polishing receptacles.

Process step E may include a two-process step, the first being to selectively electropolish metal layer 121 (FIG. 1A) on the wafer, and the second being to electropolish metal layer 121 (FIG. 1A) on the whole wafer simultaneously.

Instead of cleaning a wafer in one chamber, the cleaning process can be performed in different chambers. The cleaning process may consist of several steps, and each step may use different solutions or different concentrations of solutions, or different hardware.

Instead of arranging five polishing receptacles and five-cleaning/drying chambers, the number of polishing receptacles and number of cleaning/drying chambers can be varied from 1 to 10 as shown in the following table:

TABLE 4

| Type | 1 | 2 | 3 | 4 | 5 | 6 | 7 | 8 | 9 |
|---|---|---|---|---|---|---|---|---|---|
| No. of polishing receptacles | 1 | 2 | 3 | 4 | 5 | 6 | 7 | 8 | 9 |
| No. of cleaning/drying chambers | 9 | 8 | 7 | 6 | 5 | 4 | 3 | 2 | 1 |

In accordance with various aspects of the present invention, types 4, 5, 6 and 7 in the above table are preferred.

Figure 49:
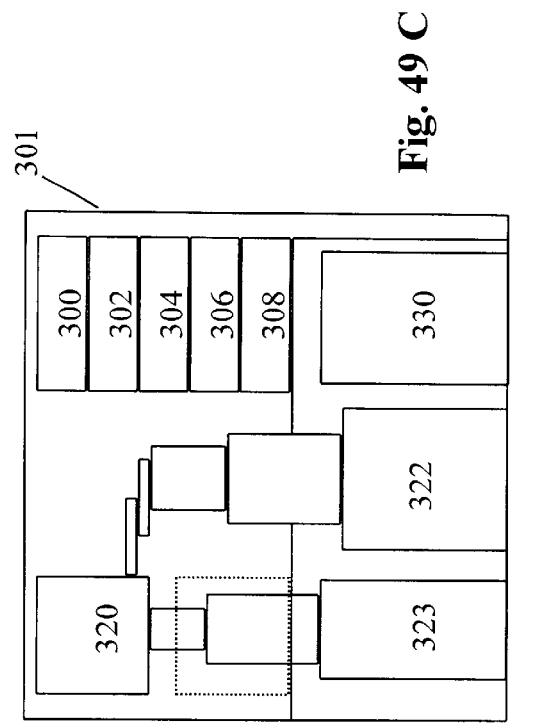
FIGS. 49A–49C are schematic top, cross section, and side views, respectively, of still another embodiment of a wafer processing tool in accordance with various aspects of the present invention.
Figure 49:
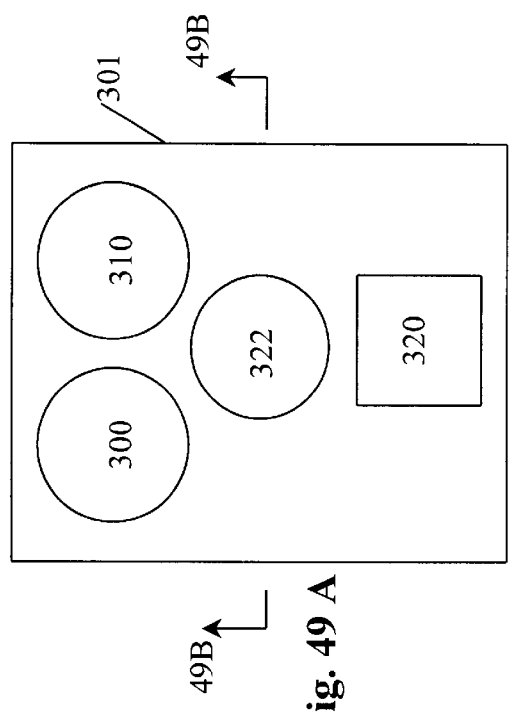
Figure 49:
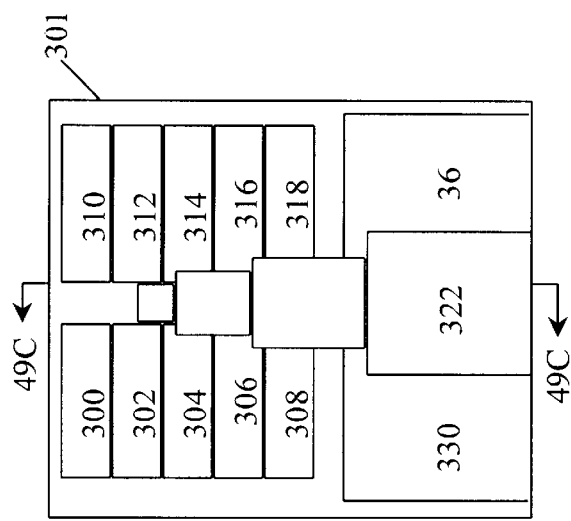

With reference now to FIG. 49, another alternative embodiment of the present invention, according to various aspects of the present invention, is shown. FIG. 49 shows an embodiment configured as a wafer-polishing tool. The embodiment of FIG. 49 is similar to that of FIG. 47, except that cassette 320 is moved up and down by a robot 323. The position of cassette 320 is moved up and down to match the position of the polishing receptacle or cleaning/dry chamber. Accordingly, robot 322 does not need to move in the Z direction when picking up an unprocessed wafer from cassette 320 or putting a polished dry wafer back into cassette 320. In this manner, the operating speed of robot 323 can be increased.

Figure 50:
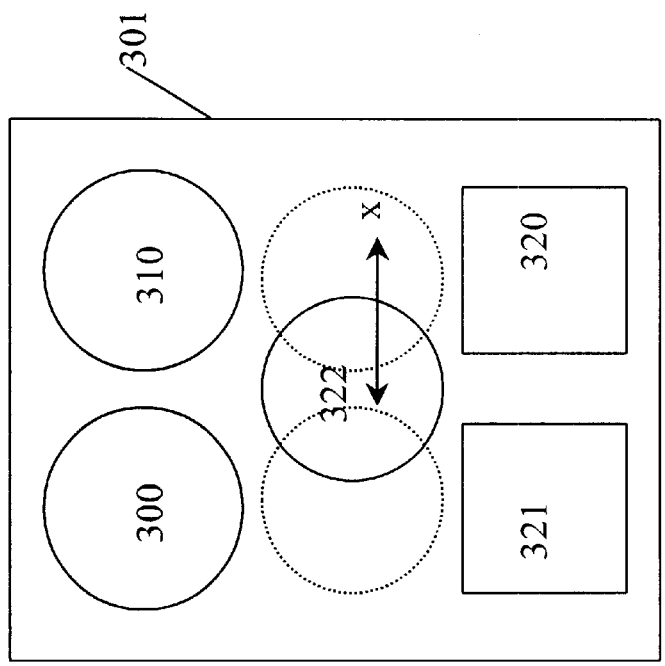
FIG. 50 is a schematic top view of a portion of yet another embodiment of a wafer processing tool in accordance with various aspects of the present invention.

With reference now to FIG. 50, still another alternative embodiment of the present invention, according to various aspects of the present invention, is shown. The embodiment shown in FIG. 50 is similar to that of FIG. 47 except that robot 322 itself can move in the X direction. Accordingly, robot 322 may not need to rotate about the Z-axis.

Figure 51:
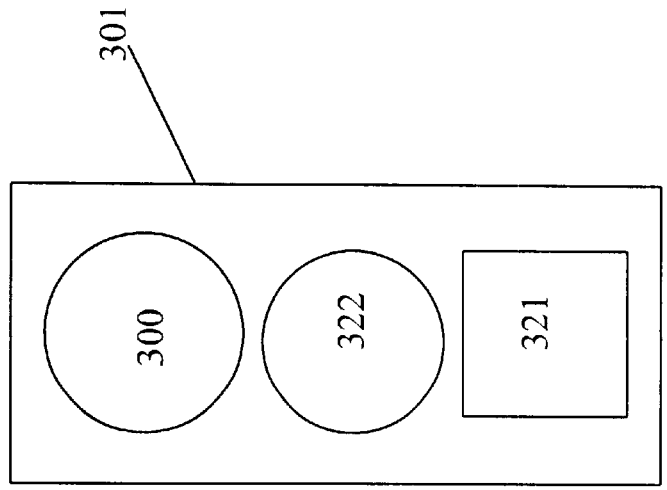
FIG. 51 is a schematic top view of a portion of another embodiment of a wafer processing tool in accordance with various aspects of the present invention.

With reference now to FIG. 51, yet another alternative embodiment of the present invention, according to various aspects of the present invention, is shown. The embodiment shown in FIG. 51 is similar to that of FIG. 47 except that polishing receptacles and cleaning/drying chambers are put in one column. Compared with the embodiment of FIG. 47, the foot print of the system is reduced, however wafer throughput can be slower.

Figure 52:
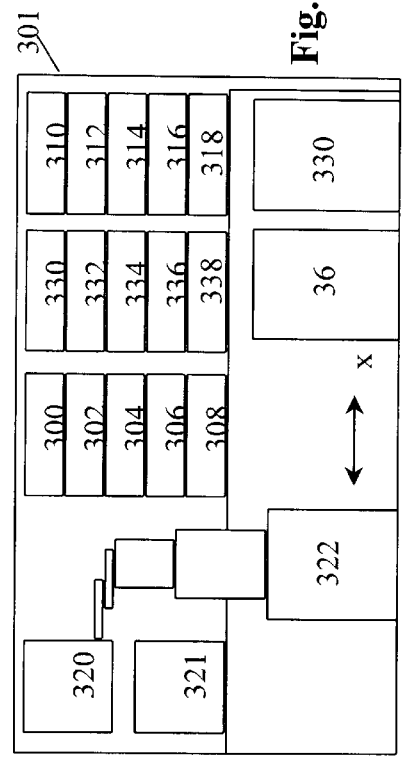
FIGS. 52A–52C are schematic top, cross section, and side views, respectively, of still another embodiment of a wafer processing tool in accordance with various aspects of the present invention.
Figure 52:
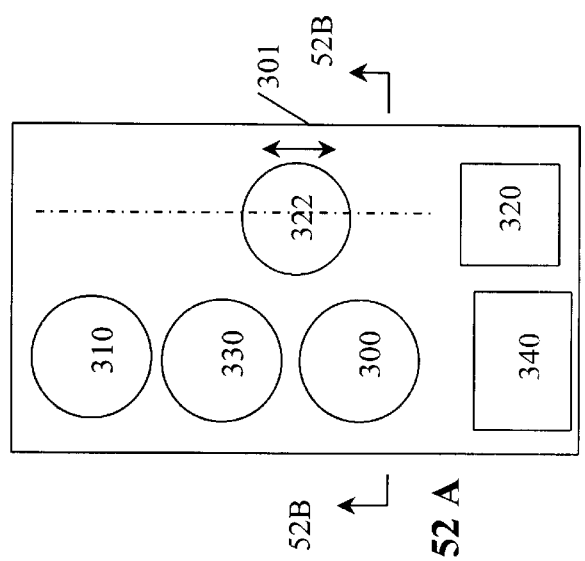
Figure 52:
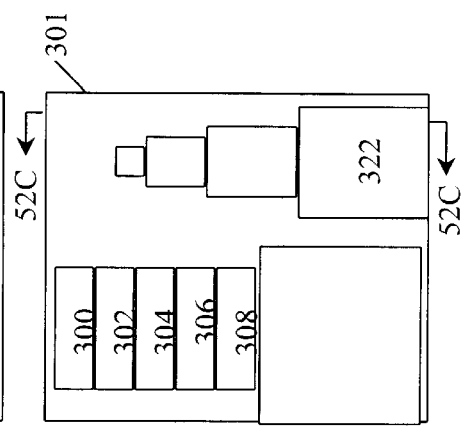

With reference now to FIG. 52, another alternative embodiment of the present invention, according to various aspects of the present invention, is shown. The embodiment shown in FIG. 52 consists of three columns of polishing receptacles and cleaning/drying chambers, linearly moveable robot 322, operation screen 340, two cassettes stacked adjacent to each other, plumbing box 330, and electrolyte reservoir 36. The polishing process steps are similar to those described in FIG. 47.

FIG. 54 shows still another embodiment of apparatus for polishing metal layer 121 (FIG. 1A) in accordance with the present invention. The embodiment of FIG. 54 is similar to that of FIGS. 28A and 28B except that multi-jets are replaced by a single jet 255. Additionally, cathode jet 255 remains stationary while wafer 31 is moved along the X-axis (left and right). More particularly, in the present exemplary embodiment, cathode jet 255 injects electrolyte onto portions of wafer 31, while wafer 31 is rotated and moved in the X-axis simultaneously by drive means 30 and guide bar 35. When wafer 31 is moved to the left side, cathode jet 255 injects electrolyte on to the center portion of wafer 31. When wafer 31 is moved to the right side, cathode jet 255 injects electrolyte onto the periphery portion of wafer 31. In accordance with one aspect of the present invention, the rotation speed of wafer 31 can be kept at a constant rate during the polishing process. The speed with which wafer 31 is moved along the x-axis can be varied from large to small as drive means 30 moves the center portion of wafer 31 away from the cathode jet 255. This speed of wafer 31 along the X-axis (Vx) can be expressed as follows:

$$Vx = C/[\pi(x+r)^2]$$

when x<r $$C/\{\pi[(x+r)^2 - (x-r)^2]\}$$

when x>r

Where C is a constant, x is the distance between center of wafer 31 and cathode jet 255 in the direction of the X-axis, and r is the radius of liquid column made by cathode jet 255.

It should be recognized, however, that various modifications can be made to the configuration of the wafer polishing cell without deviating from the spirit and/or scope of the present invention. For example, the angle between wafer 31 and cathode jet 255 can be kept at any constant angle, or the angle can be changed during the polishing process. The wafer itself can be placed at any angle relative to polishing receptacle 100. In the embodiment of FIG. 54, jet 255 can be moved instead of moving wafer 31, or both jet 255 and wafer 31 can be moved to achieve the same results. In the embodiment of FIG. 54, wafer 31 can be immersed in the electrolyte, instead of being contacted by the jet stream of the electrolyte.

As stated earlier, although the present invention has been described in conjunction with a number of alternative embodiments illustrated in the appended drawing figures, various modifications can be made without departing from the spirit and/or scope of the present invention. Therefore, the present invention should not be construed as being limited to the specific forms shown in the drawings and described above.

What is claimed is:

1. An apparatus for electropolishing a metal layer formed on a wafer, comprising:

a polishing receptacle configured to receive an electrolyte and the wafer, wherein said polishing receptacle comprises a first section, a second section, and a third section, and wherein said first section is disposed in said second section and said second section is disposed in said third section;

a wafer chuck configured to hold the wafer and position the wafer within said polishing receptacle;

a fluid inlet configured to deliver the electrolyte into said polishing receptacle; and a cathode configured to apply an electropolishing current to the electrolyte to electropolish the wafer.

2. The apparatus of claim 1, wherein said fluid inlet comprises:

a first fluid inlet disposed in said first section configured to deliver the electrolyte into said first section; and a second fluid inlet disposed in said second section configured to deliver the electrolyte into said second section.

3. The apparatus of claim 2, further comprising a fluid outlet disposed in said third section configured to remove the electrolyte from said polishing receptacle.

4. The apparatus of claim 1, wherein said fluid inlet comprises:

a first fluid inlet disposed in said first section configured to deliver the electrolyte into said first section; and a second fluid inlet disposed in said third section configured to deliver the electrolyte into said third section.

5. The apparatus of claim 4, further comprising a fluid outlet disposed in said second section configured to remove the electrolyte from said polishing receptacle.

6. The apparatus of claim 1, further comprising:

a fluid outlet configured to remove the electrolyte from said polishing receptacle; and an electrolyte reservoir configured to hold the electrolyte, wherein said fluid inlet and said fluid outlet are connected to said electrolyte reservoir.

7. The apparatus of claim 6, further comprising at least one mass flow controller connected between said electrolyte reservoir and said fluid inlet.

8. The apparatus of claim 7, wherein said mass flow controller is a Liquid Mass Flow Controller (LMFC).

9. The apparatus of claim 6, further comprising at least one fluid pump connected between said electrolyte reservoir and said fluid inlet.

10. The apparatus of claim 9, wherein said fluid pump is a diaphragm pump.

11. The apparatus of claim 9, further comprising a pressure leak valve disposed between the outlet of said pump and said electrolyte reservoir.

12. The apparatus of claim 6, further comprising:

a heater configured to heat the electrolyte in said electrolyte reservoir;

a temperature sensor configured to detect the temperature of the electrolyte in said electrolyte reservoir; and a heater controller configured to control the temperature of the electrolyte in said electrolyte reservoir.

13. The apparatus of claim 12, wherein said heater controller maintains the electrolyte at a temperature between 15 degrees Celsius and 60 degrees Celsius.

14. The apparatus of claim 1, further comprising at least one power supply connected to the wafer and said cathode.

15. The apparatus of claim 14, wherein said power supply is configured to operate in direct current (DC) mode.

16. The apparatus of claim 14, wherein said power supply is configured to operate in pulse modes.

17. The apparatus of claim 16, wherein said power supply is configured to operate using a bipolar pulse, a modified sine-wave, unipolar pulse, pulse reverse, or duplex pulse.

18. The apparatus of claim 14 in which said power supply is configured to operate in a constant current mode.

19. The apparatus of claim 18 in which said power supply is further configured to operate in a constant voltage mode.

20. The apparatus of claim 14 in which said power supply is configured to operate in a constant voltage mode.

21. The apparatus of claim 1, further comprising a drive mechanism configured to rotate the wafer.

22. The apparatus of claim 21, wherein said drive mechanism rotates the wafer at about 10 revolutions per minute to about 30 revolutions per minute.

23. The apparatus of claim 1, wherein the electrolyte includes orthophosphoric acid (H2PO4).

24. The apparatus of claim 23, wherein said orthophosphoric acid has a concentration of about 60 percent to about 85 percent, by weight.

25. The apparatus of claim 24, wherein said orthophosphoric acid further includes about 1 percent aluminum metal (against the weight of the acid).

26. The apparatus of claim 1 in which said wafer chuck is configured to move the wafer relative to said cathode.

27. The apparatus of claim 26 in which said cathode is configured to move relative to the wafer.

28. The apparatus of claim 1, wherein said cathode further comprises:
a first cathode disposed in said first section; and
a second cathode disposed in said second section.

29. The apparatus of claim 1, wherein said cathode further comprises:
a first cathode disposed in said first section; and
a second cathode disposed in said third section.

30. An apparatus for electropolishing a metal layer formed on a wafer, comprising:
a polishing receptacle,
wherein said polishing receptacle comprises a first section, a second section, and a third section, and
wherein said first section is disposed in said second section and said second section is disposed in said third section;
a wafer chuck;
a fluid inlet disposed in said polishing receptacle; and
a cathode disposed in said polishing receptacle.

31. The apparatus of claim 30, wherein said fluid inlet comprises:
a first fluid inlet disposed in said first section; and
a second fluid inlet disposed in said second section.

32. The apparatus of claim 31, wherein said cathode comprises:
a first cathode disposed in said first section; and
a second cathode disposed in said second section.

33. The apparatus of claim 30, wherein said fluid inlet comprises:
a first fluid inlet disposed in said first section; and
a second fluid inlet disposed in said third section.

34. The apparatus of claim 33, wherein said cathode comprises:
a first cathode disposed in said first section; and
a second cathode disposed in said third section.

35. The apparatus of claim 30, further comprising:
a fluid outlet disposed in said polishing receptacle; and
an electrolyte reservoir, wherein said fluid inlet and said fluid outlet are connected to said electrolyte reservoir.

36. The apparatus of claim 35, wherein said fluid outlet is disposed in said second section.

37. The apparatus of claim 35, wherein said fluid outlet is disposed in said third section.

38. An apparatus for electropolishing a metal layer formed on a wafer, comprising:
a polishing receptacle having:
a first section,
a second section, wherein said first section is disposed in said second section, and
a third section, wherein said second section is disposed in said third section;
a fluid inlet disposed in said polishing receptacle; and
a cathode disposed in said polishing receptacle.

39. The apparatus of claim 38, wherein said cathode comprises:
a first cathode disposed in said first section; and
a second cathode disposed in said second section.

40. The apparatus of claim 39, wherein said fluid inlet comprises:
a first fluid inlet disposed in said first section; and
a second fluid inlet disposed in said second section.

41. The apparatus of claim 38, wherein said cathode comprises:
a first cathode disposed in said first section; and
a second cathode disposed in said third section.

42. The apparatus of claim 41, wherein said fluid inlet comprises:
a first fluid inlet disposed in said first section; and
a second fluid inlet disposed in said third section.

43. The apparatus of claim 38, further comprising a fluid outlet disposed in said polishing receptacle.

44. The apparatus of claim 43, wherein said fluid outlet is disposed in said second section.

45. The apparatus of claim 44, wherein said fluid outlet is disposed in said third section.

46. The apparatus of claim 38, further comprising section walls that divide said first section, said second section, and said third section.

47. The apparatus of claim 46, wherein at least one of said section walls is moveable.

48. The apparatus of claim 46, wherein at least one of said section walls is divided into at least two sections.

* * * * *